United States Patent
Okuwaki

(10) Patent No.: US 9,041,710 B2
(45) Date of Patent: May 26, 2015

(54) SUPPORT APPARATUS AND DESIGN SUPPORT METHOD FOR DIFFERENTIATING BETWEEN HOLES AND PROJECTION GRAPHICS

(75) Inventor: Yoshihito Okuwaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 340 days.

(21) Appl. No.: 13/418,765

(22) Filed: Mar. 13, 2012

(65) Prior Publication Data

US 2012/0249538 A1  Oct. 4, 2012

(30) Foreign Application Priority Data

Mar. 31, 2011 (JP) .................... 2011-079560

(51) Int. Cl.
*G06T 17/10* (2006.01)
*G06F 17/50* (2006.01)

(52) U.S. Cl.
CPC ............... *G06T 17/10* (2013.01); *G06F 17/50* (2013.01)

(58) Field of Classification Search
CPC ..................................................... G06F 17/50
USPC ......................................................... 345/420
See application file for complete search history.

(56) References Cited

U.S. PATENT DOCUMENTS

| 2008/0004745 | A1* | 1/2008 | Nasu et al. ............ 700/182 |
| 2013/0151551 | A1* | 6/2013 | Chow et al. ........... 707/769 |

FOREIGN PATENT DOCUMENTS

| JP | 10-162041 | 6/1998 |
| JP | 10-326347 | 12/1998 |
| JP | 2004-341916 | 12/2004 |
| JP | 2009-134376 | 6/2009 |

OTHER PUBLICATIONS

Mok et al., "Automatic Generation of Assembly Instructions using STEP," May 2001, Proceedings of the 2001 IEEE International Conference on Robotics & Automation, p. 313-318.*

* cited by examiner

*Primary Examiner* — Kee M Tung
*Assistant Examiner* — Ryan D McCulley
(74) *Attorney, Agent, or Firm* — Staas & Halsey LLP

(57) ABSTRACT

An apparatus includes a determination unit to determine a shape of a ridge line that is provided in a plane surface included in a three-dimensional model of a verification target and forms an entrance of a hole or a base of a projection in the plane surface, an extraction unit to extract a graphic that includes a ridge line coinciding with at least a portion of the shape of the ridge line determined by the shape determination unit, a creation unit to create a comparison-use vector to be compared with the direction of a normal vector of the plane surface, in response to the type of the extracted graphic, and a determination unit to determine whether the graphic extracted by the extraction unit is a graphic forming a hole or a graphic forming a projection, in response to an angle between the normal vector and the comparison-use vector.

16 Claims, 40 Drawing Sheets

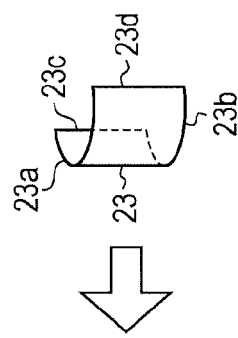
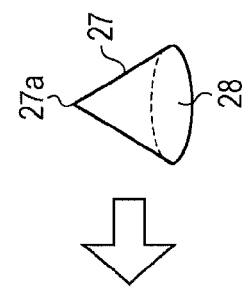

FIG. 6C
43

| ID OF SURFACE |
| CIRCULAR ARC SURFACE |
| ID OF CIRCULAR ARC RIDGE LINE #1 |
| ID OF CIRCULAR ARC RIDGE LINE #2 |
| ID OF LINEAR RIDGE LINE #1 |
| ID OF LINEAR RIDGE LINE #2 |
| DIAMETER OF CIRCULAR ARC SURFACE |
| HEIGHT OF CIRCULAR ARC SURFACE |

FIG. 6D
44

| ID OF SURFACE |
| CIRCULAR CONE SURFACE B |
| ID OF CIRCULAR RIDGE LINE #1 |
| ID OF APEX |
| DIAMETER OF CIRCULAR RIDGE LINE #1 |
| HEIGHT OF CIRCULAR CONE |

13a — CIRCULAR-SHAPE-RELATED SURFACE INFORMATION STORAGE UNIT

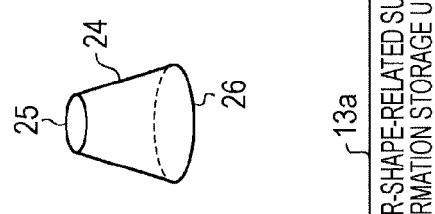

13a — CIRCULAR-SHAPE-RELATED SURFACE INFORMATION STORAGE UNIT

FIG. 6A
41

| ID OF SURFACE |
| CIRCULAR CYLINDRICAL SURFACE |
| ID OF CIRCULAR RIDGE LINE #1 |
| ID OF CIRCULAR RIDGE LINE #2 |
| DIAMETER OF CIRCULAR CYLINDER |
| HEIGHT OF CIRCULAR CYLINDER |

FIG. 6B
42

| ID OF SURFACE |
| CIRCULAR CONE SURFACE A |
| ID OF CIRCULAR RIDGE LINE #1 |
| ID OF CIRCULAR RIDGE LINE #2 |
| DIAMETER OF CIRCULAR RIDGE LINE #1 |
| DIAMETER OF CIRCULAR RIDGE LINE #2 |
| HEIGHT OF CIRCULAR CYLINDER |

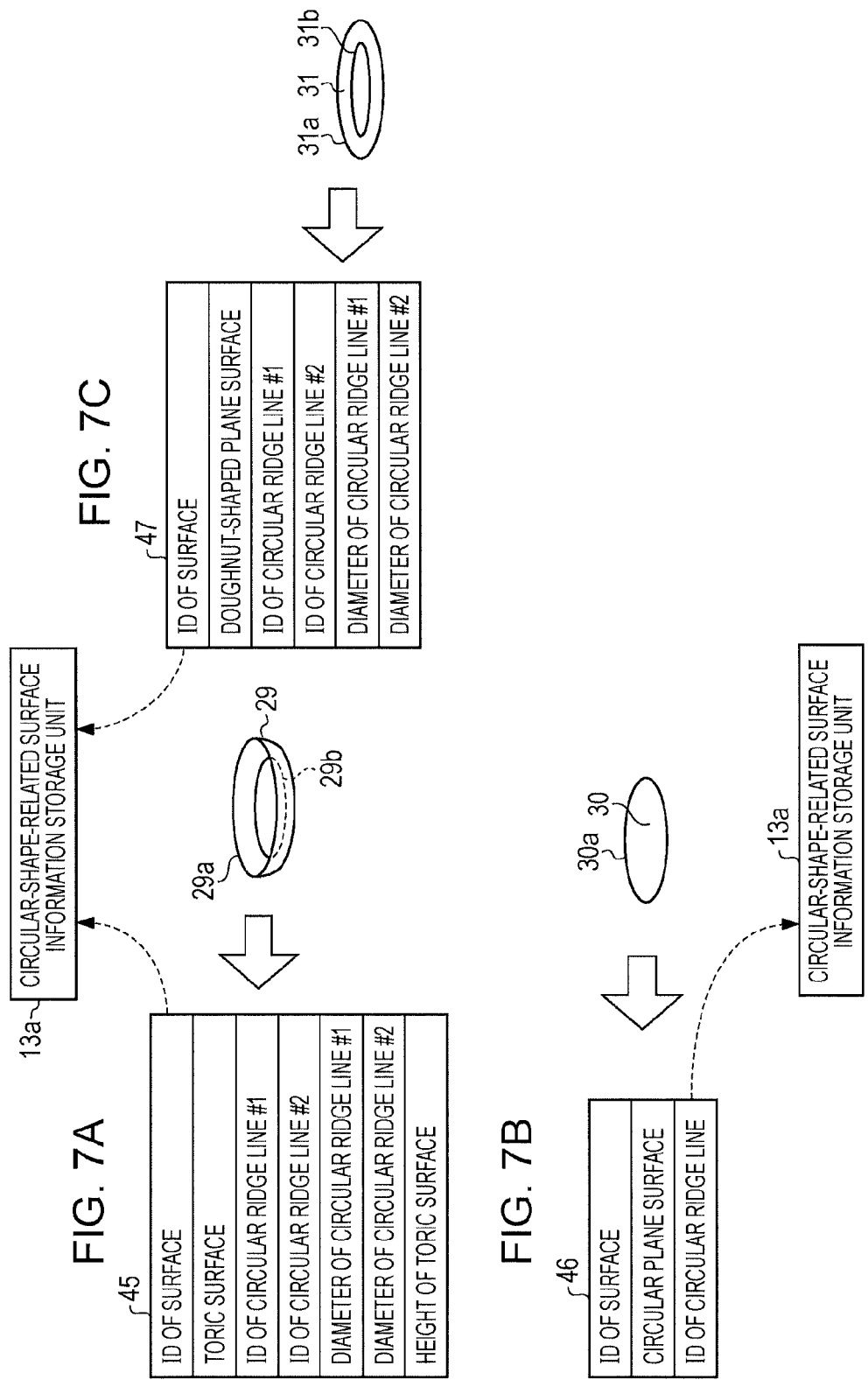

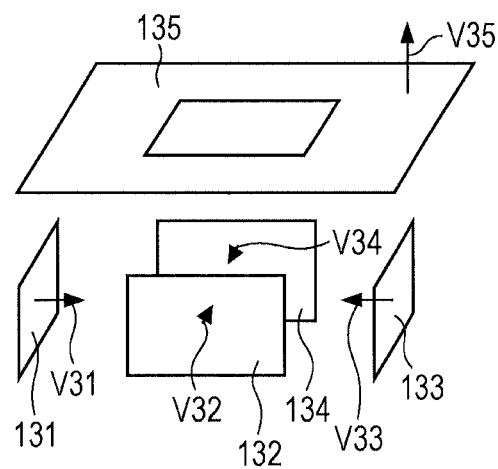

| | CIRCULAR CYLINDRICAL SURFACE A (HOLE) | CIRCULAR CYLINDRICAL SURFACE B (HOLE) | CIRCULAR CONE SURFACE #1 (HOLE) | CIRCULAR CONE SURFACE #2 (HOLE) | CIRCULAR PLANE SURFACE ① | CIRCULAR PLANE SURFACE ② |
|---|---|---|---|---|---|---|
| CLEARANCE HOLE-M2 | 2.4 | ABSENCE | ABSENCE | ABSENCE | ABSENCE | ABSENCE |
| CLEARANCE HOLE-M3 | 3.5 | ABSENCE | ABSENCE | ABSENCE | ABSENCE | ABSENCE |
| COUNTERSINK HOLE-M2 | 2.4 | ABSENCE | 2.4 / 4.8 | ABSENCE | ABSENCE | ABSENCE |
| COUNTERSINK HOLE-M3 | 3.5 | ABSENCE | 3.5 / 7.0 | ABSENCE | ABSENCE | ABSENCE |
| SOUNDING HOLE-M2 | 2.4 | 4.5 | ABSENCE | ABSENCE | 2.4 / 4.5 | ABSENCE |
| SOUNDING HOLE-M3 | 3.5 | 5.5 | ABSENCE | ABSENCE | 3.5 / 5.5 | ABSENCE |
| BURRING-M2 | ⋯ | ⋯ | | | | |
| ⋯ | ⋯ | ⋯ | | | | |

FIG. 28

| | CLEARANCE HOLE | CLEARANCE HOLE-M3 | COUNTERSINK HOLE-M2 | COUNTERSINK HOLE-M3 | BURRING-M2 | BURRING-M3 |
|---|---|---|---|---|---|---|
| MODEL A | 2 | 0 | 5 | 0 | 0 | 0 |
| MODEL B | 0 | 3 | 0 | 2 | 0 | 0 |
| MODEL C | 0 | 0 | 0 | 0 | 2 | 0 |

SUPPORT APPARATUS AND DESIGN SUPPORT METHOD FOR DIFFERENTIATING BETWEEN HOLES AND PROJECTION GRAPHICS

CROSS-REFERENCE TO RELATED APPLICATION

This application is based upon and claims the benefit of priority of the prior Japanese Patent Application No. 2011-079560, filed on Mar. 31, 2011, the entire contents of which are incorporated herein by reference.

FIELD

The embodiments discussed herein are related to a design support apparatus and a design support method.

BACKGROUND

In three-dimensional Computer Aided Design (CAD), hole attribute information indicating the kinds of holes (a bolt hole and the like) has been added to a hollow cylindrical shape expressing the hole or projection of a component.

There has been a method in which, when a product created in the three-dimensional CAD is manufactured, hole shape information to which the hole attribute information is add is searched and the searched hole shape information is classified on the basis of the combination of the radius and depth of a hole shape and a hole attribute which are included in the hole attribute information. Examples of such a method are disclosed in Japanese Laid-open Patent Publication No. 2004-341916 and Japanese Laid-open Patent Publication No. 2009-134376.

SUMMARY

According to an aspect of the invention, a design support apparatus includes a shape determination unit configured to determine a shape of a ridge line that is provided in a plane surface included in a three-dimensional model of a verification target and forms an entrance of a hole or a base of a projection in the plane surface, an extraction unit configured to extract, from within the three-dimensional model, a graphic that includes a ridge line coinciding with at least a portion of the shape of the ridge line determined by the shape determination unit, a creation unit configured to create a comparison-use vector to be compared with the direction of a normal vector of the plane surface, in response to the type of the extracted graphic, and a determination unit configured to determine whether the graphic extracted by the extraction unit is a graphic forming a hole or a graphic forming a projection, in response to an angle between the normal vector and the comparison-use vector.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A to 6D are diagrams explaining circular-shape-related surface information formats;

FIGS. 7A to 7C are diagrams explaining circular-shape-related surface information formats;

FIG. 21 is a diagram explaining the check of an angle between a hole/projection surface extraction-use reference plane surface and an extracted plane surface;

FIG. 27 is a diagram illustrating information stored in a hole shape-specific surface configuration database storage unit;

FIG. 28 is a diagram illustrating an example of number-of-holes information output by a hole/projection information display unit;

DESCRIPTION OF EMBODIMENTS

Hereinafter, a design support device of an embodiment will be described in detail with reference to drawings.

<First Embodiment>

Figure 1:
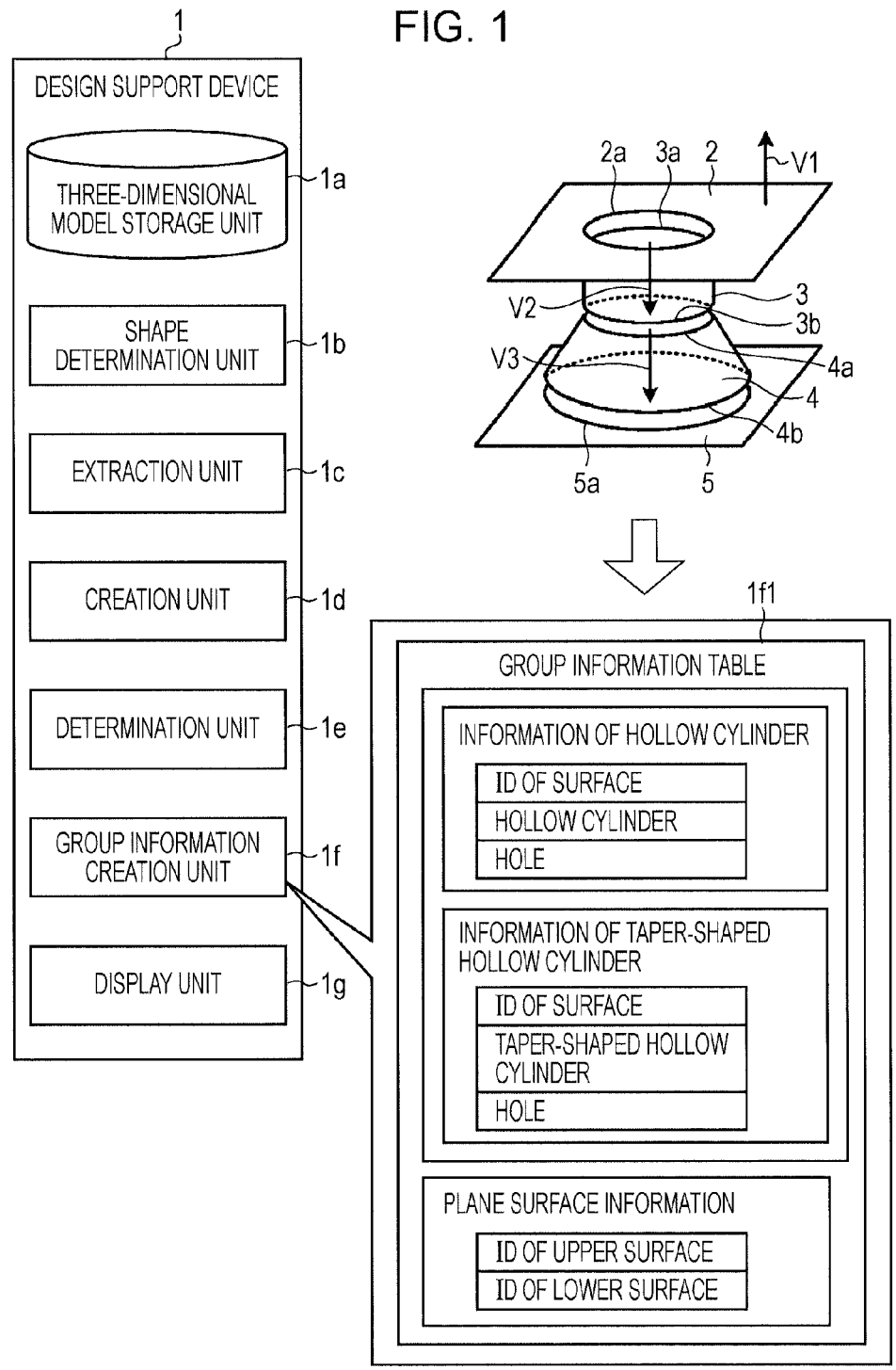
FIG. 1 is a diagram illustrating a design support device of a first embodiment.

FIG. 1 is a diagram illustrating a design support device of a first embodiment.

A design support device (computer) 1 of the first embodiment includes a three-dimensional model storage unit 1a, a shape determination unit 1b, an extraction unit 1c, a creation unit 1d, a determination unit 1e, a group information creation unit 1f, and a display unit 1g.

In the three-dimensional model storage unit 1a, a three-dimensional model is stored that is a target from which the information of a hole or a projection (hereinafter, referred to as "hole/projection") is extracted. In addition, while, in FIG. 1, a case is illustrated in which the design support device 1 includes the three-dimensional model storage unit 1a, the three-dimensional model storage unit 11a may also be provided outside of the design support device 1.

The shape determination unit 1b determines the shape of a ridge line that is provided in a plane surface included in a three-dimensional model and forms the entrance of a hole or the base of a projection in the plane surface. In FIG. 1, a plane surface 2 included in the three-dimensional model is illustrated. The shape determination unit 1b determines that the shape of a ridge line 2a provided in the plane surface 2 is a circle.

From the three-dimensional model, the extraction unit 1c extracts a graphic that includes a ridge line coinciding with at least a portion of the shape of the ridge line determined by the shape determination unit 1b. In FIG. 1, a hollow cylinder 3 is extracted that includes a ridge line 3a coinciding with the ridge line 2a forming the circle.

In response to the type of the extracted graphic, the creation unit 1d creates a comparison-use vector to be compared with the direction of a normal vector V1 of the plane surface. In FIG. 1, since the extracted graphic is the hollow cylinder 3, a comparison-use vector V2 is created that is headed from the center of a circle formed by the ridge line 3a to the center of a circle formed by a ridge line 3b facing the ridge line 3a. In addition, a creation method for a comparison-use vector with respect to other than the hollow cylinder will be described in detail in a second embodiment.

In response to an angle between the normal vector V1 and the comparison-use vector V2, the determination unit 1e determines whether the graphic extracted by the extraction unit 1c is a graphic forming a hole or a graphic forming a projection. In FIG. 1, since the angle between normal vector V1 and the comparison-use vector V2 is 180 degrees (the directions of the vectors are opposite to each other), the determination unit 1e determines that the hollow cylinder 3 is a graphic forming a hole. In addition, while not illustrated, when the angle between normal vector V1 and the comparison-use vector V2 is 0 degrees (the directions of the vectors coincide with each other), the determination unit 1e determines that the graphic extracted by the extraction unit 1c is a graphic forming a projection.

According to the design support device 1, since hole information is extracted on the basis of the shape of a graphic included by the three-dimensional model, it may be possible to identify the types of holes/projections (and the number thereof), regardless of the presence or absence of hole/projection information preliminarily added to a three-dimensional model converted from another CAD system.

In addition, since the extracted graphic is the hollow cylinder 3, the extraction unit is determines that another graphic or plane surface exists that includes a ridge line coinciding with the ridge line 3b located on a side opposite to the ridge line 3a of the hollow cylinder 3. Therefore, the extraction unit is extracts a graphic or plane surface including a ridge line that coincides with the shape of the ridge line 3b and is other than the ridge line 3a provided on the plane surface 2. In FIG. 1, a taper-shaped hollow cylinder 4 is extracted that includes a ridge line 4a coinciding with the shape of the ridge line 3b. The creation unit 1d and the determination unit 1e perform, on the taper-shaped hollow cylinder 4, the same processing as on the hollow cylinder 3. Namely, the creation unit 1d creates a comparison-use vector V3 headed from the center of a circle formed by the ridge line 4a to the center of a circle formed by a ridge line 4b facing the ridge line 4a.

In response to an angle between the normal vector V1 and the comparison-use vector V3, the determination unit 1e determines whether the graphic extracted the extraction unit 1c is a graphic forming a hole or a graphic forming a projection. In FIG. 1, since the angle between the normal vector V1 and the comparison-use vector V3 is 180 degrees (the directions of the vectors are opposite to each other), the determination unit 1e determines that the taper-shaped hollow cylinder 4 is a graphic forming a hole.

In addition, since the graphic extracted at this time is the taper-shaped hollow cylinder 4, the extraction unit is determines that another graphic or plane surface exists that includes a ridge line coinciding with the ridge line 4b located on a side opposite to the ridge line 4a of the taper-shaped hollow cylinder 4. Therefore, the extraction unit is extracts a graphic or plane surface including a ridge line that coincides with the shape of the ridge line 4b and is other than the ridge line 4a. In FIG. 1, a plane surface 5 is extracted that includes a ridge line 5a coinciding with the shape of the ridge line 4b.

The group information creation unit 1f creates group information in which a graphic and a plane surface, which form one hole or projection, are grouped. In FIG. 1, as an example of the group information, a group information table 1f1 is illustrated. In the group information table 1f1, the columns of the information of a hollow cylinder, the information of a taper-shaped hollow cylinder, and plane surface information are provided. In the column of the information of the hollow cylinder, "ID of surface" identifying the side surface of the hollow cylinder 3, "hollow cylinder" identifying that the hollow cylinder 3 is a hollow cylinder, and "hole" indicating that the hollow cylinder 3 is a hole are set. In the column of the information of the taper-shaped hollow cylinder, "ID of surface" identifying the side surface of the taper-shaped hollow cylinder 4, "taper-shaped hollow cylinder" identifying that the taper-shaped hollow cylinder 4 is a taper-shaped hollow cylinder, and "hole" indicating that the taper-shaped hollow cylinder 4 is a hole are set. In the column of the plane surface information, the "ID of upper surface" identifying the plane surface 2 and "ID of lower surface" identifying the plane surface 5 are set.

On the basis of the group information created by the group information creation unit 1f, the display unit 1g causes a monitor (not illustrated), to which the design support device 1 is connected, to display information indicating the number of holes or projections included by the three-dimensional model and the kinds of the holes or the projections. By displaying the information indicating the number of holes or projections included by the three-dimensional model and the kinds of the holes or the projections, it may be possible for a designer to easily understand the information indicating the number of holes or projections included by the three-dimensional model and the kinds of the holes or the projections. Accordingly, it may possible for the designer to reduce man-hours taken to visually understand the number of the holes or the projections or to visually understand the kinds of the holes or the projections.

In addition, it may be possible for the designer to reduce a counting error or misunderstanding occurring when the number of the holes or the projections is visually counted or the kinds of the holes or the projections are visually understood.

In addition, the design support device 1 may cause the monitor to display the group information table 1f1. By displaying the group information table 1f1, it may be possible for the designer to easily understand a hollow cylinder forming a hole or the type of a circular cone.

In addition, using a function provided in a central processing unit (CPU) included in the design support device 1, it may be possible to realize the shape determination unit 1b, the extraction unit 1c, the creation unit 1d, the determination unit 1e, the group information creation unit 1f, and the display unit 1g. In addition, using an information storage region provided in a random access memory (RAM), a hard disk drive (HDD), or the like included in the design support device 1, it may be possible to realize the three-dimensional model storage unit 1a.

Hereinafter, a design support device of an embodiment will be more specifically described.

<Second Embodiment>

Figure 2:
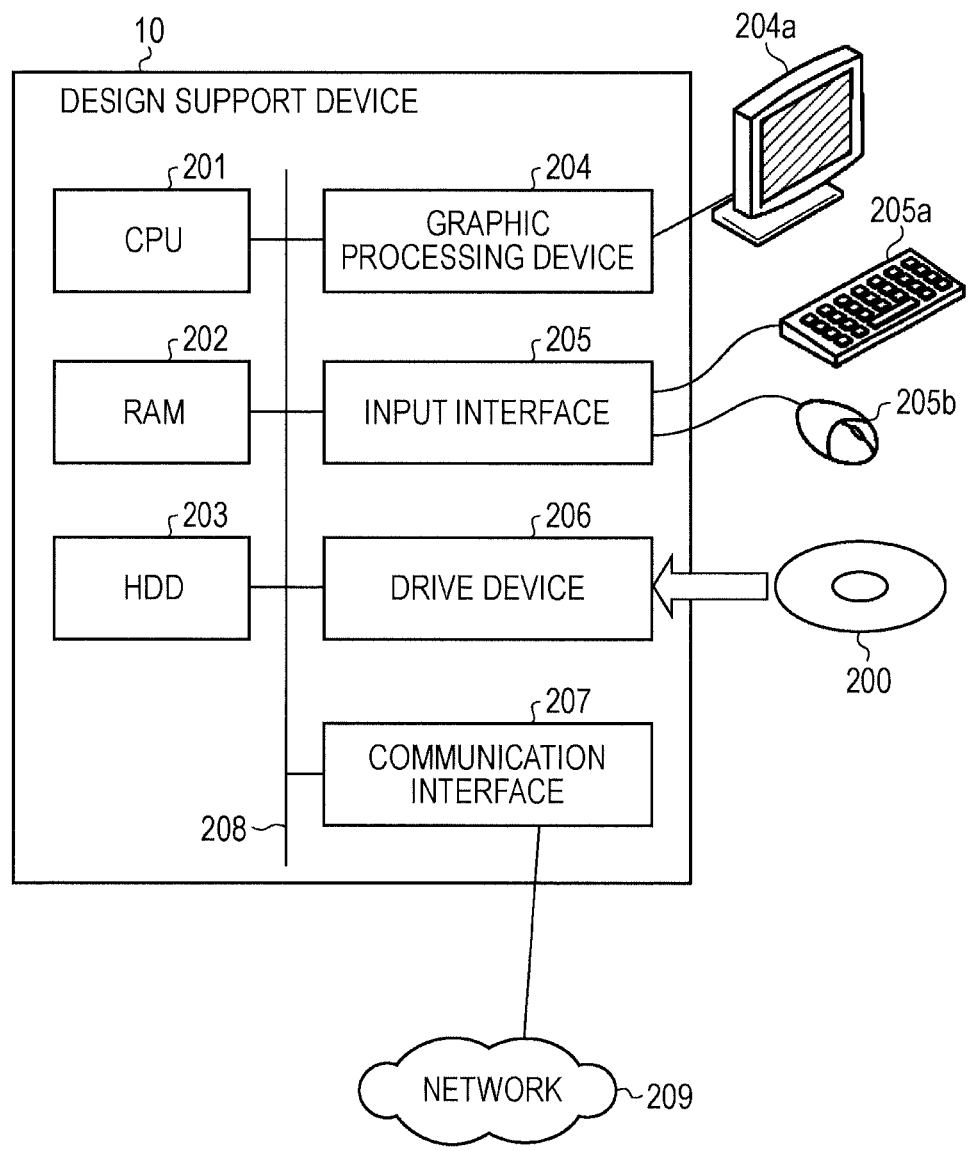
FIG. 2 is a diagram illustrating an example of a configuration of hardware of a design support device of a second embodiment.

FIG. 2 is a diagram illustrating an example of the configuration of the hardware of a design support device of a second embodiment. A CPU 201 controls the whole device of a design support device 10. A RAM 202 and a plurality of peripheral devices are connected to the CPU 201 through a bus 208.

The RAM 202 is used as the main storage device of the design support device 10. In the RAM 202, at least a portion of the program of an operating system (OS) and an application program caused to be executed by the CPU 201 is temporarily stored. In addition, in the RAM 202, various kinds of information used for processing performed by the CPU 201 are stored.

As the peripheral devices connected to the bus 208, there are a hard disk drive 203, a graphics processing device 204, an input interface 205, a drive device 206, and a communication interface 207.

The hard disk drive 203 magnetically performs the writing and reading of information on an embedded disk. The hard disk drive 203 is used as the secondary storage device of the design support device 10. In the hard disk drive 203, the program of the OS, the application program, and various kinds of information are stored. In addition, as the secondary storage device, it may also be possible to use a semiconductor storage device such as a flash memory or the like.

A monitor 204a is connected to the graphics processing device 204. In accordance with an instruction from the CPU 201, the graphics processing device 204 causes an image to be displayed on the screen of the monitor 204a. As the monitor 204a, a liquid crystal display device utilizing a cathode ray tube (CRT) or the like may be cited.

A keyboard 205a and a mouse 205b are connected to the input interface 205.

The input interface 205 transmits, to the CPU 201, a signal sent from the keyboard 205a or the mouse 205b. In addition, the mouse 205b is an example of a pointing device, and another pointing device may also be used. As the other pointing device, a touch panel, a tablet, a touch-pad, a trackball, or the like may be cited.

For example, the drive device 206 performs the reading of information recorded in a portable recording medium such as an optical disk in which information is recorded so as to be able to read owing to the reflection of light, a universal serial bus (USB) memory, or the like. For example, when the drive device 206 is an optical drive device, the reading of information recorded in the optical disk 200 is performed using laser light or the like. As the optical disk 200, a Blu-ray (registered trademark), a digital versatile disc (DVD), a DVD-RAM, a compact disc read only memory (CD-ROM), a CD-R (Recordable)/RW (ReWritable), or the like may be cited.

The communication interface 207 is connected to a network 209. The communication interface 207 transmits and receives information to and from another computer or a communication device through the network 209.

According to such a hardware configuration as described above, it may be possible to realize the processing function of the present embodiment.

Within the design support device 10 having such a hardware configuration, the following functions are provided.

Figure 3:
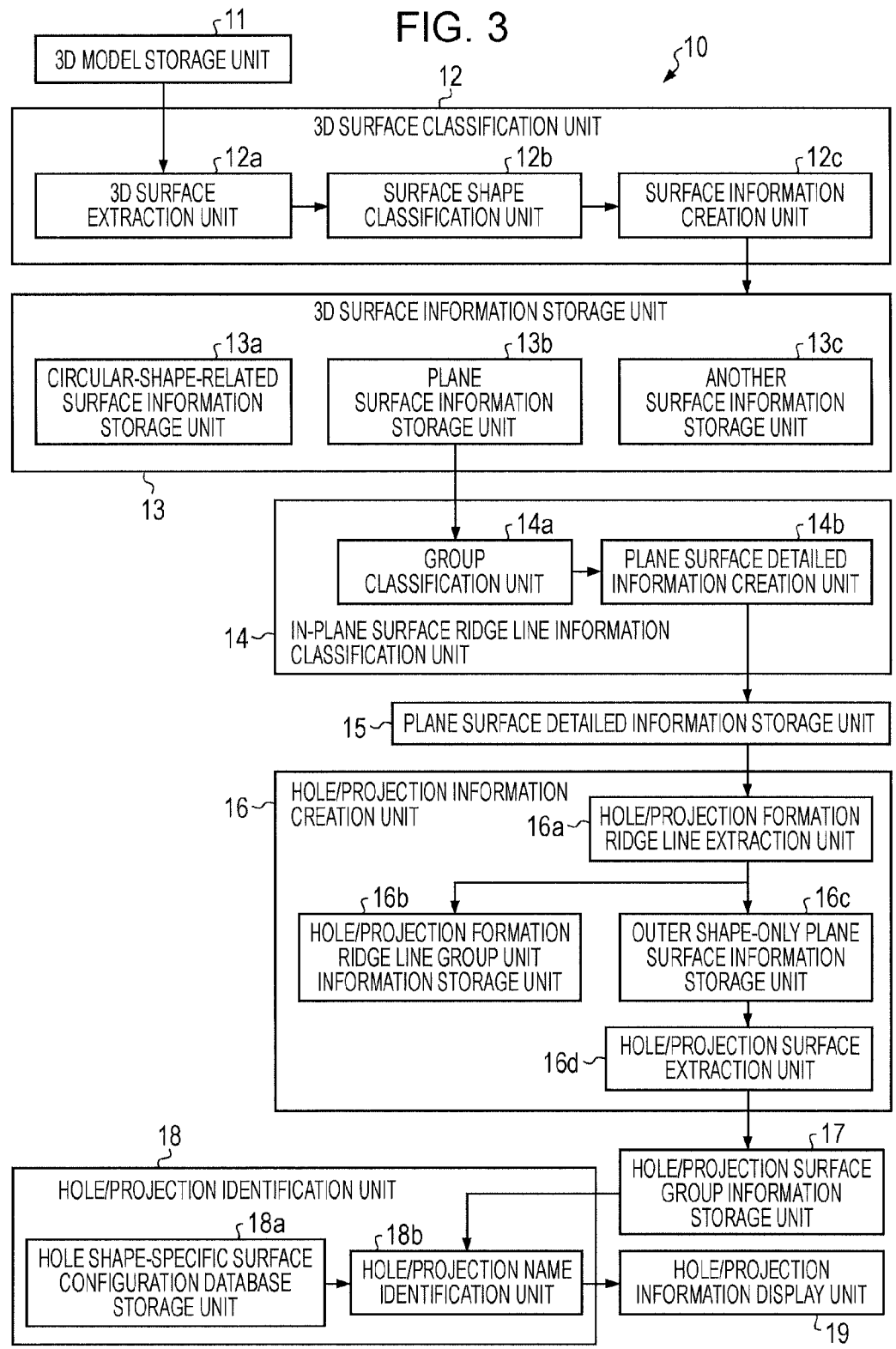
FIG. 3 is a block diagram illustrating a function of the design support device of the second embodiment.

FIG. 3 is a block diagram illustrating the function of the design support device of the second embodiment.

The design support device 10 includes a three-dimensional (3D) model storage unit 11, a 3D surface classification unit 12, a 3D surface information storage unit 13, an in-plane surface ridge line information classification unit 14, a plane surface detailed information storage unit 15, a hole/projection information creation unit 16, a hole/projection surface group information storage unit 17, a hole/projection identification unit 18, and a hole/projection information display unit 19.

The 3D model storage unit 11 stores therein a three-dimensional (3D) model creating hole/projection information.

The 3D surface classification unit 12 acquires surface information configuring the 3D model. In addition, the 3D surface classification unit 12 stores the acquired surface information in the 3D surface information storage unit 13.

The in-plane surface ridge line information classification unit 14 classifies ridge line information within a plane surface. In addition, the in-plane surface ridge line information classification unit 14 stores the classified ridge line information within a plane surface in the plane surface detailed information storage unit 15.

The hole/projection information creation unit 16 creates a hole/projection surface group information format where one surface or a plurality of surfaces, which form one hole or projection, are grouped with being associated with one another. In addition, the hole/projection information creation unit 16 stores the created hole/projection surface group information format in the hole/projection surface group information storage unit 17.

The hole/projection identification unit 18 identifies the kind of a hole/projection.

The hole/projection information display unit 19 outputs the hole/projection information identified by the hole/projection identification unit 18.

Hereinafter each function will be described in detail.

The 3D surface classification unit 12 includes a 3D surface extraction unit 12a, a surface shape classification unit 12b, and a surface information creation unit 12c.

Figure 4:
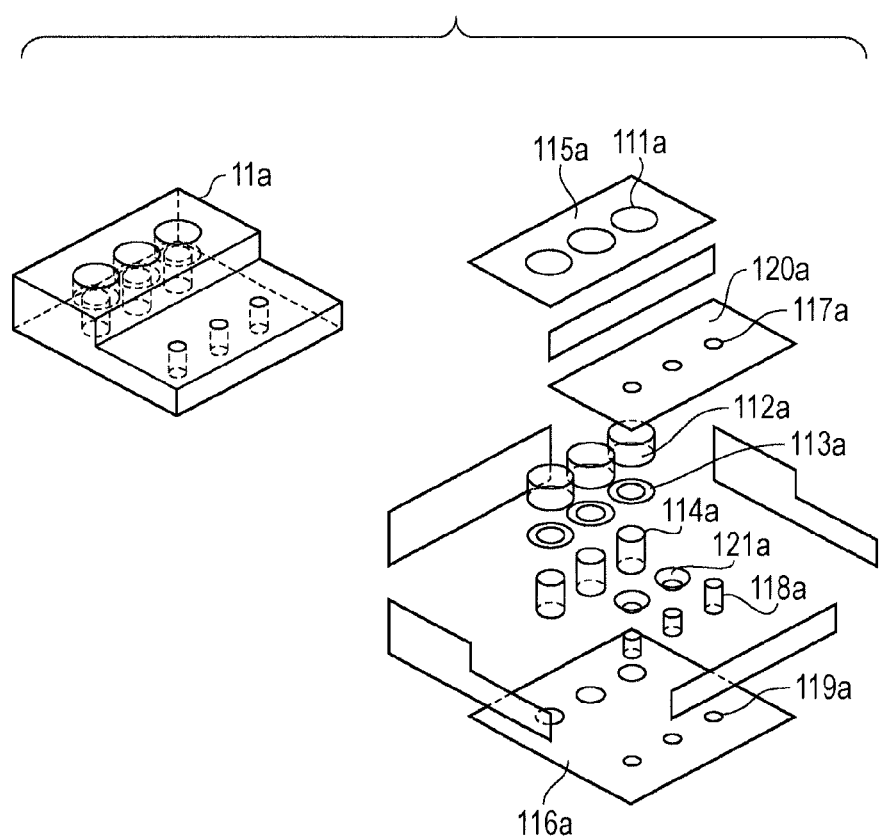
FIG. 4 is a diagram explaining processing of a 3D surface classification unit.

FIG. 4 is a diagram explaining the processing of the 3D surface classification unit.

In FIG. 4, a 3D model 11a stored in the 3D model storage unit 11 is illustrated.

The 3D surface extraction unit 12a extracts all surfaces forming the 3D model 11a. For example, the function of a 3D CAD of the related art is used for the extraction of surfaces. In the 3D model 11a illustrated in FIG. 4, a plurality of surfaces forming a hole or a projection are included. For example, one hole penetrating between plane surfaces 115a and 116a is formed on the basis of a circular plane surface 111a, a circular cylindrical surface 112a, a doughnut-shaped plane surface 113a, and a circular cylindrical surface 114a. In addition, one hole penetrating between plane surfaces 120a and 116a is formed on the basis of a circular plane surface 117a, a circular cylindrical surface 118a, and a circular plane surface 119a. In addition, a toric surface 121a and the like are also included in the 3D model 11a.

The surface shape classification unit 12b classifies, into the information of a circular-shape-related surface, a general plane surface, and another surface, a surface that forms a hole or a projection and is extracted from the 3D model by the 3D surface extraction unit 12a.

FIGS. 5A to 5G are diagrams explaining circular-shape-related surfaces. In addition, the surface shape classification unit 12b is an example of the shape determination unit.

The surface shape classification unit 12b defines a circular cylindrical surface, a circular arc surface, a circular cone surface A, a circular cone surface B, a toric surface, a circular plane surface, and a doughnut-shaped plane surface as circular-shape-related surfaces. A method for determining each surface is as follows.

Figure 5A:
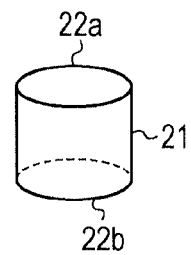
FIGS. 5A to 5G are diagrams explaining circular-shape-related surfaces.

As illustrated in FIG. 5A, the surface shape classification unit 12b determines that a surface 21 whose superficial surface is a circular cylindrical shape and which is formed by two circular ridge lines (circle-shaped ridge lines) 22a and 22b is a circular cylindrical surface. Owing to the function of the 3D CAD, it may be possible to judge that the superficial surface of the surface 21 is a circular cylindrical shape.

Figure 5E:
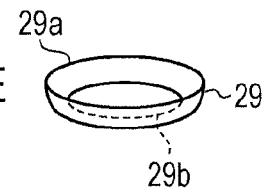
Figure 5B:
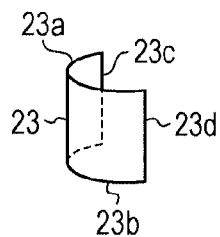

As illustrated in FIG. 5B, the surface shape classification unit 12b determines that a surface 23 whose superficial surface is a circular cylindrical shape, which is formed by two circular arc ridge lines 23a and 23b and two linear ridge lines 23c and 23d, and where, at the points of intersection between the circular arc ridge lines 23a and 23b and the linear ridge lines 23c and 23d, angles between the ridge lines are 90 degrees, respectively, is a circular arc surface.

Figure 5F:
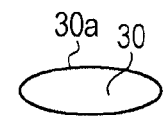
Figure 5C:
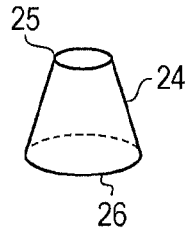

As illustrated in FIG. 5C, the surface shape classification unit 12b determines that a surface 24 whose superficial surface is a circular cone shape and which is formed by two circular ridge lines 25 and 26 is a circular cone surface A. In addition, owing to the function of the 3D CAD, it may be possible to judge that the superficial surface of the surface 24 is a circular cone shape.

Figure 5G:
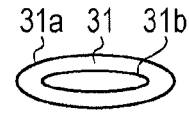
Figure 5D:
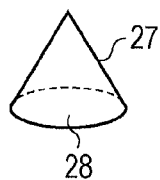

As illustrated in FIG. 5D, the surface shape classification unit 12b determines that a surface 27 whose superficial surface is a circular cone shape and which is formed by one circular ridge line 28 is a circular cone surface B.

As illustrated in FIG. 5E, the surface shape classification unit 12b determines that a surface 29 whose superficial surface is a toric surface shape and which is formed by two circular ridge lines 29a and 29b is a toric surface. In addition, owing to the function of the 3D CAD, it may be possible to judge that the superficial surface of the surface 29 is a toric surface shape.

As illustrated in FIG. 5F, the surface shape classification unit 12b determines that a surface 30 whose superficial surface is a plane surface and which is formed by one circular ridge line 30a is a circular plane surface. In addition, owing to the function of the 3D CAD, it may be possible to judge that the superficial surface of the surface 30 is a plane surface shape.

As illustrated in FIG. 5G, the surface shape classification unit 12b determines that a surface 31 whose superficial surface is a plane surface and which is formed by two circular ridge lines 31a and 31b whose center coordinates are the same is a doughnut-shaped plane surface. In addition, the function of a 3D CAD is used for the extraction of ridge lines forming surfaces and the judgment of the kinds of ridge lines.

In addition, the surface shape classification unit 12b defines a plane surface other than the circular-shape-related surfaces, as a general plane surface. In addition, the function of a 3D CAD is used for judging whether or not a surface extracted from the 3D model is a plane surface.

In addition, the surface shape classification unit 12b defines a surface other than the circular-shape-related surfaces and the general plane surface, as another surface.

The surface information creation unit 12c creates a circular-shape-related surface information format relating to a surface determined to be a circular-shape-related surface by the surface shape classification unit 12b. In addition, the surface information creation unit 12c creates a plane surface information format relating to a surface determined to be a general plane surface by the surface shape classification unit 12b. Furthermore, the surface information creation unit 12c creates another surface information format relating to a surface determined to be the other surface by the surface shape classification unit 12b.

FIGS. 6A to 6D and FIGS. 7A to 7C are diagrams explaining circular-shape-related surface information formats.

Each of the circular-shape-related surface information formats illustrated in FIGS. 6A to 6D and FIGS. 7A to 7C is a format for setting the information of a circular-shape-related surface. A circular-shape-related surface information format 41 illustrated in FIG. 6A is a format for setting the information of the circular cylindrical surface. In the circular-shape-related surface information format 41, the identification information (ID) of a circular cylindrical surface, the kind of a surface, the ID of a circular ridge line #1, the ID of a circular ridge line #2, the diameter of a circular cylinder, and the height of the circular cylinder are set. In the case of the circular cylindrical surface illustrated in FIG. 6A, in the circular-shape-related surface information format 41, the ID of the surface 21, a circular cylindrical surface, the ID of a circular ridge line 22a, the ID of a circular ridge line 22b, the diameters of the circular cylinders formed by the circular ridge lines 22a and 22b, and a linear distance between the centers of circles individually formed by the circular ridge lines 22a and 22b are set.

A circular-shape-related surface information format 42 illustrated in FIG. 6B is a format for setting the information of the circular cone surface A. In the circular-shape-related surface information format 42, the ID of a surface, the kind of the surface, the ID of a circular ridge line #1, the ID of a circular ridge line #2, the diameter of the circular ridge line #1, the diameter of the circular ridge line #2, and the height of a circular cylinder are set. In the case of the circular cone surface illustrated in FIG. 6B, the ID of the surface 24, the circular cone surface A, the ID of the circular ridge line 25, the ID of the circular ridge line 26, the diameter of a circle formed by the circular ridge line 25, the diameter of a circle formed by the circular ridge line 26, and a linear distance between the centers of circles individually formed by the circular ridge lines 25 and 26 are set.

A circular-shape-related surface information format 43 illustrated in FIG. 6C is a format for setting the information of the circular arc surface. In the circular-shape-related surface information format 43, the ID of a surface, the kind of the surface, the ID of a circular arc ridge line #1, the ID of a circular arc ridge line #2, the ID of a linear ridge line #1, the ID of a linear ridge line #2, the diameter of a circular arc surface, and the height of the circular arc surface are set. In the case of the circular arc surface illustrated in FIG. 6C, the ID of the surface 23, a circular arc surface, the ID of a circular arc ridge line 23a, the ID of a circular arc ridge line 23b, the ID of a linear ridge line 23c, the ID of a linear ridge line 23d, the diameter of the circular arc surface 23, and the length of the linear ridge line 23c or the linear ridge line 23d are set.

A circular-shape-related surface information format 44 illustrated in FIG. 6D is a format for setting the information of the circular cone surface B. In the circular-shape-related surface information format 44, the ID of a surface, the kind of the surface, the ID of a circular ridge line #1, the ID of an apex, the diameter of the circular ridge line #1, and the height of a circular cone are set. In the case of the circular cone surface B illustrated in FIG. 6D, the ID of the surface 27, the circular cone surface B, the ID of the circular ridge line 28, the ID of an apex 27a, the diameter of a circle formed by the circular ridge line 28, and a linear distance from the center of a circle formed by the circular ridge line 28 to the apex 27a are set.

A circular-shape-related surface information format 45 illustrated in FIG. 7A is a format for setting the information of the toric surface. In the circular-shape-related surface information format 45, the ID of a surface, the kind of the surface, the ID of a circular ridge line #1, the ID of a circular ridge line #2, the diameter of the circular ridge line #1, the diameter of the circular ridge line #2, and the height of a circular cylinder are set. In the case of the toric surface illustrated in FIG. 7A, the ID of the surface 29, a toric surface, the ID of a circular ridge line 29a, the ID of a circular ridge line 29b, the diameter of a circle formed by the circular ridge line 29a, the diameter of a circle formed by the circular ridge line 29b, a linear distance between the centers of circles individually formed by the circular ridge lines 29a and 29b are set.

A circular-shape-related surface information format 46 illustrated in FIG. 7B is a format for setting the information of the circular plane surface. In the circular-shape-related surface information format 46, the ID of a surface, the kind of the surface, and the ID of a circular ridge line #1 are set. In the case of the circular plane surface illustrated in FIG. 7B, the ID of the surface 30, a circular plane surface, and the ID of the circular ridge line 30a are set.

A circular-shape-related surface information format 47 illustrated in FIG. 7C is a format for setting the information of the doughnut-shaped plane surface. In the circular-shape-related surface information format 47, the ID of a surface, the kind of the surface, the ID of a circular ridge line #1, the ID of a circular ridge line #2, the diameter of the circular ridge line #1, and the diameter of the circular ridge line #2 are set. In the case of the doughnut-shaped plane surface illustrated in FIG. 7C, the ID of the surface 31, a doughnut-shaped plane surface, the ID of a circular ridge line 31a, the ID of a circular ridge line 31b, the diameter of a circle formed by the circular ridge line 31a, and the diameter of a circle formed by the circular ridge line 31b are set. In addition, using the function of the 3D CAD, it may be possible to acquire the information to be set in the circular-shape-related surface information formats 41 to 47.

Figure 8A:
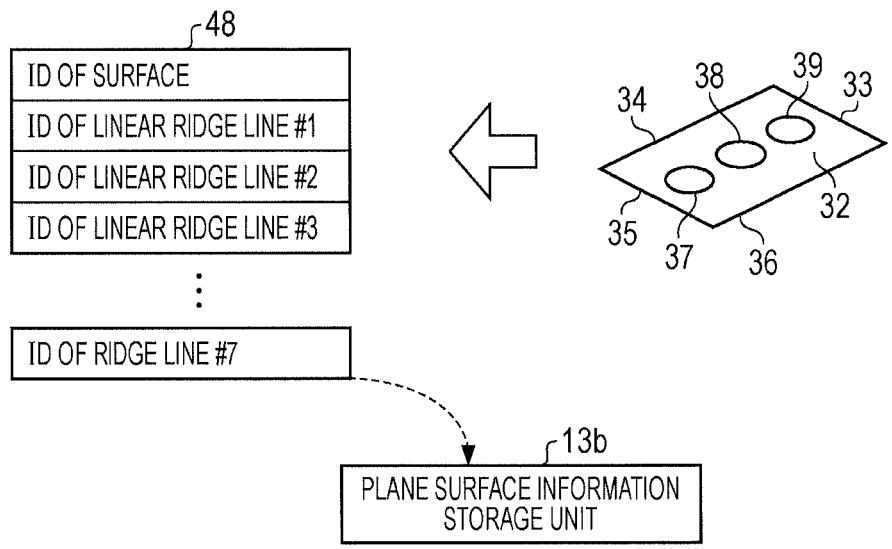
FIGS. 8A and 8B are diagrams explaining a plane surface information format and another surface information format.
Figure 8B:
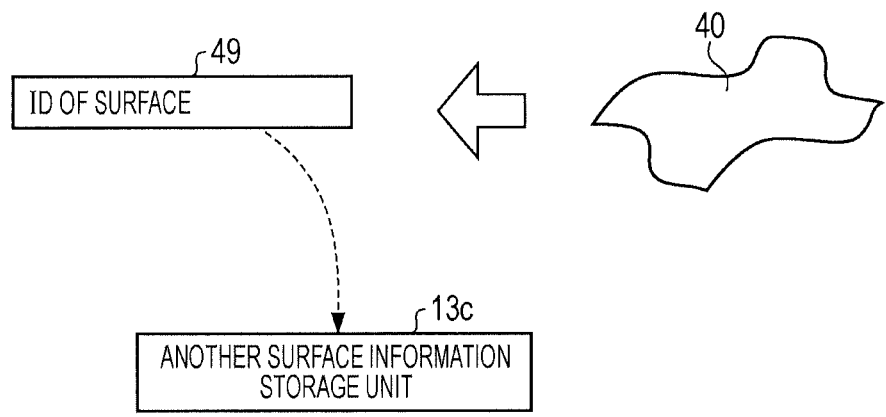

FIGS. 8A and 8B are diagrams explaining a plane surface information format and another surface information format.

A plane surface information format 48 includes the ID of a surface and the ID of a ridge line forming the surface. In the case of a plane surface illustrated in FIG. 8A, the ID of a surface 32, the ID of a ridge line 33, the ID of a ridge line 34, the ID of a ridge line 35, the ID of a ridge line 36, the ID of a ridge line 37, the ID of a ridge line 38, and the ID of a ridge line 39 are set. At this time, information identifying a linear ridge line is added to the ridge line of a straight line.

Another surface information format 49 includes the ID of a surface. In the case of a plane surface illustrated in FIG. 8B, the ID of a surface 40 is set.

Returning to FIG. 3 again, FIG. 3 will be described.

The 3D surface information storage unit 13 includes a circular-shape-related surface information storage unit 13a, a plane surface information storage unit 13b, and another surface information storage unit 13c.

The surface information creation unit 12c stores the created circular-shape-related surface information format in the circular-shape-related surface information storage unit 13a. The created plane surface information format is stored in the plane surface information storage unit 13b. The other created surface information format is stored in the other surface information storage unit 13c.

The in-plane surface ridge line information classification unit 14 includes a group classification unit 14a and a plane surface detailed information creation unit 14b.

The group classification unit 14a classifies the IDs of ridge lines, included in the plane surface information format stored in the plane surface information storage unit 13b, into the group (outer shape formation ridge line group) of a ridge line forming the outer shape of a plane surface and the group (hole/projection formation ridge line group) of a ridge line forming a hole/projection shape within a plane surface.

Figure 9:
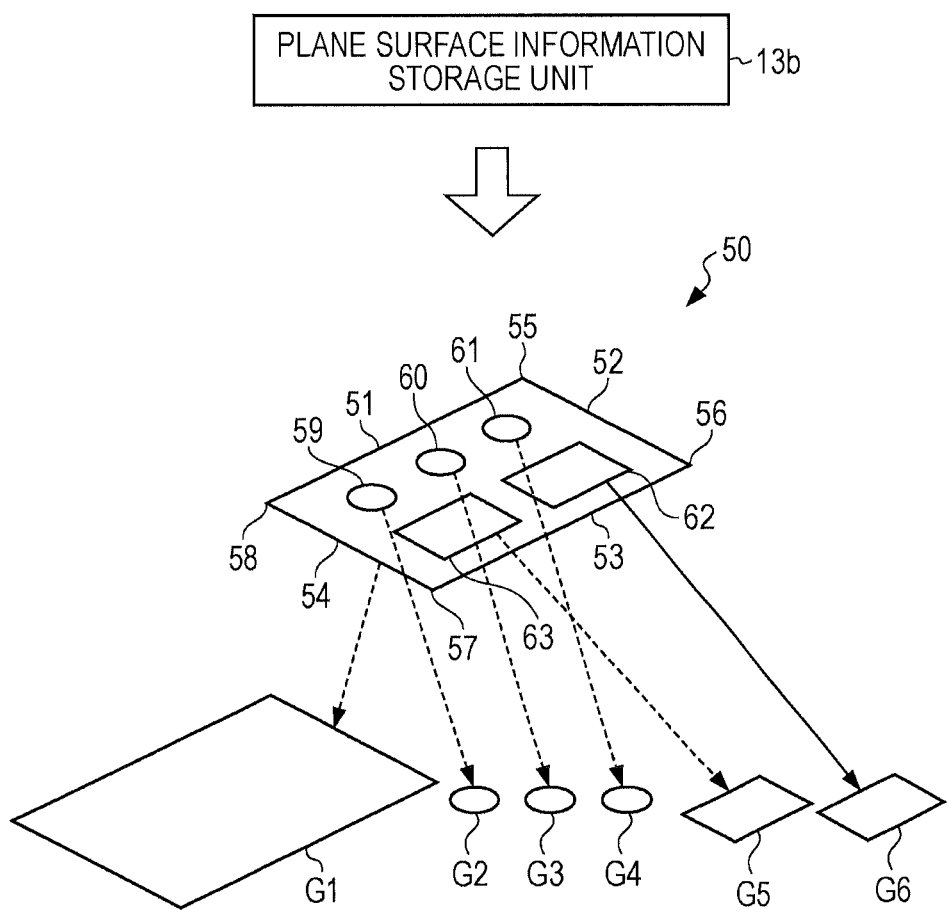
FIG. 9 is a diagram explaining the classification of groups.

FIG. 9 is a diagram explaining the classification of groups.

First, the group classification unit 14a classifies ridge lines within a plane surface of the plane surface information format into a plurality of groups. Specifically, when, from among ridge lines within the plane surface information, the group classification unit 14a connects ridge lines whose end point (starting point or ending point) coordinates are the same, one region surrounded by these ridge lines is formed. The group classification unit 14a classifies these ridge lines into one group.

A plane surface 50 illustrated in FIG. 9 illustrates an example of a plane surface embodied by the plane surface information format. In the plane surface 50, a ridge line 51 is connected to a ridge line 52 at an end point 55. The ridge line 52 is connected to a ridge line 53 at an end point 56. The ridge line 53 is connected to a ridge line 54 at an end point 57. The ridge line 54 is connected to the ridge line 51 at an end point 58. On the basis of these ridge lines 51 to 54, one surrounded region is formed. The group classification unit 14a classifies these ridge lines 51 to 54 into one group G1.

Since a region surrounded by one circular ridge line is formed with respect to a circular ridge line or the like, the group classification unit 14*a* classifies each of circular ridge lines into one group. In FIG. 9, each of ridge lines 59, 60, and 61 is a circular ridge line, and one region surrounded by each of the ridge lines 59, 60, and 61 is formed. Therefore, the group classification unit 14*a* classifies the ridge lines 59, 60, and 61 into groups G2, G3, and G4, respectively.

In the same way, when other ridge lines are also grouped, the plane surface 50 illustrated in FIG. 9 is classified into six ridge line groups G1 to G6.

Next, the group classification unit 14*a* acquires the areas of regions formed by the classified ridge line groups. In addition, the group classification unit 14*a* determines that a ridge line where the area of a region is the largest is an outer shape formation ridge line group. In addition, the group classification unit 14*a* determines that ridge line groups other than the outer shape formation ridge line group are hole/projection formation ridge line groups. In the example illustrated in FIG. 9, the group classification unit 14*a* determines that the group G1 is the outer shape formation ridge line group. The group classification unit 14*a* determines that the groups G2 to G6 other than the group G1 are the hole/projection formation ridge line groups.

The plane surface detailed information creation unit 14*b* creates a plane surface detailed information format including the information of the ridge line groups classified by the group classification unit 14*a*.

Figure 10:
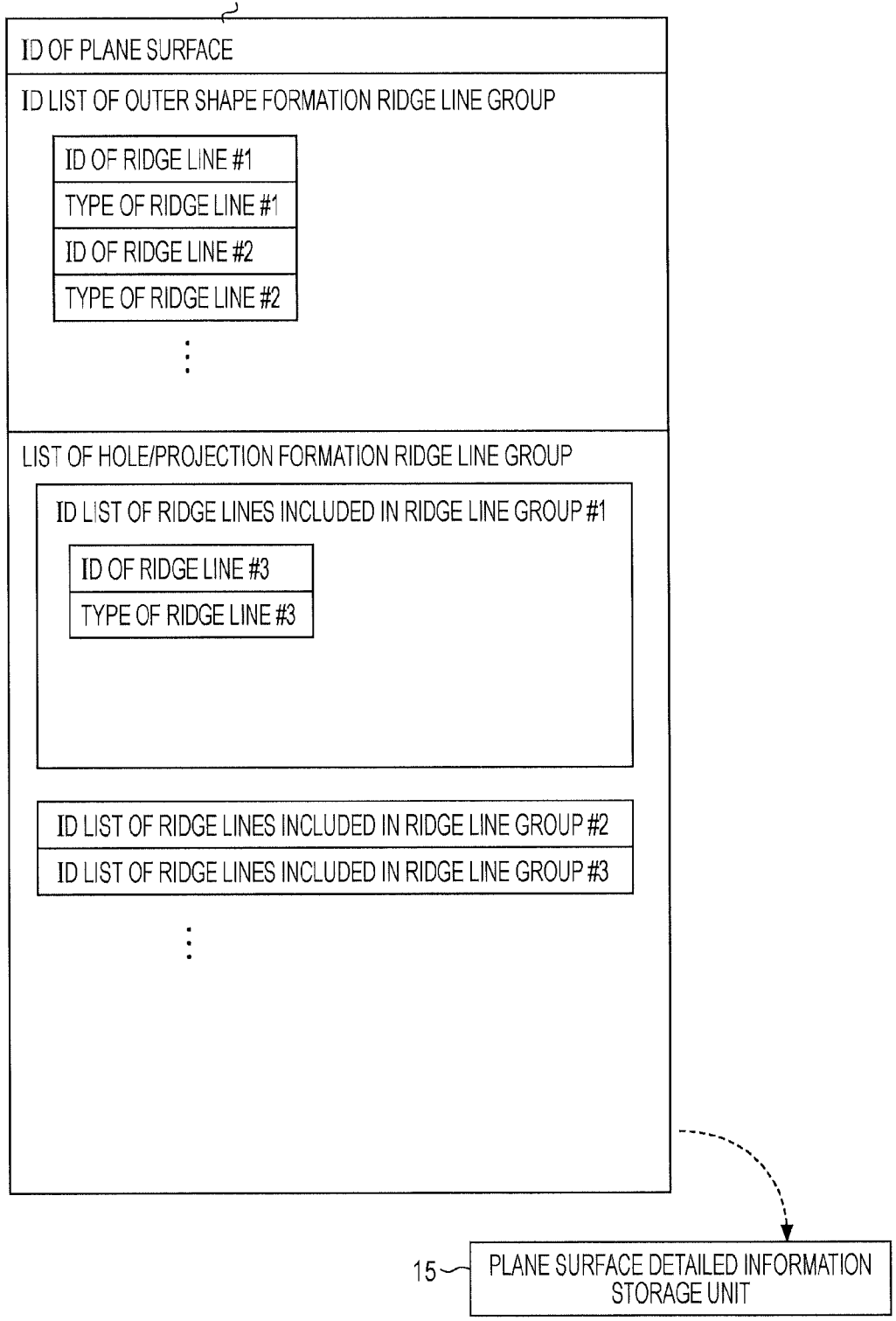
FIG. 10 is a diagram explaining a plane surface detailed information format.

FIG. 10 is a diagram explaining the plane surface detailed information format.

In a plane surface detailed information format 71, the columns of the ID of a plane surface, the ID list of the outer shape formation ridge line group, and the list of the hole/projection formation ridge line groups are provided.

In the column of the ID of a plane surface, an ID identifying the plane surface is set. For example, in the case of the plane surface 50 illustrated in FIG. 9, the ID of the plane surface 50 is set. In the column of the ID list of the outer shape formation ridge line group, the IDs of ridge lines forming the outer shape formation ridge line group and the types of the ridge lines are set with being listed. For example, in the case of the plane surface 50 illustrated in FIG. 9, the ridge lines 51 to 54 forming the group G1 are set with being listed. In addition, it is set that the ridge lines 51 to 54 are linear ridge lines. In the column of the list of the hole/projection formation ridge line groups, the IDs of ridge lines forming the hole/projection formation ridge line groups and the types of the ridge line are set with being listed. For example, in the case of the plane surface 50 illustrated in FIG. 9, the IDs of ridge lines forming the groups G2 to G6 individually are set with being listed. In addition, it is set that the groups G2 to G4 are circular ridge lines and the groups G5 and G6 are linear ridge lines.

The plane surface detailed information creation unit 14*b* stores the converted plane surface detailed information format 71 in the plane surface detailed information storage unit 15. With respect to all plane surface information formats stored in the plane surface information storage unit 13*b*, the in-plane surface ridge line information classification unit 14 creates and stores the plane surface detailed information formats in the plane surface detailed information storage unit 15.

Returning to FIG. 3 again, FIG. 3 will be described.

The hole/projection information creation unit 16 includes a hole/projection formation ridge line extraction unit 16*a*, a hole/projection formation ridge line group unit information storage unit 16*b*, an outer shape-only plane surface information storage unit 16*c*, and a hole/projection surface extraction unit 16*d*.

The hole/projection formation ridge line extraction unit 16*a* converts the plane surface detailed information format stored in the plane surface detailed information storage unit 15 into information based on the unit of the hole/projection formation ridge line group (hereinafter, referred to as a "hole/projection formation ridge line group unit information").

Figure 11:
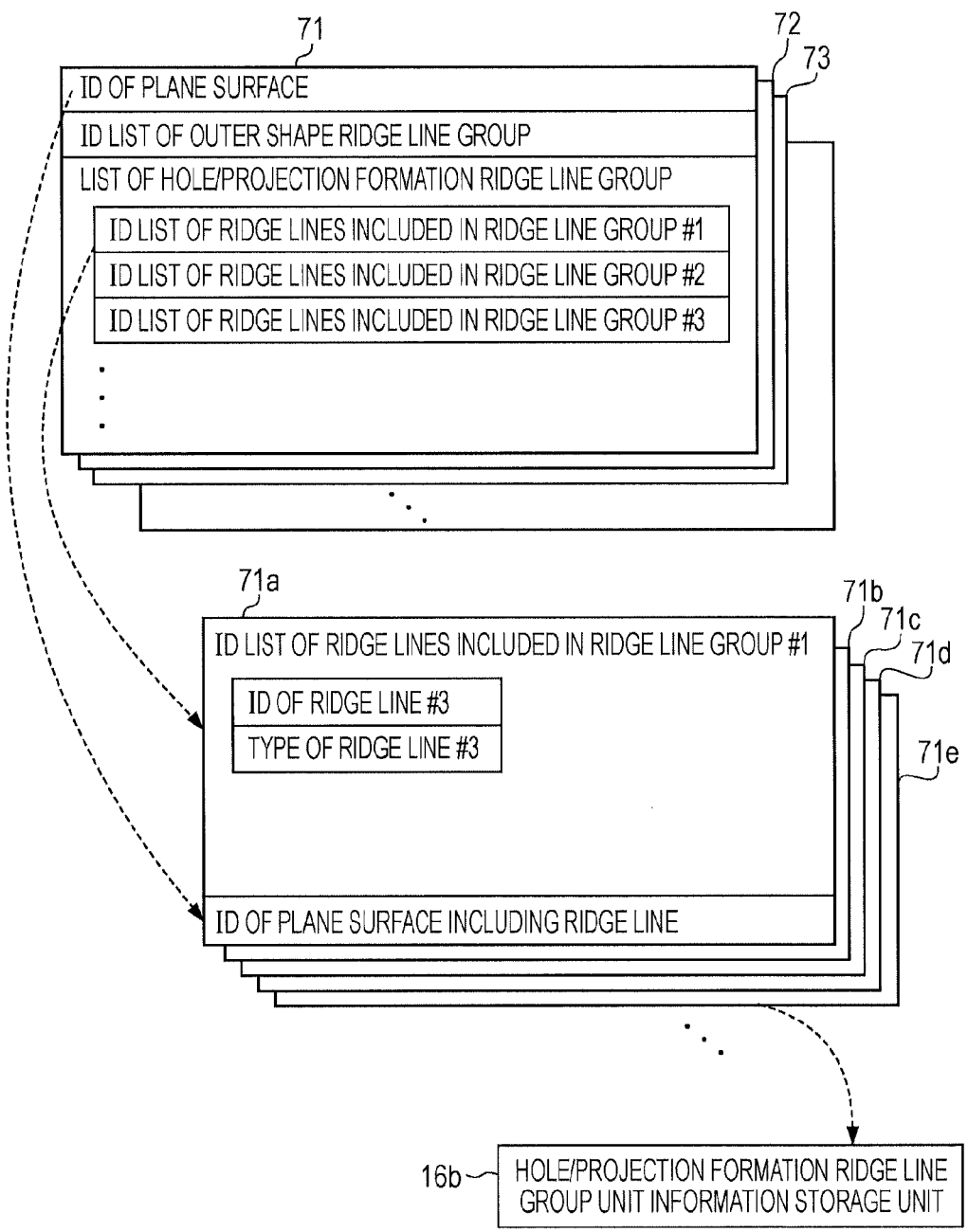
FIG. 11 is a diagram explaining hole/projection formation ridge line group unit information.

FIG. 11 is a diagram explaining the hole/projection formation ridge line group unit information.

FIG. 11 illustrates the plane surface detailed information format 71 and pieces of hole/projection formation ridge line group unit information 71*a* to 71*e* into which the plane surface detailed information format 71 is converted by the hole/projection formation ridge line extraction unit 16*a*. The list of the IDs of ridge lines forming the hole/projection formation ridge line group and the IDs of plane surfaces including the ridge lines are associated with the hole/projection formation ridge line group unit information 71*a*. For example, the IDs of the group G2 and the plane surface 50 are associated with the hole/projection formation ridge line group unit information 71*a* into which the plane surface detailed information format 71 of the plane surface 50 illustrated in FIG. 9 is converted. The IDs of the group G3 and the plane surface 50 are associated with the hole/projection formation ridge line group unit information 71*b*. The IDs of the group G4 and the plane surface 50 are associated with the hole/projection formation ridge line group unit information 71*c*. The IDs of the group G5 and the plane surface 50 are associated with the hole/projection formation ridge line group unit information 71*d*. The IDs of the group G6 and the plane surface 50 are associated with the hole/projection formation ridge line group unit information 71*e*.

The hole/projection formation ridge line extraction unit 16*a* stores the converted pieces of hole/projection formation ridge line group unit information 71*a* to 71*e* in the hole/projection formation ridge line group unit information storage unit 16*b*. In addition, the hole/projection formation ridge line extraction unit 16*a* also converts each of plane surface detailed information formats 72 and 73 stored in the plane surface detailed information storage unit 15 into hole/projection formation ridge line group unit information. In addition, the hole/projection formation ridge line extraction unit 16*a* stores the converted hole/projection formation ridge line group unit information in the hole/projection formation ridge line group unit information storage unit 16*b*.

In addition, when the list of the hole/projection formation ridge line group does not exist in the plane surface detailed information format stored in the plane surface detailed information storage unit 15, the hole/projection formation ridge line extraction unit 16*a* determines that the plane surface detailed information format of an outer shape only exists.

Figure 12:
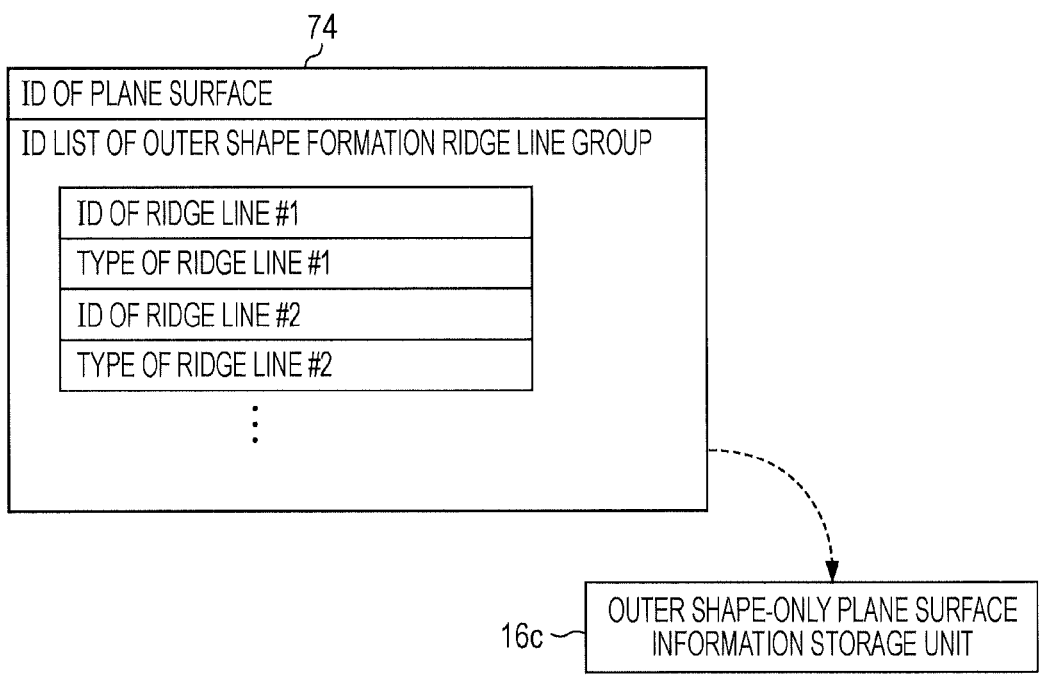
FIG. 12 is a diagram explaining a plane surface detailed information format.

FIG. 12 is a diagram explaining the plane surface detailed information format.

In a plane surface detailed information format 74 illustrated in FIG. 12, the list of a hole/projection formation ridge line group does not exist, unlike the plane surface detailed information format 71. The plane surface detailed information format 74 indicates that a ridge line forming a hole or a projection in a plane surface does not exist. The hole/projection formation ridge line extraction unit 16*a* determines that the plane surface detailed information format 74 in which the list of the hole/projection formation ridge line group does not exist is a format relating to a plane surface of only an outer shape, and the hole/projection formation ridge line extraction unit 16*a* stores the plane surface detailed information format 74 in the outer shape-only plane surface information storage unit 16*c*.

In response to the shape of a graphic formed by a ridge line included in the hole/projection formation ridge line group unit information stored in the hole/projection formation ridge line group unit information storage unit 16*b*, the hole/projection surface extraction unit 16*d* creates a hole/projection surface group information format in which the information of a surface forming one hole/projection is grouped. In addition, the hole/projection surface extraction unit 16*d* stores the created hole/projection surface group information format in the hole/projection surface group information storage unit 17. In addition, the hole/projection surface extraction unit 16*d* is an example of the extraction unit, the creation unit, and the determination unit.

Hereinafter, in "Processing Operation 1", the processing of the hole/projection surface extraction unit 16*d* will be described that is performed when only one circular ridge line is included in the hole/projection formation ridge line group unit information stored in the hole/projection formation ridge line group unit information storage unit 16*b*. In addition, in "Processing Operation 2", the processing of the hole/projection surface extraction unit 16*d* will be described that is performed when a ridge line included in the hole/projection formation ridge line group unit information stored in the hole/projection formation ridge line group unit information storage unit 16*b* is formed by a plurality of circular arcs and a plurality of straight lines.

<Processing Operation 1>

When only one circular ridge line is included in the hole/projection formation ridge line group unit information stored in the hole/projection formation ridge line group unit information storage unit 16*b*, the hole/projection surface extraction unit 16*d* executes the following Processing Operation 1-1 to Processing Operation 1-3. Hereinafter, when only one circular ridge line is included in the hole/projection formation ridge line group unit information, this circular ridge line is referred to as a "hole/projection surface extraction-use circular ridge line". In addition, a plane surface including the hole/projection surface extraction-use circular ridge line is referred to as a "hole/projection surface extraction-use reference plane surface".

Figure 13:
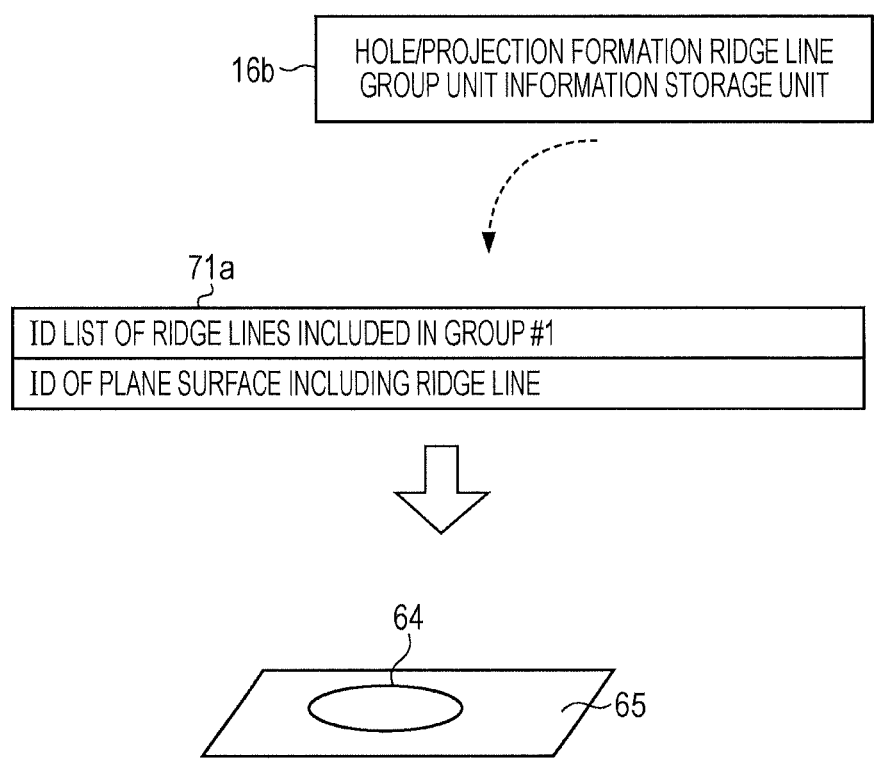
FIG. 13 is a diagram explaining a hole/projection surface extraction-use circular ridge line and a hole/projection surface extraction-use reference plane surface.

FIG. 13 is a diagram explaining the hole/projection surface extraction-use circular ridge line and the hole/projection surface extraction-use reference plane surface.

It is assumed that only the ID of a ridge line 64 forming a circle is stored in the ID list of a ridge line included in the group #1 of the hole/projection formation ridge line group unit information 71*a* illustrated in FIG. 13. In addition, it is assumed that the ID of a plane surface 65 is stored in the ID of a plane surface including the ridge line of the hole/projection formation ridge line group unit information 71*a*. Since only one circular ridge line is included in the hole/projection formation ridge line group unit information 71*a*, the hole/projection surface extraction unit 16*d* executes the Processing Operation 1. Hereinafter, the ridge line 64 is referred to as a hole/projection surface extraction-use circular ridge line 64. In addition, the plane surface 65 including the hole/projection surface extraction-use circular ridge line 64 becomes the hole/projection surface extraction-use reference plane surface. Hereinafter, the plane surface 65 is referred to as a hole/projection surface extraction-use reference plane surface 65.

<Processing Operation 1-1>

The hole/projection surface extraction unit 16*d* extracts, from the circular-shape-related surface information storage unit 13*a*, a circular-shape-related surface information format including the ID of a ridge line that is the same as the ID of the hole/projection surface extraction-use circular ridge line 64.

<Processing Operation 1-2>

The hole/projection surface extraction unit 16*d* determines whether a circular-shape-related surface, embodied by the circular-shape-related surface information format extracted from the circular-shape-related surface information storage unit 13*a*, forms a hole shape or a projection shape. When the determination is performed, the hole/projection surface extraction unit 16*d* determines which of the formats of the circular cylindrical surface, the circular cone surface A, the toric surface, and the circular cone surface B the circular-shape-related surface information format including the ID of a ridge line that is the same as the ID of the hole/projection surface extraction-use circular ridge line is. Specifically, the hole/projection surface extraction unit 16*d* determines whether or not a condition is satisfied in which the number of the IDs of circular ridge lines included in the circular-shape-related surface information format extracted from the circular-shape-related surface information storage unit 13*a* is two and two circular ridge line center coordinates are different from each other. In addition, when the condition is satisfied, the hole/projection surface extraction unit 16*d* determines that the extracted circular-shape-related surface information format is the format of the circular cylindrical surface, the circular cone surface A, or the toric surface. On the other hand, when the condition is not satisfied, the hole/projection surface extraction unit 16*d* determines whether or not the number of the IDs of circular ridge lines included in the circular-shape-related surface information format extracted from the circular-shape-related surface information storage unit 13*a* is one. In addition, when the condition is satisfied, the hole/projection surface extraction unit 16*d* determines that the extracted circular-shape-related surface information format is the format of the circular cone surface B.

When the determination of the type of the circular-shape-related surface of the circular-shape-related surface information format including the ID of a ridge line that is the same as the ID of the hole/projection surface extraction-use circular ridge line has finished, the hole/projection surface extraction unit 16*d* determines whether the circular-shape-related surface of the determined format forms a hole shape or a projection shape.

When it is determined that the circular-shape-related surface information format is the format of the circular cylindrical surface, the circular cone surface A, or the toric surface, the hole/projection surface extraction unit 16*d* creates a circle center-to-center vector. This circle center-to-center vector is a vector headed from the center of the hole/projection surface extraction-use circular ridge line to the center of a ridge line other than the hole/projection surface extraction-use circular ridge line, from among the two circular ridge lines included in the circular-shape-related surface information format. In addition, the hole/projection surface extraction unit 16*d* determines whether or not the directions of the created circle center-to-center vector and the normal vector of the hole/projection surface extraction-use reference plane surface coincide with each other. In addition, on the basis of a determination result, the hole/projection surface extraction unit 16*d* determines whether the circular-shape-related surface of the circular-shape-related surface information format extracted from the circular-shape-related surface information storage unit 13*a* forms a hole shape or a projection shape.

In addition, when determining that the extracted circular-shape-related surface is the circular cone surface B, the hole/projection surface extraction unit 16*d* creates a vector headed from the center of the hole/projection surface extraction-use circular ridge line to the apex of the circular cone surface B. In addition, the hole/projection surface extraction unit 16*d* determines whether or not the directions of the created vector and the hole/projection surface extraction-use reference plane surface normal vector coincide with each other. In addition, on the basis of a determination result, the hole/projection surface extraction unit 16d determines whether the circular cone surface B of the circular-shape-related surface information extracted from the circular-shape-related surface information storage unit 13a forms a hole shape or a projection shape.

Figure 14A:
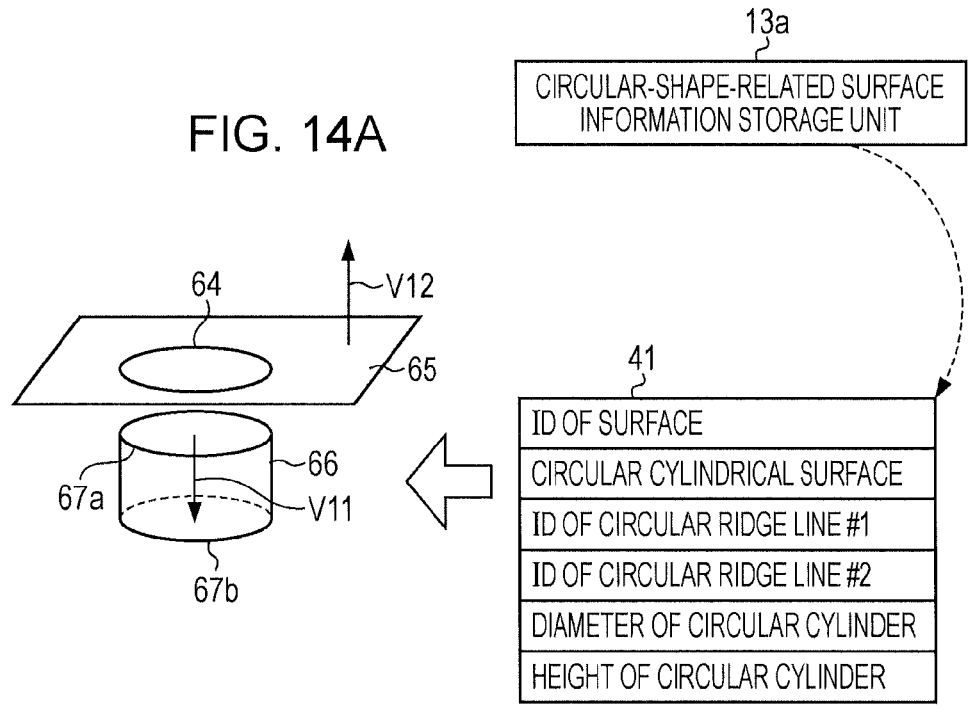
FIGS. 14A and 14B are diagrams explaining processing determining whether a circular-shape-related surface of a circular-shape-related surface information format forms a hole shape or a projection shape.
Figure 14B:
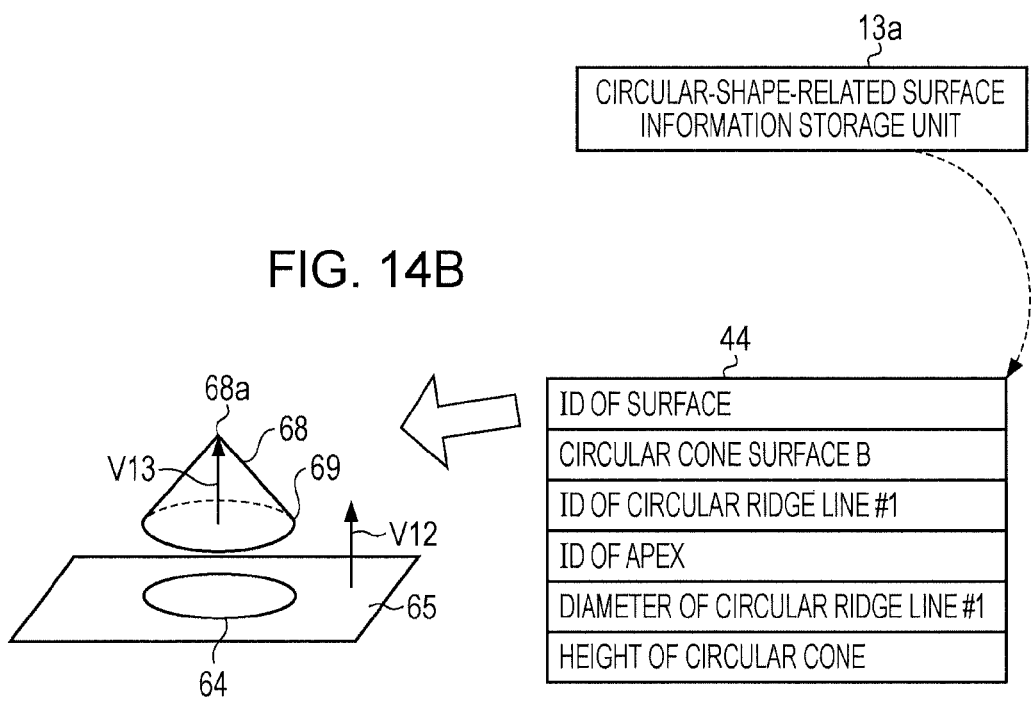

FIGS. 14A and 14B are diagrams explaining processing determining whether the circular-shape-related surface of the circular-shape-related surface information format forms a hole shape or a projection shape.

FIG. 14A illustrates a circular cylindrical surface 66 embodied by the circular-shape-related surface information format 41 that includes a ridge line having the same ID as that of the hole/projection surface extraction-use circular ridge line 64 and is extracted by the hole/projection surface extraction unit 16d. Here, it is assumed that the ID of the hole/projection surface extraction-use circular ridge line 64 and the ID of a circular ridge line 67a coincide with each other.

When the hole/projection surface extraction unit 16d determines whether or not a condition is satisfied in which the number of the IDs of the circular ridge lines of a circular-shape-related surface included in the extracted circular-shape-related surface information format 41 is two and two circular ridge line center coordinates are different from each other, the condition is satisfied. Accordingly, the hole/projection surface extraction unit 16d creates a vector V11 headed from the center of the hole/projection surface extraction-use circular ridge line 64 to the center of a circular ridge line 67b that does not coincide with the ID of the hole/projection surface extraction-use circular ridge line 64, from among the circular ridge lines 67a and 67b. In addition, the hole/projection surface extraction unit 16d determines whether or not the direction of the created vector V11 and the direction of the normal vector V12 of the hole/projection surface extraction-use reference plane surface 65 coincide with each other. The hole/projection surface extraction unit 16d determines that the direction of the created vector V11 and the direction of the normal vector V12 of the hole/projection surface extraction-use reference plane surface 65 do not coincide with each other. Next, the hole/projection surface extraction unit 16d determines whether or not the direction of the created vector V11 and the opposite direction of the normal vector V12 of the hole/projection surface extraction-use reference plane surface 65 coincide with each other. The hole/projection surface extraction unit 16d determines that the direction of the created vector V11 and the opposite direction of the normal vector V12 of the hole/projection surface extraction-use reference plane surface 65 coincide with each other.

Accordingly, the hole/projection surface extraction unit 16d determines that the circular cylindrical surface 66 is a surface forming a hole shape. In addition, while not illustrated, when the direction of the created vector and the direction of the normal vector V12 of the hole/projection surface extraction-use reference plane surface 65 coincide with each other, the hole/projection surface extraction unit 16d determines that the circular-shape-related surface of the extracted circular-shape-related surface information format forms a projection shape. In addition, while, in FIG. 14A, the circular cylindrical surface has been described, it may also be possible to perform determination with respect to the circular cone surface A and the toric surface, using the same method as in the circular cylindrical surface.

FIG. 14B illustrates a circular cone surface 68 (circular cone surface B) embodied by the circular-shape-related surface information format 44 that includes a ridge line having the same ID as that of the hole/projection surface extraction-use circular ridge line 64 and is extracted by the hole/projection surface extraction unit 16d. Here, it is assumed that the ID of the hole/projection surface extraction-use circular ridge line 64 and the ID of a circular ridge line 69 coincide with each other.

When the extracted circular-shape-related surface information format is a circular cone surface B, the hole/projection surface extraction unit 16d determines whether or not the direction of a vector V13 created so as to be headed form the center of the hole/projection surface extraction-use circular ridge line 64 to the apex 68a of the circular cone surface 68 and the direction of the normal vector V12 of the hole/projection surface extraction-use reference plane surface 65 coincide with each other. The hole/projection surface extraction unit 16d determines that the direction of the created vector V13 and the direction of the normal vector V12 of the hole/projection surface extraction-use reference plane surface 65 coincide with each other. Accordingly, the hole/projection surface extraction unit 16d determines that the circular cone surface 68 is a surface forming a projection shape. In addition, while not illustrated, when the direction of the created vector and the direction of the normal vector V12 of the hole/projection surface extraction-use reference plane surface 65 coincide with each other, the hole/projection surface extraction unit 16d determines that the circular-shape-related surface of the circular-shape-related surface information format extracted from the circular-shape-related surface information storage unit 13a forms a hole shape (a blind hole, a dimple, or the like).

<Processing Operation 1-3>

When the number of the IDs of circular ridge lines included in the extracted circular-shape-related surface information format is two (hereinafter, this circular-shape-related surface is referred to as an old circular-shape-related surface), the hole/projection surface extraction unit 16d sets, as a new hole/projection surface extraction-use circular ridge line, a circular ridge line that does not coincide with the ID of the hole/projection surface extraction-use circular ridge line, from among the two circular ridge lines of the old circular-shape-related surface information format. In addition, by repeatedly executing the Processing Operation 1-1 to the Processing Operation 1-3, the hole/projection surface extraction unit 16d performs the extraction of a new circular-shape-related surface and determines whether or not the new circular-shape-related surface forms a hole shape or a projection shape.

Figure 15A:
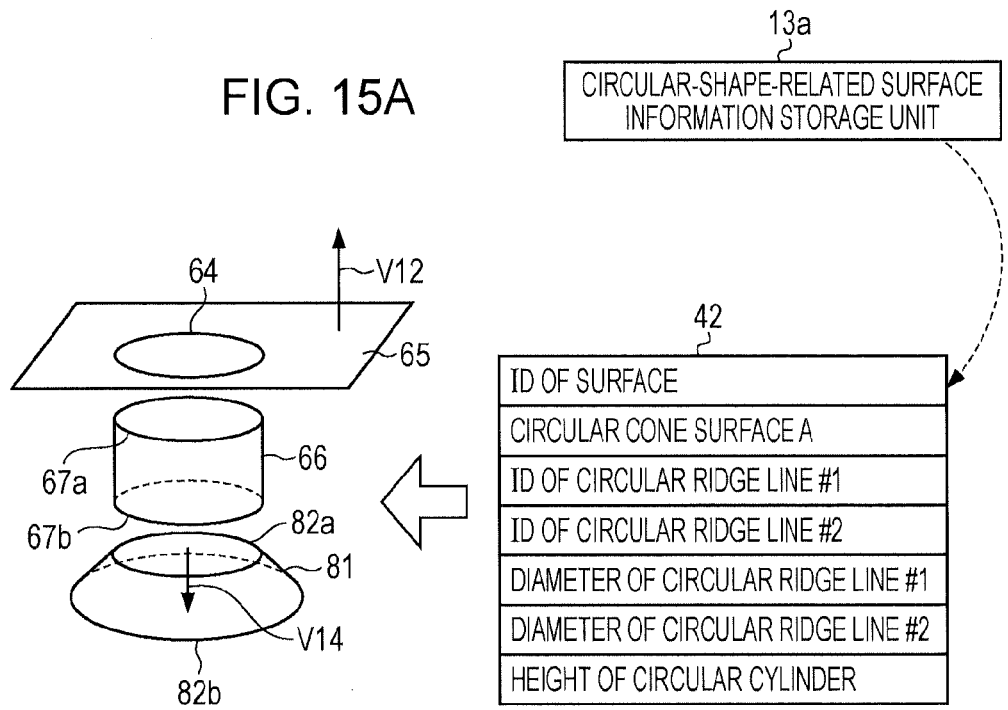
FIGS. 15A and 15B are diagrams explaining the repetition of processing operations.
Figure 15B:
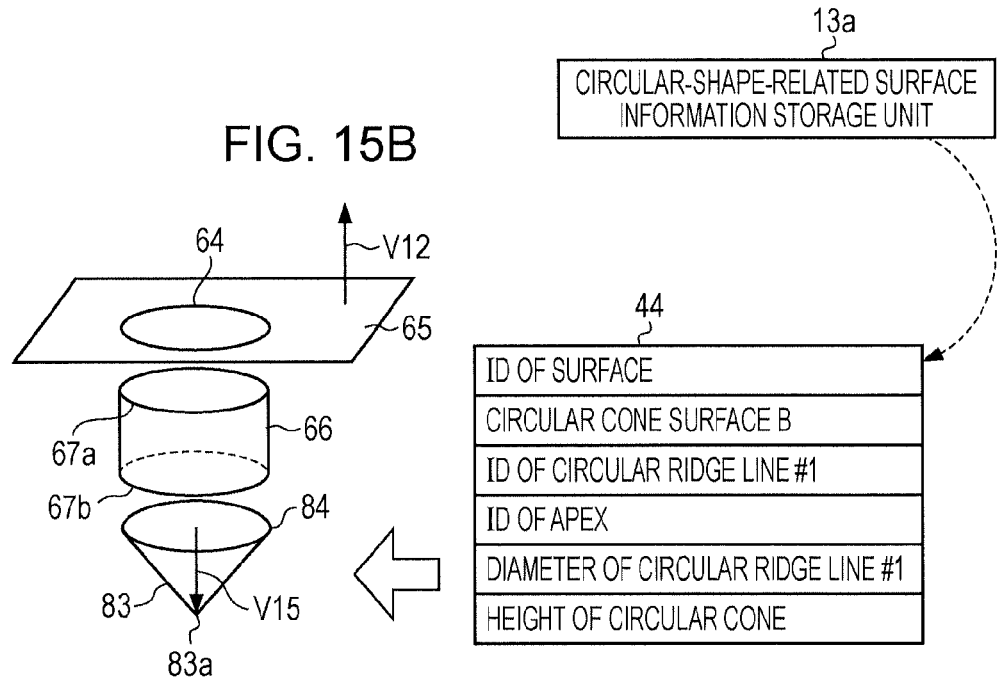

FIGS. 15A and 15B are diagrams explaining the repetition of the Processing Operation 1-1 to the Processing Operation 1-3.

The hole/projection surface extraction unit 16d sets, as a new hole/projection surface extraction-use circular ridge line, the circular ridge line 67b that does not coincide with the ID of the hole/projection surface extraction-use circular ridge line 64, from among two circular ridge lines included in an old circular-shape-related surface information format 41. Hereinafter, the newly set hole/projection surface extraction-use circular ridge line is referred to as a hole/projection surface extraction-use circular ridge line 67b.

FIG. 15A illustrates a circular cone surface 81 (circular cone surface A) embodied by the circular-shape-related surface information format 42 that includes a ridge line having the same ID as that of the hole/projection surface extraction-use circular ridge line 67b and is extracted by the hole/projection surface extraction unit 16d. Here, it is assumed that the ID of the hole/projection surface extraction-use circular ridge line 67b and the ID of a circular ridge line 82a coincide with each other.

When the hole/projection surface extraction unit 16d determines whether or not a condition is satisfied in which the number of the IDs of the circular ridge lines of a circular-shape-related surface included in the newly extracted circular-shape-related surface information format 42 is two and the center coordinates of two circular ridge lines are different from each other, the condition is satisfied. Accordingly, the hole/projection surface extraction unit 16d creates a vector V14 headed from the center of the hole/projection surface extraction-use circular ridge line 67b to the center of a circular ridge line 82b that does not coincide with the ID of the hole/projection surface extraction-use circular ridge line 67b, from among the circular ridge lines 82a and 82b. In addition, the hole/projection surface extraction unit 16d determines whether or not the direction of the created vector V14 and the direction of the normal vector V12 of the hole/projection surface extraction-use reference plane surface 65 coincide with each other.

The hole/projection surface extraction unit 16d determines that the direction of the created vector V14 and the direction of the normal vector V12 of the hole/projection surface extraction-use reference plane surface 65 do not coincide with each other. Next, the hole/projection surface extraction unit 16d determines whether or not the direction of the created vector V14 and the opposite direction of the normal vector V12 of the hole/projection surface extraction-use reference plane surface 65 coincide with each other. The hole/projection surface extraction unit 16d determines that the direction of the created vector V14 and the opposite direction of the normal vector V12 of the hole/projection surface extraction-use reference plane surface 65 coincide with each other. Accordingly, the hole/projection surface extraction unit 16d determines that the circular cone surface 81 is a surface forming a hole shape.

FIG. 15B illustrates a circular cone surface 83 (circular cone surface B) embodied by the circular-shape-related surface information format 44 that includes a ridge line having the same ID as that of the hole/projection surface extraction-use circular ridge line 67b and is extracted by the hole/projection surface extraction unit 16d. Here, it is assumed that the ID of the hole/projection surface extraction-use circular ridge line 67b and the ID of a circular ridge line 84 coincide with each other.

When the newly extracted circular-shape-related surface information format is a circular cone surface B, the hole/projection surface extraction unit 16d determines whether or not the direction of a vector V15 created so as to be headed form the center of the hole/projection surface extraction-use circular ridge line 67b to the apex 83a of the circular cone surface 83 and the direction of the normal vector V12 of the hole/projection surface extraction-use reference plane surface 65 coincide with each other. The hole/projection surface extraction unit 16d determines that the direction of the created vector V15 and the direction of the normal vector V12 of the hole/projection surface extraction-use reference plane surface 65 do not coincide with each other. Next, the hole/projection surface extraction unit 16d determines whether or not the direction of the created vector V15 and the opposite direction of the normal vector V12 of the hole/projection surface extraction-use reference plane surface 65 coincide with each other. The hole/projection surface extraction unit 16d determines that the direction of the created vector V15 and the opposite direction of the normal vector V12 of the hole/projection surface extraction-use reference plane surface 65 coincide with each other. Accordingly, the hole/projection surface extraction unit 16d determines that the circular cone surface 83 is a surface forming a hole shape.

The hole/projection surface extraction unit 16d repeatedly executes the method illustrated in FIG. 14A to FIG. 15B. In addition, when a circular-shape-related surface information format having a hole/projection surface extraction-use circular ridge line does not exist in the circular-shape-related surface information storage unit 13a, the hole/projection surface extraction unit 16d associates the circular-shape-related surface information formats, extracted using the method illustrated in FIG. 14A to FIG. 15B, with one group. In addition, the associated circular-shape-related surface information formats are stored in the hole/projection surface group information storage unit 17.

In addition, when hole/projection surface extraction-use circular ridge line information exists in the ID list of a ridge line forming a hole/projection, stored in the hole/projection formation ridge line group unit information storage unit 16b (a circular through hole, a through countersink hole, or the like), a hole/projection surface group information format is also created on the basis of a circular-shape-related surface information format extracted using the method illustrated in FIG. 14A to FIG. 15B. In addition, the created hole/projection surface group information format is stored in the hole/projection surface group information storage unit 17.

Figure 16:
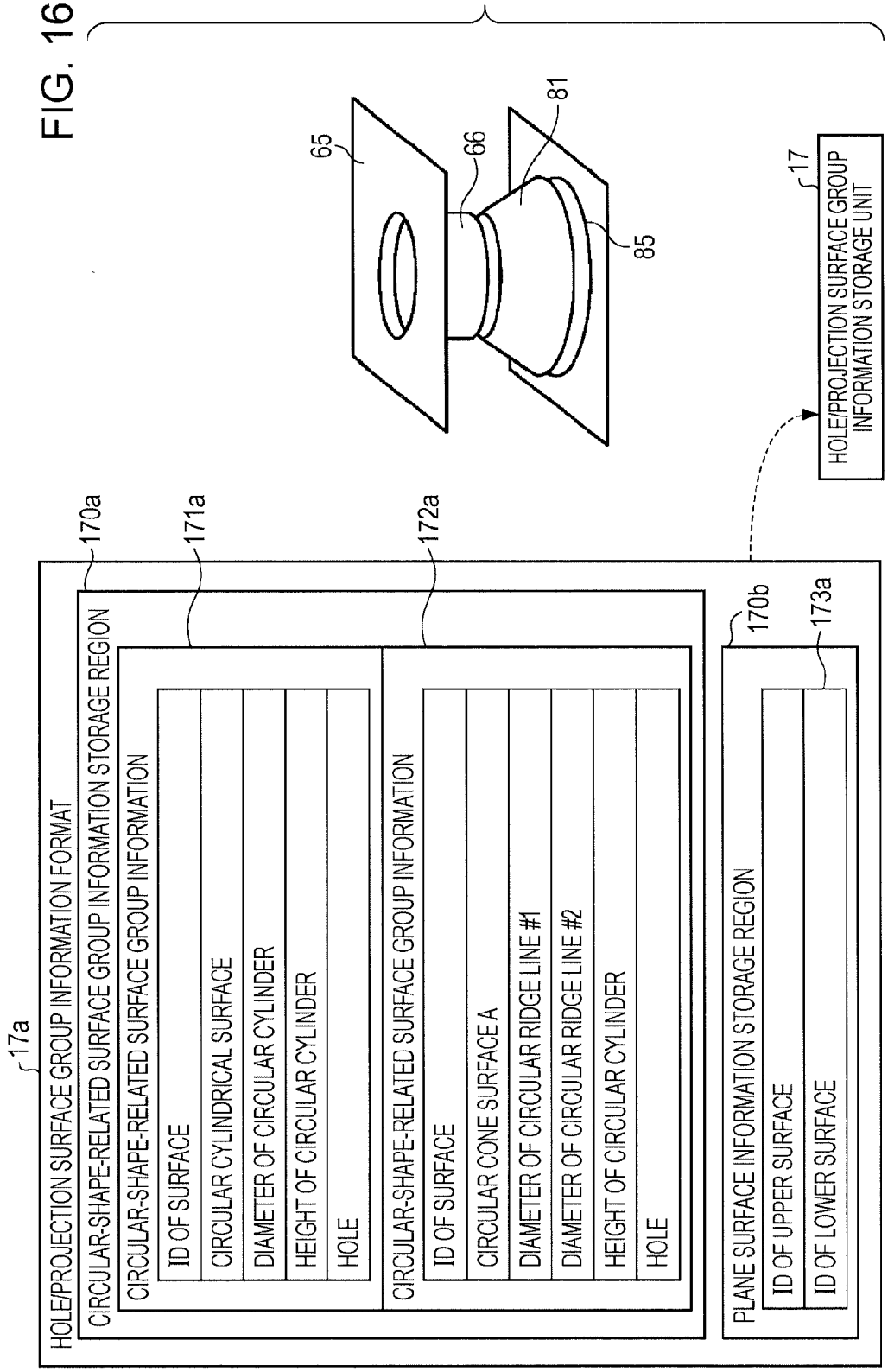
FIG. 16 is a diagram explaining a hole/projection surface group information format.

FIG. 16 is a diagram explaining the hole/projection surface group information format.

A hole/projection surface group information format 17a includes a circular-shape-related surface group information storage region 170a storing therein the information of a circular-shape-related surface group forming a hole/projection and a plane surface information storage region 170b storing therein the information of a plane surface forming a hole/projection.

In the circular-shape-related surface group information storage region 170a, the information (hereinafter, referred to as "circular-shape-related surface group information") of all circular-shape-related surfaces configuring the circular-shape-related surface group is set in the order of extracting the circular-shape-related surfaces. In the circular-shape-related surface group information storage region 170a illustrated in FIG. 16, the circular-shape-related surface group information 171a of the circular cylindrical surface 66 and the circular-shape-related surface group information 172a of the circular cone surface 81 (circular cone surface A) are set. The circular-shape-related surface group information 171a includes pieces of information such as the ID of the circular cylindrical surface 66, "circular cylindrical surface" indicating the kind of a surface, the diameter of a circular cylinder, the height of the circular cylinder, and "hole" indicating that the circular cylindrical surface 66 is a hole. In addition, the circular-shape-related surface group information 172a includes pieces of information such as the ID of the circular cone surface 81, "circular cone surface A" indicating the kind of a surface, the diameter of a circle formed by the circular ridge line 82a, the diameter of a circle formed by the circular ridge line 82b, and "hole" indicating that the circular cone surface 81 is a hole. In addition, when, as in the case of a circular plane surface or the like, it is hard to determine whether it is a hole or a projection, "unnecessity" is set in a column indicating a hole or a projection.

In the plane surface information storage region 170b, all pieces of plane surface information configuring the circular-shape-related surface group are set. Plane surface information 173a illustrated in FIG. 16 includes the ID of the hole/projection surface extraction-use reference plane surface 65 and the ID of a surface 85 to be the end edge of the hole. In addition, when, as in the case of a blind hole, a dimple, or the like, a lower plane surface does not exist, "absence" is set.

<Processing Operation 2>

As described above, when a ridge line included in the hole/projection formation ridge line group unit information stored in the hole/projection formation ridge line group unit information storage unit 16b is formed by the plural circular arcs and the plural circular straight lines, the hole/projection surface extraction unit 16d executes the following Processing Operation 2-1 to Processing Operation 2-8.

<Processing Operation 2-1>

The hole/projection surface extraction unit 16d determines that hole/projection formation ridge line group unit information including the ID list of ridge lines satisfying all of the following (Condition 1) to (Condition 5) is hole/projection formation ridge line group unit information relating to the ridge line of an ellipse shape or a R (circular arc radius)-assigned polygonal shape.

(Condition 1) The number of circular arcs and the number of straight lines, identified by the ID list of the ridge lines of the hole/projection formation ridge line group unit information, are the same. (Condition 2) The radii of all circular arcs are the same and the central angles thereof are the same. (Condition 3) Ridge lines connecting to the starting point and the ending point of each circular arc are straight lines. (Condition 4) A circular arc (hereinafter, referred to as a "second circular arc") exists whose starting point connects to a straight line connecting to the ending point of another circular arc (hereinafter, referred to as a "first circular arc"). (Condition 5) The directions of a vector at the ending point of the first circular arc, a vector at the starting point of the second circular arc, and a vector headed from the ending point of the first circular arc to the starting point of the second circular arc coincide with one another. In addition, vectors at the starting point and the ending point of a circular arc are acquired using the function of the 3D CAD.

Hereinafter, the ID list of the ridge lines of an ellipse shape or an R-assigned polygonal shape is referred to as an initial ridge line ID list.

Figure 17:
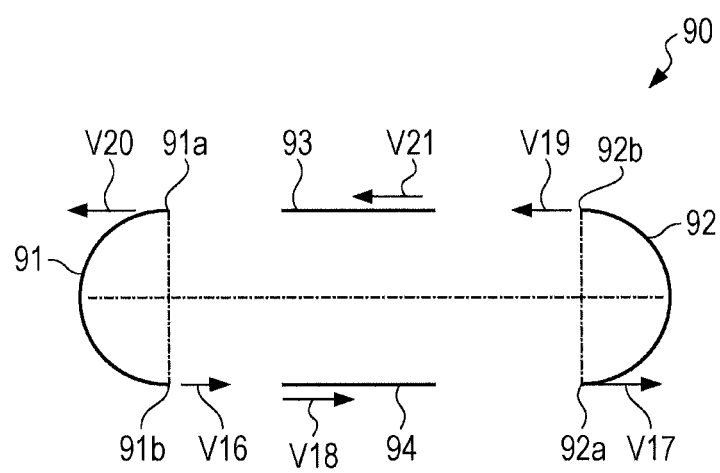
FIG. 17 is a diagram explaining a determination method for an initial ridge line ID list.
Figure 18:
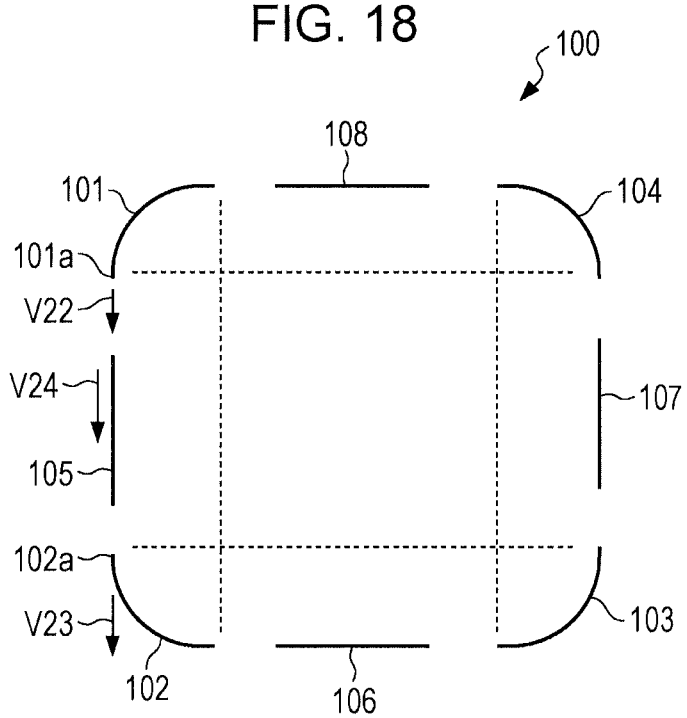
FIG. 18 is a diagram explaining a determination method for an initial ridge line ID list.

FIG. 17 and FIG. 18 are diagrams explaining a determination method for the initial ridge line ID list.

A ridge line 90 illustrated in FIG. 17 indicates a ridge line embodied by the ID list of ridge lines included in one hole/projection formation ridge line group included in the hole/projection formation ridge line group unit information. The ridge line 90 forms an ellipse shape. In addition, the ridge line 90 illustrated in FIG. 17 is illustrated by separating the circular arc portion and the straight line portion of the ellipse shape from each other.

The number of the circular arcs of the ridge line 90 is two, and the number of the straight lines of the ridge line 90 is two. Therefore, the above-mentioned Condition 1 is satisfied. In addition, when a circular arc 91 is set as the first circular arc, and a circular arc 92 is set as the second circular arc, the radius of the circular arc 91 and the radius of the circular arc 92 are equal to each other. In addition, the central angle of the circular arc 91 and the central angle of the circular arc 92 are 180 degrees. Accordingly, the above-mentioned Condition 2 is satisfied. In addition, ridge lines 93 and 94 that are straight lines are connected to the starting point 91a and ending point 91b of the circular arc 91, respectively. In addition, ridge lines 94 and 93 that are straight lines are connected to the starting point 92a and ending point 92b of the circular arc 92, respectively.

Accordingly, the above-mentioned Condition 3 is satisfied. In addition, a circular arc 92 exists whose starting point 92a connects to the ridge line 94 connecting to the ending point 91b of the circular arc 91. In addition, a circular arc 91 exists whose starting point 91a connects to the ridge line 93 connecting to the ending point 92b of the circular arc 92. Therefore, the above-mentioned Condition 4 is satisfied. In addition, the directions of a vector V16 at the ending point 91b of the circular arc 91, a vector V17 at the starting point 92a of the circular arc 92, and a vector headed from the ending point 91b of the circular arc 91 to the starting point 92a of the circular arc 92 are the same, and the directions of a vector V19 at the ending point 92b of the circular arc 92, a vector V20 at the starting point 91a of the circular arc 91, and a vector V21 headed from the ending point 92b of the circular arc 92 to the starting point 91a of the circular arc 91 are the same. Therefore, the above-mentioned Condition 5 is satisfied.

A ridge line 100 illustrated in FIG. 18 indicates a ridge line embodied by the ID list of ridge lines included in one hole/projection formation ridge line group included in the hole/projection formation ridge line group unit information. A ridge line 100 forms an R-assigned quadrangular shape. In addition, the ridge line 100 illustrated in FIG. 18 is illustrated by separating the circular arc portion and the straight line portion of the quadrangular shape from each other.

The number of the circular arcs of the ridge line 100 is four, and the number of the straight lines of the ridge line 100 is four. Therefore, the above-mentioned Condition 1 is satisfied. In addition, the radii of circular arcs 101, 102, 103, and 104 are equal to one another. In addition, the central angles of the circular arcs 101, 102, 103, and 104 are 90 degrees and equal to one another. Accordingly, the above-mentioned Condition 2 is satisfied. In addition, ridge lines that are straight lines are connected to the starting point and the ending point of each of the circular arcs 101, 102, 103, and 104. Accordingly, the above-mentioned Condition 3 is satisfied. In addition, when the circular arc 101 is set as the first circular arc, and the circular arc 102 is set as the second circular arc, the circular arc 102 exists where a straight line 105 connecting to the ending point 101a of the circular arc 101 connects to the starting point of a circular arc other than the ending point 101a of the circular arc 101. In addition, a relationship between the circular arc 102 and the circular arc 103, a relationship between the circular arc 103 and the circular arc 104, and a relationship between the circular arc 104 and the circular arc 101 are also the same. Accordingly, the above-mentioned Condition 4 is satisfied. In addition, the directions of a vector V22 at the ending point 101a of the circular arc 101, a vector V23 at the starting point 102a of the circular arc 102, and a vector V24 headed from the ending point 101a of the circular arc 101 to the starting point 102a of the circular arc 102 are the same. In addition, a relationship between the circular arc 102 and the circular arc 103, a relationship between the circular arc 103 and the circular arc 104, and a relationship between the circular arc 104 and the circular arc 101 are also the same. Accordingly, the above-mentioned Condition 5 is satisfied.

<Processing Operation 2-2>

The hole/projection surface extraction unit 16d determines that hole/projection formation ridge line group unit information including the ID list of ridge lines satisfying all of the following (Condition 6) and (Condition 7) is hole/projection formation ridge line group unit information relating to the ridge line of a polygonal shape.

(Condition 6) All ridge lines are straight lines. (Condition 7) An angle between two vectors individually created so as to be headed form each intersection point to other end points different from the point of intersection between two straight lines connecting to the intersection point coincides with (180 degrees−360 degrees÷the number of ridge lines). In addition, it may be possible to obtain the angle by utilizing the inner product of vectors. In addition, the hole/projection surface extraction unit 16d compares the length of each straight line, and when the lengths of all straight lines are the same, the hole/projection surface extraction unit 16d determines that the hole/projection formation ridge line group unit information including the ID list of ridge lines satisfying all of the (Condition 6) and the (Condition 7) is hole/projection formation ridge line group unit information relating to the ridge lines of a regular polygon.

Figure 19:
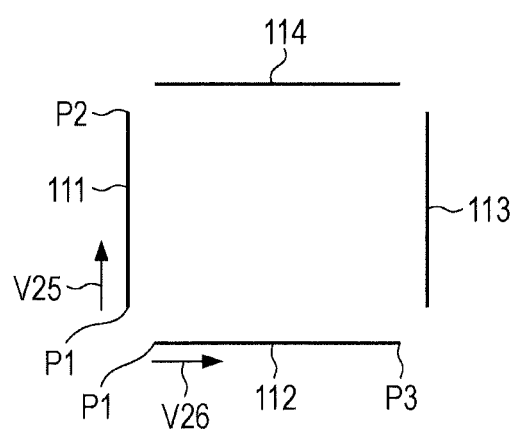
FIG. 19 is a diagram explaining hole/projection formation ridge line group unit information relating to a quadrangle-shaped ridge line.

FIG. 19 is a diagram explaining hole/projection formation ridge line group unit information relating to a quadrangle-shaped ridge line.

Ridge lines 111 to 114 illustrated in FIG. 19 indicate ridge lines embodied by the ID list of ridge lines included in one hole/projection formation ridge line group included in the hole/projection formation ridge line group unit information.

All ridge lines 111 to 114 are straight lines. Therefore, the above-mentioned Condition 6 is satisfied. In addition, an angle between a vector V25 and a vector V26 is 90 degrees (=180 degrees−360 degrees÷4), the vector V25 being headed from a point P1 at the intersection of the ridge line 111 with the ridge line 112 to the end point P2 of the ridge line 111, different from the intersection point P1, the vector V26 being headed from a point P1 at the intersection of the ridge line 112 with the ridge line 111 to the end point P3 of the ridge line 112, different from the intersection point P1. Therefore, the above-mentioned Condition 7 is satisfied.

<Processing Operation 2-3: Extraction of Circular-Shape-Related Surface and Plane Surface>

The hole/projection surface extraction unit 16d extracts, from the circular-shape-related surface information storage unit 13a, the circular-shape-related surface information format of a ridge line having an ID that coincides with the ID of a circular arc ridge line included in the hole/projection formation ridge line group unit information satisfying the conditions of the Processing Operation 2-1. In addition, the hole/projection surface extraction unit 16d extracts, from the outer shape-only plane surface information storage unit 16c, the plane surface detailed information format of a ridge line having an ID that coincides with the ID of a linear ridge line within the ID list of ridge lines included in the hole/projection formation ridge line group unit information satisfying the conditions of the Processing Operation 2-1.

Figure 20A:
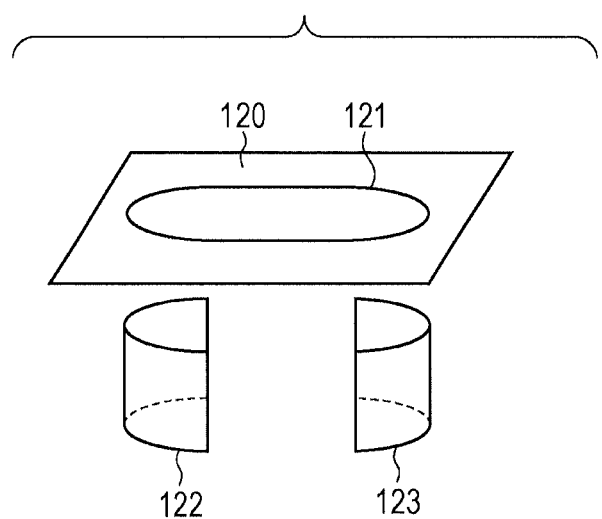
FIGS. 20A and 20B are diagrams explaining the extraction of a circular-shape-related surface having a circular arc ridge line within an ID list of a ridge line.
Figure 20B:
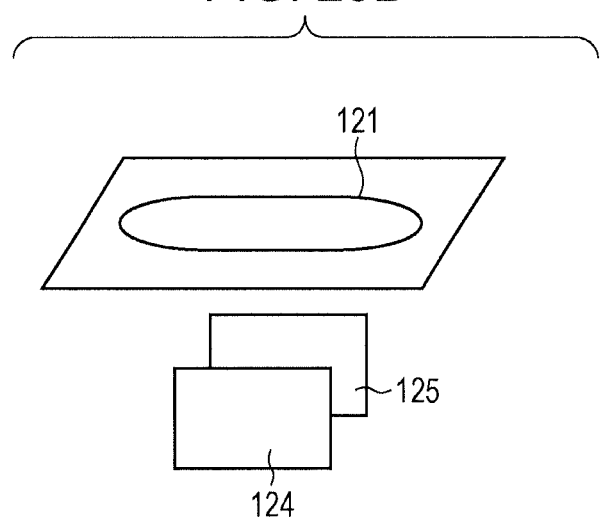

FIGS. 20A and 20B are diagrams explaining the extraction of a circular-shape-related surface having a circular arc ridge line within the ID list of ridge lines.

A ridge line 121 illustrated in FIG. 20A indicates a ridge line embodied by the ID list of ridge lines included in the hole/projection formation ridge line group unit information satisfying the conditions of the Processing Operation 2-1. A plane surface 120 including the ridge line 121 becomes a hole/projection surface extraction-use reference plane surface. In addition, circular arc surfaces 122 and 123 indicate circular-shape-related surfaces embodied by a circular-shape-related surface information format that has an ID coinciding with the ID of a circular arc within the ID list of ridge lines satisfying the conditions of the Processing Operation 2-1 and is extracted by the hole/projection surface extraction unit 16d.

In addition, plane surfaces 124 and 125 illustrated in FIG. 20B indicate plane surfaces formed only by outer shapes, the plane surfaces being embodied by a plane surface detailed information format that has an ID coinciding with the ID of a linear ridge line within the ID list of ridge lines satisfying the conditions of the Processing Operation 2-1 and is extracted by the hole/projection surface extraction unit 16d.

<Processing Operation 2-4: Calculation of Angle between Normal Vectors of Plane Surfaces>

The hole/projection surface extraction unit 16d calculates an angle between the normal vector of each plane surface extracted in the Processing Operation 2-3 and the normal vector of the hole/projection surface extraction-use reference plane surface. In addition, as the angle, the inner product of vectors is utilized. In addition, the hole/projection surface extraction unit 16d checks each calculated angle.

FIG. 21 is a diagram explaining the check of an angle between the hole/projection surface extraction-use reference plane surface and an extracted plane surface.

Plane surfaces 131, 132, 133, and 134 illustrated in FIG. 21 indicate plane surfaces that are formed only by outer shapes and embodied by a plane surface detailed information format extracted from the outer shape-only plane surface information storage unit 16c. In addition, a hole/projection surface extraction-use reference plane surface 135 indicates a plane surface including a ridge line embodied by the ID list of ridge lines included in the hole/projection formation ridge line group unit information satisfying the conditions of the Processing Operation 2-2. Angles between the normal vectors V31, V32, V33, and V34 of the plane surfaces 131, 132, 133, and 134 and the normal vector V35 of the hole/projection surface extraction-use reference plane surface 135 are 90 degrees, respectively.

<Processing Operation 2-5: Identification of Ridge Line of Hole/Projection in Depth or Height direction>

By extracting an overlapping (common among surfaces) ridge line from among all linear ridge lines of each surface (a circular-shape-related surface or a plane surface) extracted in the Processing Operation 2-3, the hole/projection surface extraction unit 16d identifies the ridge lines of a hole/projection in a depth direction and a height direction. In addition, the hole/projection surface extraction unit 16d checks the length of the extracted ridge line.

Figure 22A:
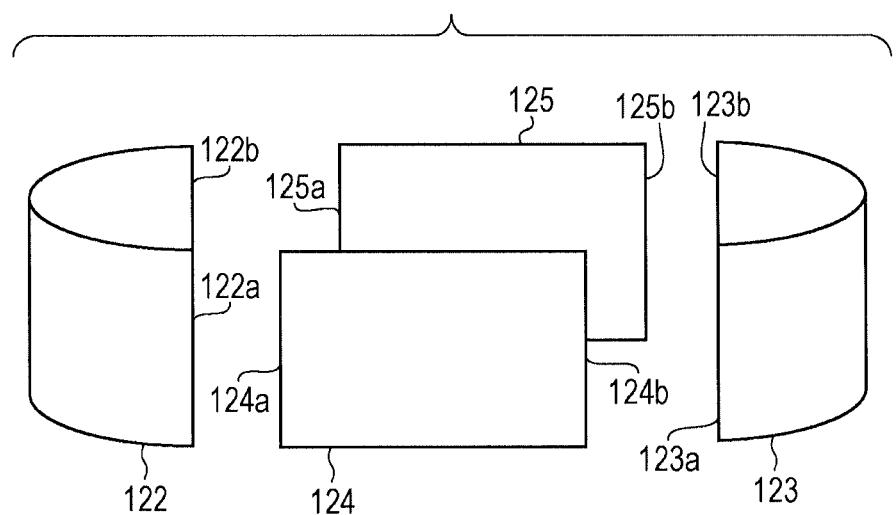
FIGS. 22A and 22B are diagrams explaining the extraction of ridge lines overlapping between extracted surfaces and the check of the lengths of overlapping ridge lines.
Figure 22B:
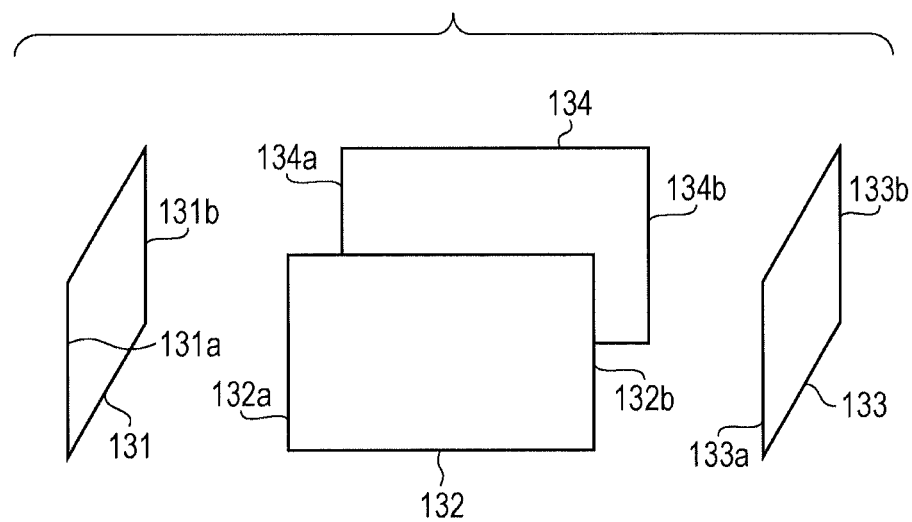

FIGS. 22A and 22B are diagrams explaining the extraction of ridge lines overlapping between extracted surfaces and the check of the lengths of overlapping ridge lines.

FIG. 22A graphically illustrates the circular arc surfaces (circular-shape-related surfaces) 122 and 123 and the plane surfaces 124 and 125, extracted in the Processing Operation 2-3.

The hole/projection surface extraction unit 16d extracts, as overlapping ridge lines, the linear ridge line 122a of the circular arc surface 122, located on the near side of the plane of paper, and the linear ridge line 124a of the plane surface 124. The hole/projection surface extraction unit 16d extracts the linear ridge line 122b of the circular arc surface 122, located on the far side of the plane of paper, and the linear ridge line 125a of the plane surface 125. The hole/projection surface extraction unit 16d extracts the linear ridge line 123a of the circular arc surface 123, located on the near side of the plane of paper, and the linear ridge line 124b of the plane surface 124. The hole/projection surface extraction unit 16d extracts the linear ridge line 123b of the circular arc surface 123, located on the near side of the plane of paper, and the linear ridge line 125b of the plane surface 125. The hole/projection surface extraction unit 16d determines that all the lengths of the overlapping ridge lines are the same. In addition, the lengths of the overlapping ridge lines are acquired using the function of the 3D CAD.

In addition, FIG. 22B graphically illustrates the plane surfaces 131, 132, 133, and 134 extracted in the Processing Operation 2-3.

The hole/projection surface extraction unit 16d extracts, as overlapping ridge lines, the linear ridge line 131a of the plane surface 131, located on the near side of the plane of paper, and the linear ridge line 132*a* of the plane surface 132. The hole/projection surface extraction unit 16*d* extracts the linear ridge line 131*b* of the plane surface 131, located on the far side of the plane of paper, and the linear ridge line 134*a* of the plane surface 134. The hole/projection surface extraction unit 16*d* extracts the linear ridge line 133*a* of the plane surface 133, located on the near side of the plane of paper, and the linear ridge line 132*b* of the plane surface 132. The hole/projection surface extraction unit 16*d* extracts the linear ridge line 133*b* of the plane surface 133, located on the near side of the plane of paper, and the linear ridge line 134*b* of the plane surface 134. The hole/projection surface extraction unit 16*d* determines that all the lengths of the overlapping ridge lines are the same.

<Processing Operation 2-6>

By excluding the initial ridge line ID list of the Processing Operation 2-1 and the overlapping ridge lines extracted in the Processing Operation 2-5 from all linear ridge lines of the circular-shape-related surface information format and the plane surface detailed information format, extracted in the Processing Operation 2-3, the hole/projection surface extraction unit 16*d* identifies a candidate of a hole/projection-use ridge line on a surface located on a side opposite to the hole/projection surface extraction-use reference plane surface.

Figure 23:
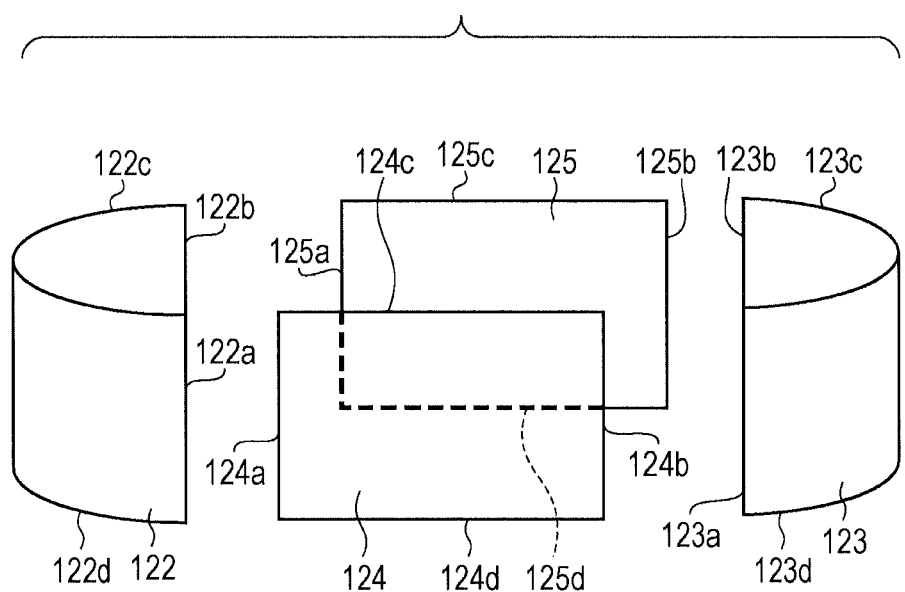
FIG. 23 is a diagram explaining the extraction of a hole/projection-use ridge line on a surface located on a side opposite to a hole/projection surface extraction-use reference plane surface.

FIG. 23 is a diagram explaining the extraction of a hole/projection-use ridge line on a surface located on a side opposite to the hole/projection surface extraction-use reference plane surface.

The hole/projection surface extraction unit 16*d* excludes the initial ridge line 122*c* and linear ridge lines 122*a* and 122*b* of the circular arc surface 122 from the circular-shape-related surface information format of the circular arc surface 122. The hole/projection surface extraction unit 16*d* excludes the initial ridge line 123*c* and linear ridge lines 123*a* and 123*b* of the circular arc surface 123 from the circular-shape-related surface information format of the circular arc surface 123. The hole/projection surface extraction unit 16*d* excludes the initial ridge line 124*c* and linear ridge lines 124*a* and 124*b* of the plane surface 124 from the plane surface detailed information format of the plane surface 124. The hole/projection surface extraction unit 16*d* excludes the initial ridge line 125*c* and linear ridge lines 125*a* and 125*b* of the plane surface 125 from the plane surface detailed information format of the plane surface 125. Owing to this processing, the ID of the ridge line 122*d* remains in the circular-shape-related surface information format of the circular arc surface 122. The ID of the ridge line 123*d* remains in the circular-shape-related surface information format of the circular arc surface 123. The ID of the linear ridge line 124*d* remains in the plane surface detailed information format of the plane surface 124. The ID of the linear ridge line 125*d* remains in the plane surface detailed information format of the plane surface 125.

<Processing Operation 2-7>

The hole/projection surface extraction unit 16*d* extracts, from the hole/projection formation ridge line group unit information storage unit 16*b* or the outer shape-only plane surface information storage unit 16*c*, a plane surface having the candidate of a hole/projection-use ridge line that is located on a side opposite to the hole/projection surface extraction-use reference plane surface and identified in the Processing Operation 2-6.

Figure 24A:
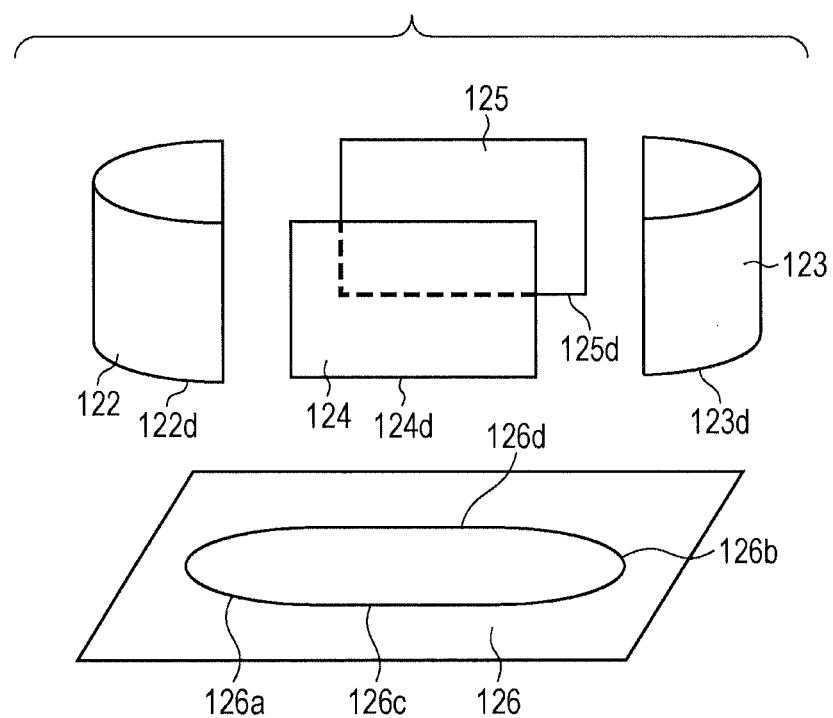
FIGS. 24A and 24B are diagrams explaining the extraction of a plane surface located on a side opposite to a hole/projection surface extraction-use reference plane surface.
Figure 24B:
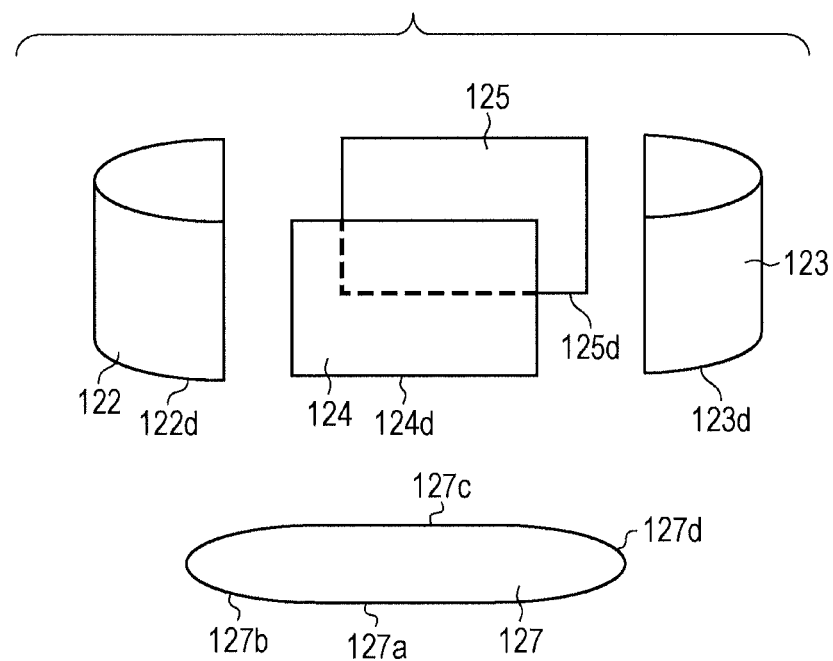

FIGS. 24A and 24B are diagrams explaining the extraction of a plane surface on a side opposite to a hole/projection surface extraction-use reference plane surface.

FIG. 24A illustrates an example of a case in which a plane surface having the candidate of a hole/projection-use ridge line located on a side opposite to the hole/projection surface extraction-use reference plane surface is extracted from the hole/projection formation ridge line group unit information storage unit 16*b*.

The hole/projection surface extraction unit 16*d* identifies hole/projection formation ridge line group unit information including ridge lines 126*a*, 126*b*, 126*c*, and 126*d* that have IDs coinciding with the IDs of the ridge lines 122*d* and 123*d* and the linear ridge lines 124*d* and 125*d* that remain in the circular-shape-related surface information format, respectively. In addition, the hole/projection surface extraction unit 16*d* extracts a plane surface 126 included in the identified hole/projection formation ridge line group unit information.

FIG. 24B illustrates an example of a case in which a plane surface having the candidate of a hole/projection-use ridge line located on a side opposite to the hole/projection surface extraction-use reference plane surface is extracted from the outer shape-only plane surface information storage unit 16*c*.

The hole/projection surface extraction unit 16*d* identifies a plane surface detailed information format including ridge lines 127*a*, 127*b*, 127*c*, and 127*d* that have IDs coinciding with the IDs of the ridge lines 122*d* and 123*d* and the linear ridge lines 124*d* and 125*d* that remain in the circular-shape-related surface information format, respectively. In addition, the hole/projection surface extraction unit 16*d* extracts a plane surface 127 included in the identified plane surface detailed information format.

<Processing Operation 2-8>

On the hole/projection surface extraction-use reference plane surface, the hole/projection surface extraction unit 16*d* calculates an angle between the normal vector of the hole/projection surface extraction-use reference plane surface and a vector created so as to be headed from an arbitrary end point within an initial ridge line ID list to an arbitrary end point within a hole/projection-use ridge line candidate on a surface that is located on a side opposite to the hole/projection surface extraction-use reference plane surface and extracted in the Processing Operation 2-7. When −90 degrees<the angle between the vectors<90 degrees is satisfied, the hole/projection surface extraction unit 16*d* determines that the circular-shape-related surface or plane surface extracted in the Processing Operation 2-3 is a surface forming a projection. In addition, when −90 degrees≥the angle between the vectors≥90 degrees is satisfied, the hole/projection surface extraction unit 16*d* determines that the circular-shape-related surface or plane surface extracted in the Processing Operation 2-3 is a surface forming a hole.

Figure 25:
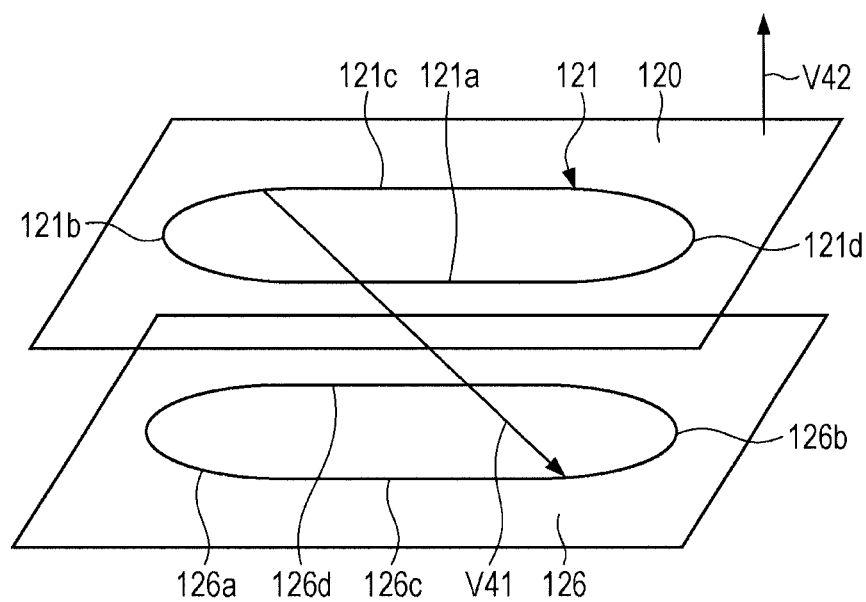
FIG. 25 is a diagram explaining a method determining a hole or a projection.

FIG. 25 is a diagram explaining a method determining a hole or a projection.

On the hole/projection surface extraction-use reference plane surface 120, the hole/projection surface extraction unit 16*d* creates a vector V41 so that the vector V41 is headed from the end point of a ridge line 121*b* embodied by an ID included in the initial ridge line ID list to the end point of a ridge line 126*d* of the surface 126 on a side opposite to the hole/projection surface extraction-use reference plane surface. In addition, the hole/projection surface extraction unit 16*d* calculates an angle between the created vector V41 and the normal vector V42 of the hole/projection surface extraction-use reference plane surface. In response to a calculated result, the hole/projection surface extraction unit 16*d* determines whether the circular arc surfaces 122 and 123 are surfaces forming a surface forming or surfaces forming a hole.

<Processing Operation 2-9>

The hole/projection surface extraction unit 16*d* creates a hole/projection surface group information format in which the surfaces forming a hole/projection, extracted in the Processing Operation 2-1 to the Processing Operation 2-7, are associated with the determination result of the Processing Operation 2-8. In addition, the hole/projection surface extraction unit 16*d* stores (adds) the created hole/projection surface group information format in the hole/projection surface group information storage unit 17.

Figure 26:
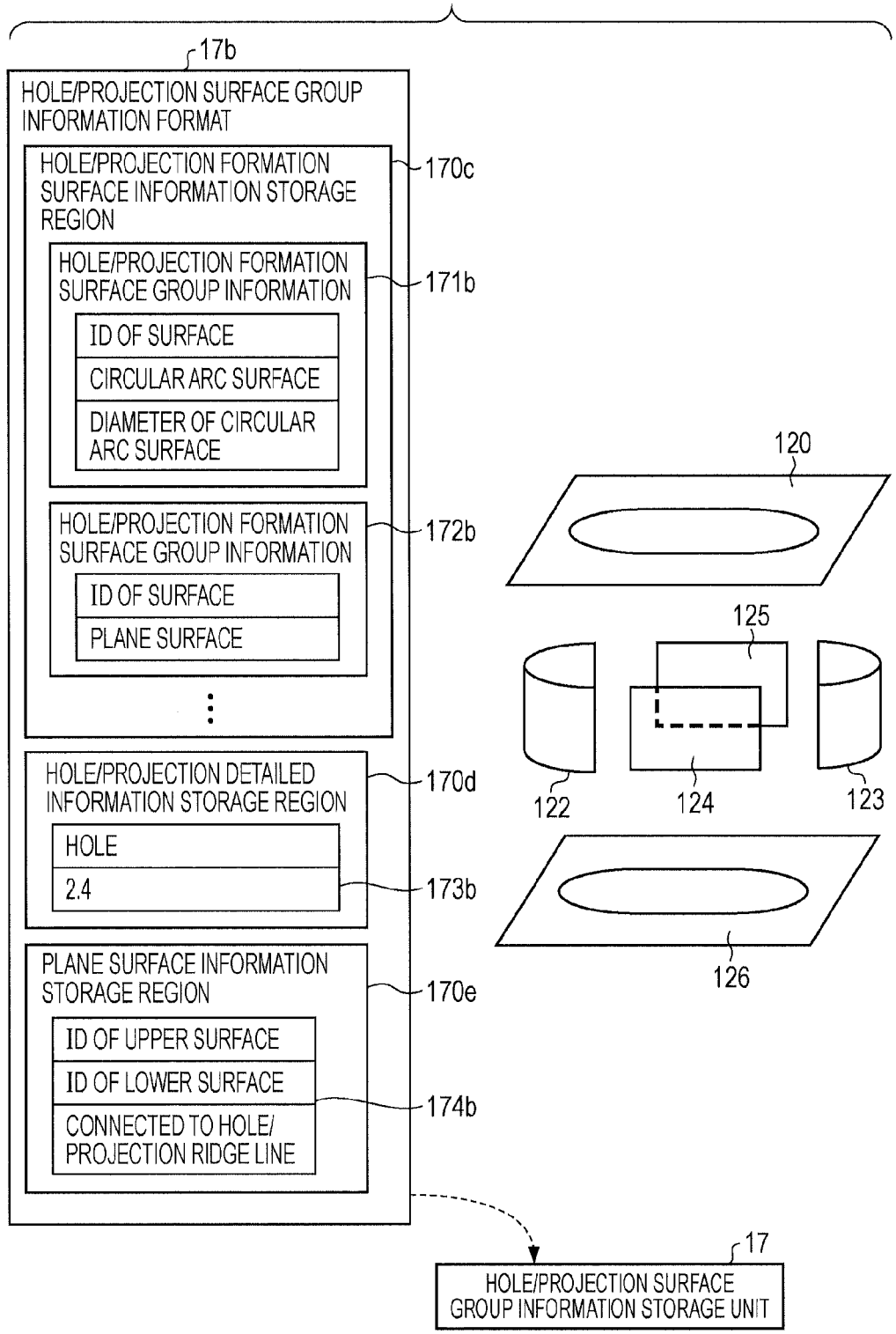
FIG. 26 is a diagram explaining a hole/projection surface group information format.

FIG. 26 is a diagram explaining the hole/projection surface group information format.

A hole/projection surface group information format 17*b* includes a hole/projection formation surface information storage region 170*c*, a hole/projection detailed information storage region 170*d*, and a plane surface information storage region 170*e*.

In the hole/projection formation surface information storage region 170*c*, the information of all circular-shape-related surfaces and all plane surfaces that form a hole/projection surface and is extracted in the Processing Operation 2-3 (hereinafter, referred to as "hole/projection formation surface group information") is set. In the hole/projection formation surface information storage region 170*c* illustrated in FIG. 26, the hole/projection formation surface group information 171*b* of the circular arc surface 122 and the hole/projection formation surface group information 172*b* of the plane surface 124 are set. The hole/projection formation surface group information 171*b* includes pieces of information such as the ID of the circular arc surface 122, "circular arc surface" indicating the kind of a surface, and the diameter of a circular arc surface. In addition, the hole/projection formation surface group information 172*b* includes pieces of information such as the ID of the plane surface 124 and "plane surface" indicating the kind of a surface. In addition, while the hole/projection formation surface group information of the circular arc surface 123 and the plane surface 125 is also set in the same way as the information of the circular arc surface 122 and the plane surface 124, the illustration thereof is omitted owing to limitations of space.

In the hole/projection detailed information storage region 170*d*, the information of a surface forming a projection or a surface forming a hole, determined in the Processing Operation 2-9, and the information of the lengths of the overlapping ridge lines extracted in the Processing Operation 2-5 are set. Hereinafter, these two pieces of information will be collectively referred to as "hole/projection detailed information". The hole/projection detailed information storage region 170*d* illustrated in FIG. 26, hole/projection detailed information 173*b* is set. In this hole/projection detailed information 173*b*, "hole" indicating being a hole, determined in the Processing Operation 2-9, is set. In addition, the length "2.4 (mm)" of the overlapping ridge line extracted in the Processing Operation 2-5 is set.

In the plane surface information storage region 170*e*, information (hereinafter, referred to as "hole/projection plane surface information") relating to the ID of the hole/projection surface extraction-use reference plane surface and a surface on a side opposite to the hole/projection surface extraction-use reference plane surface is set. In the plane surface information storage region 170*e* illustrated in FIG. 26, hole/projection plane surface information 174*b* is set. This hole/projection plane surface information 174*b* includes information that indicates the ID of the hole/projection surface extraction-use reference plane surface 120, the ID of the plane surface 126, and that the plane surface 126 is connected to a ridge line forming a hole/projection. In addition, when a lower surface is a ridge line forming an outer shape, information indicating a connection to the ridge line forming the outer shape is set in the column of the information of the lower surface.

Returning to FIG. 3 again, FIG. 3 will be described.

The hole/projection identification unit 18 includes a hole shape-specific surface configuration database storage unit 18*a* and a hole/projection name identification unit 18*b*.

FIG. 27 is a diagram illustrating information stored in the hole shape-specific surface configuration database storage unit.

In a hole shape-specific surface configuration database 181*a* illustrated in FIG. 27, the surface configuration information of each shape and the dimension information of a surface are described with respect to each hole shape. For example, a clearance hole-M2 (the nominal diameter of a screw) is configured by one circular cylindrical surface whose diameter is 2.4 mm. In addition, a countersink hole-M2 is configured by a circular cylindrical surface where the diameter of a circle is 2.4 mm and a circular cone surface where the diameters of the circles at both end portions thereof are 2.4 mm and 4.8 mm, respectively.

The hole/projection name identification unit 18*b* identifies the kind of a hole/projection from the hole/projection surface group information format stored in the hole/projection formation ridge line group unit information storage unit 16*b* and the information of the hole shape-specific surface configuration database 181*a*. The hole/projection surface group information format 17*a* illustrated in FIG. 16 will be cited as an example. When the diameter of the circular cylinder of the circular-shape-related surface group information 171*a* is 2.4 mm, and the diameters of two circles are 2.4 mm and 4.8 mm, respectively, the two circles being formed by two circular ridge lines of the circular cone surface A of the circular-shape-related surface group information 172*a*, it may be possible to identify that a hole indicated by the hole/projection surface group information format 17*a* is the countersink hole-M2.

In addition, the hole/projection name identification unit 18*b* creates number-of-holes information indicating the number of holes of a 3D model with respect to each kind of hole/projection. The hole/projection information display unit 19 outputs, to the monitor 204*a*, the number-of-holes information created by the hole/projection name identification unit 18*b*.

FIG. 28 is a diagram illustrating an example of the number-of-holes information output by the hole/projection information display unit.

In the column in a horizontal direction of a number-of-holes information management table 19*a* illustrated in FIG. 28, information identifying the kinds of holes/projections and the diameters of holes is set. In addition, in the column in a vertical direction, information identifying 3D models is set. For example, in a portion in which a model A and a clearance hole overlap with each other, "2" is stored. This indicates that the number of clearance holes provided in the model A is two.

Hereinafter, the processing of the design support device 10 described above will be described using flowcharts.

Figure 29:
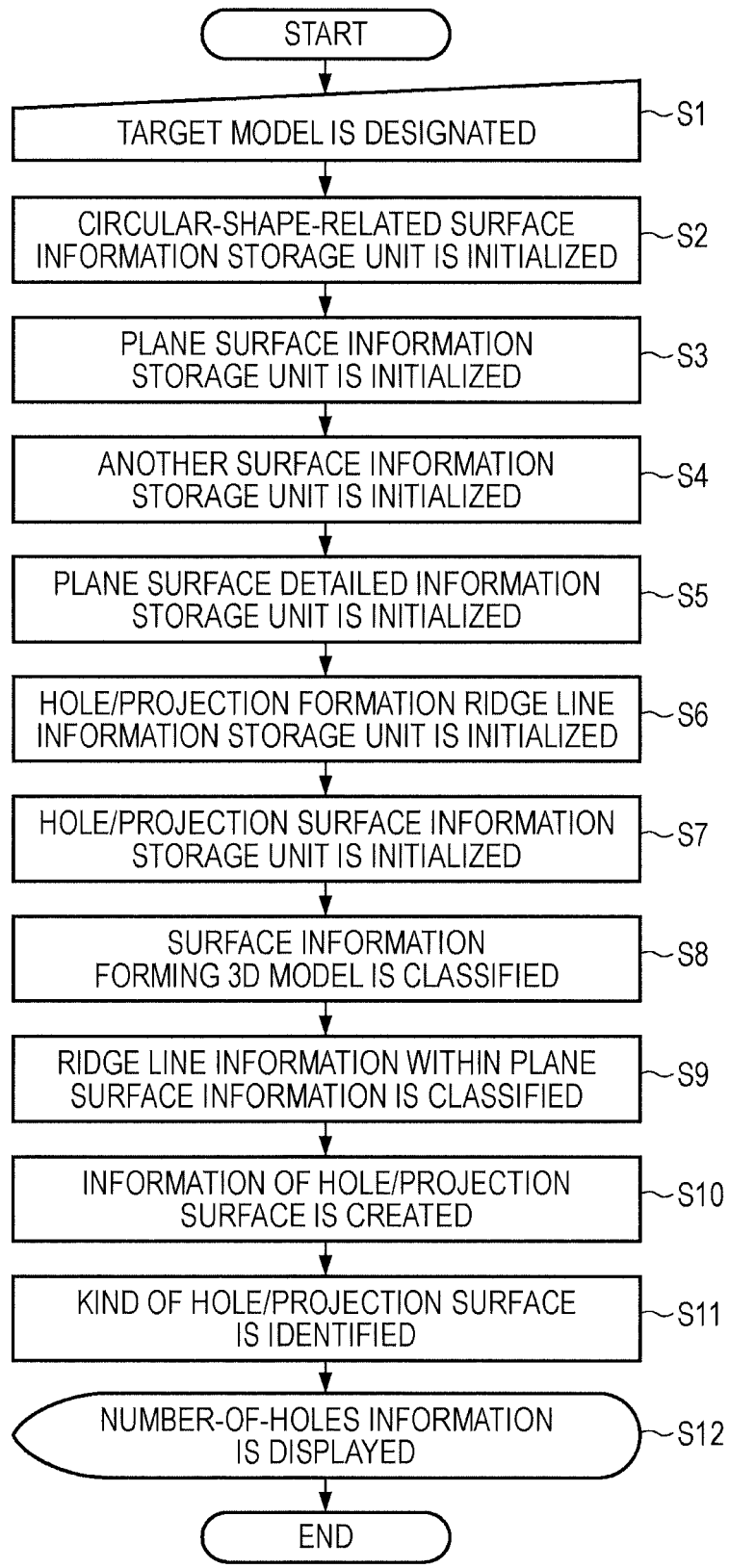
FIG. 29 is a flowchart illustrating entire processing of a design support device.

FIG. 29 is a flowchart illustrating the entire processing of a design support device.

[Step S1] The design support device 10 accepts the designation of a target model performed by a designer. After that, the processing makes a transition to Step S2.

[Step S2] The design support device 10 initializes the circular-shape-related surface information storage unit 13*a*. After that, the processing makes a transition to Step S3.

[Step S3] The design support device 10 initializes the plane surface information storage unit 13b. After that, the processing makes a transition to Step S4.

[Step S4] The design support device 10 initializes the other surface information storage unit 13c. After that, the processing makes a transition to Step S5.

[Step S5] The design support device 10 initializes the plane surface detailed information storage unit 15. After that, the processing makes a transition to Step S6.

[Step S6] The design support device 10 initializes the hole/projection formation ridge line group unit information storage unit 16b. After that, the processing makes a transition to Step S7.

[Step S7] The design support device 10 initializes the hole/projection surface group information storage unit 17. After that, the processing makes a transition to Step S8.

[Step S8] The 3D surface classification unit 12 classifies surface information forming a 3D model into a circular-shape-related surface, a general plane surface, and another surface. After that, the processing makes a transition to Step S9.

[Step S9] The in-plane surface ridge line information classification unit 14 classifies ridge line information within plane surface information. After that, the processing makes a transition to Step S10.

[Step S10] The hole/projection information creation unit 16 creates the information of a hole/projection surface. After that, the processing makes a transition to Step S11.

[Step S11] The hole/projection identification unit 18 identifies the kind of the hole/projection surface. After that, the processing makes a transition to Step S12.

[Step S12] The hole/projection information display unit 19 causes the monitor 204a to display number-of-holes information. After that, the processing illustrated in FIG. 29 is terminated.

This is the end of the description of the processing illustrated in FIG. 29. In addition, the order of the processing operations performed in Steps S2 to S7 is not limited to the example illustrated in the drawing.

Figure 30:
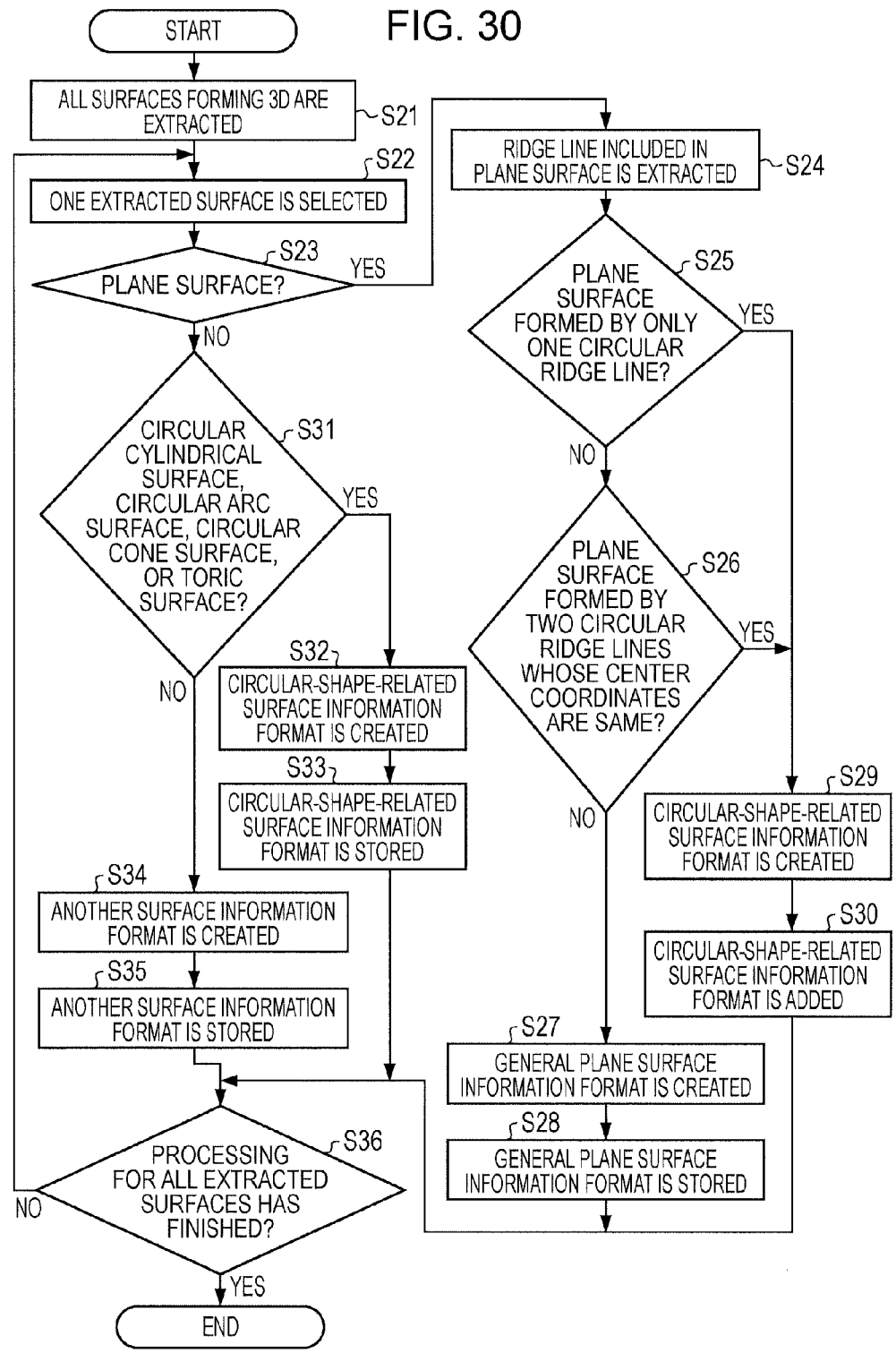
FIG. 30 is a flowchart illustrating processing of a 3D surface classification unit.

FIG. 30 is a flowchart illustrating the processing of a 3D surface classification unit.

[Step S21] The 3D surface extraction unit 12a extracts all surfaces forming 3D from a 3D model. After that, the processing makes a transition to Step S22.

[Step S22] The surface shape classification unit 12b selects one surface extracted in Step S21. After that, the processing makes a transition to Step S23.

[Step S23] The surface shape classification unit 12b determines whether or not the surface selected in Step S22 is a plane surface. When it is determined that the surface selected in Step S22 is a plane surface (Step S23: Yes), the processing makes a transition to Step S24. When it is determined that the surface selected in Step S22 is not a plane surface (Step S23: No), the processing makes a transition to Step S31.

[Step S24] The surface shape classification unit 12b extracts a ridge line included in the plane surface selected in Step S22. After that, the processing makes a transition to Step S25.

[Step S25] The surface shape classification unit 12b determines whether or not the surface extracted in Step S24 is a plane surface formed by only one circular ridge line, namely, is a circular plane surface. When it is determined that the surface extracted in Step S24 is a circular plane surface (Step S25: Yes), the processing makes a transition to Step S29. When it is determined that the surface extracted in Step S24 is not a circular plane surface (Step S25: No), the processing makes a transition to Step S26.

[Step S26] The surface shape classification unit 12b determines whether or not the surface extracted in Step S24 is a plane surface formed by two circular ridge lines whose center coordinates are the same, namely, is a doughnut-shaped plane surface. When it is determined that the surface extracted in Step S24 is a doughnut-shaped plane surface (Step S26: Yes), the processing makes a transition to Step S29. When it is determined that the surface extracted in Step S24 is not a doughnut-shaped plane surface (Step S26: No), the processing makes a transition to Step S27.

[Step S27] The surface information creation unit 12c creates a general plane surface list with respect to the surface selected in Step S22. After that, the processing makes a transition to Step S28.

[Step S28] The surface information creation unit 12c stores the general plane surface list created in Step S27 in the plane surface information storage unit 13b. After that, the processing makes a transition to Step S36.

[Step S29] The surface information creation unit 12c creates a circular-shape-related surface list with respect to the surface selected in Step S22. After that, the processing makes a transition to Step S30.

[Step S30] The surface information creation unit 12c stores the circular-shape-related surface list created in Step S26 in the circular-shape-related surface information storage unit 13a. After that, the processing makes a transition to Step S36.

[Step S31] The surface shape classification unit 12b determines whether or not the surface in selected in Step S22 is one of a circular cylindrical surface, a circular arc surface, a circular cone surface, and a toric surface. When it is determined that the surface in selected in Step S22 is one of a circular cylindrical surface, a circular arc surface, a circular cone surface, and a toric surface (Step S31: Yes), the processing makes a transition to Step S32. When it is determined that the surface in selected in Step S22 corresponds to none of a circular cylindrical surface, a circular arc surface, a circular cone surface, and a toric surface (Step S31: No), the processing makes a transition to Step S34.

[Step S32] The surface information creation unit 12c creates a circular-shape-related surface list relating to the surface selected in Step S22. After that, the processing makes a transition to Step S33.

[Step S33] The surface information creation unit 12c stores the circular-shape-related surface list created in Step S32 in the circular-shape-related surface information storage unit 13a. After that, the processing makes a transition to Step S36.

[Step S34] The surface information creation unit 12c creates anther surface list with respect to the surface selected in Step S22. After that, the processing makes a transition to Step S35.

[Step S35] The surface information creation unit 12c stores the other surface list created in Step S34 in the other surface information storage unit 13c. After that, the processing makes a transition to Step S36.

[Step S36] The 3D surface extraction unit 12a determines whether or not the processing operations performed in Steps S23 to S35 have finished with respect to all surfaces extracted in Step S21. When the processing operations performed in Steps S23 to S35 have finished with respect to all surfaces extracted in Step S21 (Step S36: Yes), the processing illustrated in FIG. 30 is terminated. When the processing operations performed in Steps S23 to S35 have not finished with respect to all surfaces extracted in Step S21 (Step S36: No), the processing makes a transition to Step S22 and the processing operations after Step S22 are subsequently performed.

This is the end of the description of the processing illustrated in FIG. 30.

Next, acquisition processing for a region area, performed in the group classification unit 14a, will be described.

Figure 31:
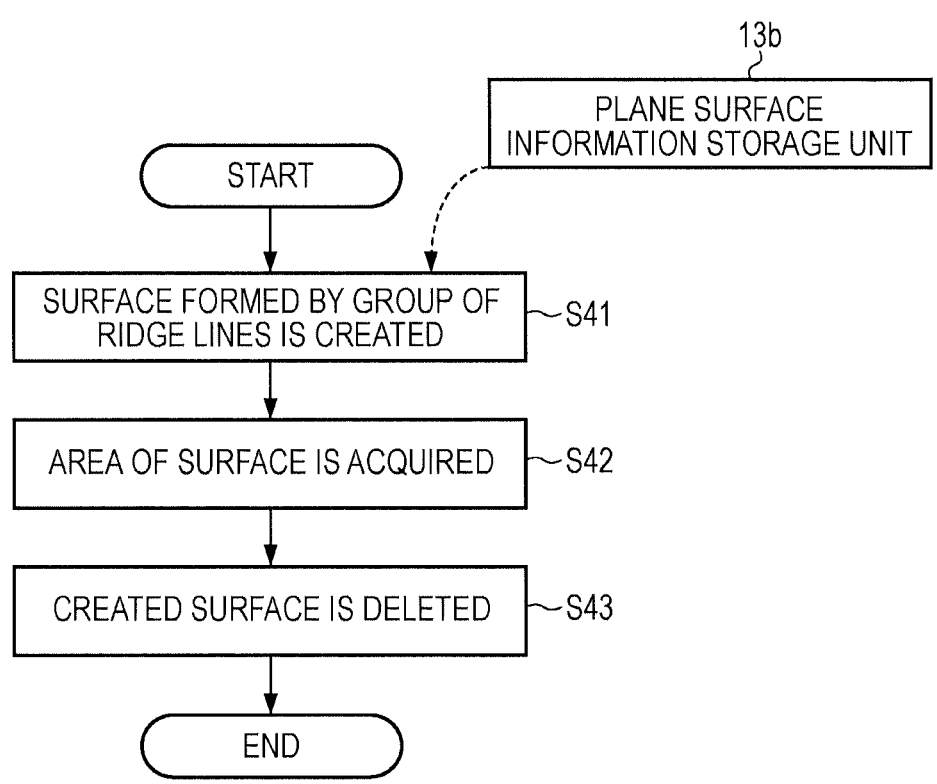
FIG. 31 is a flowchart illustrating acquisition processing for a region area, performed in a group classification unit.

FIG. 31 is a flowchart illustrating acquisition processing for a region area, performed in a group classification unit.

[Step S41] The group classification unit 14a creates a surface formed by the group of ridge lines set in the plane surface information format stored in the plane surface information storage unit 13b. After that, the processing makes a transition to Step S42.

[Step S42] The group classification unit 14a acquires the area of the surface created in Step S41. After that, the processing makes a transition to Step S43.

[Step S43] The group classification unit 14a deletes the surface created in Step S41. After that, the processing illustrated in FIG. 31 is terminated.

This is the end of the description of the processing illustrated in FIG. 31.

Next, the processing of the in-plane surface ridge line information classification unit 14 will be described.

Figure 32:
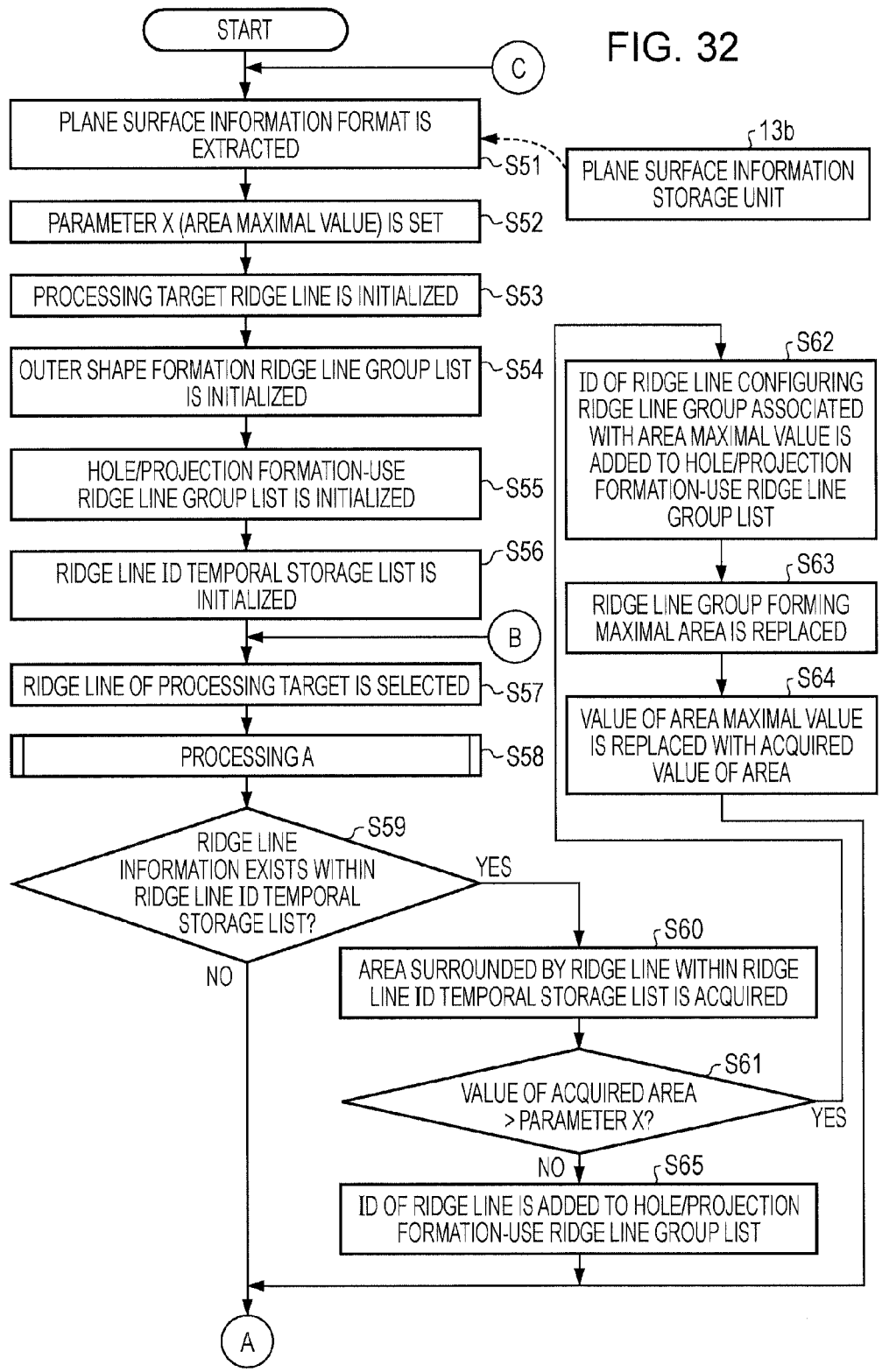
FIG. 32 is a flowchart illustrating processing of an in-plane surface ridge line information classification unit.
Figure 33:
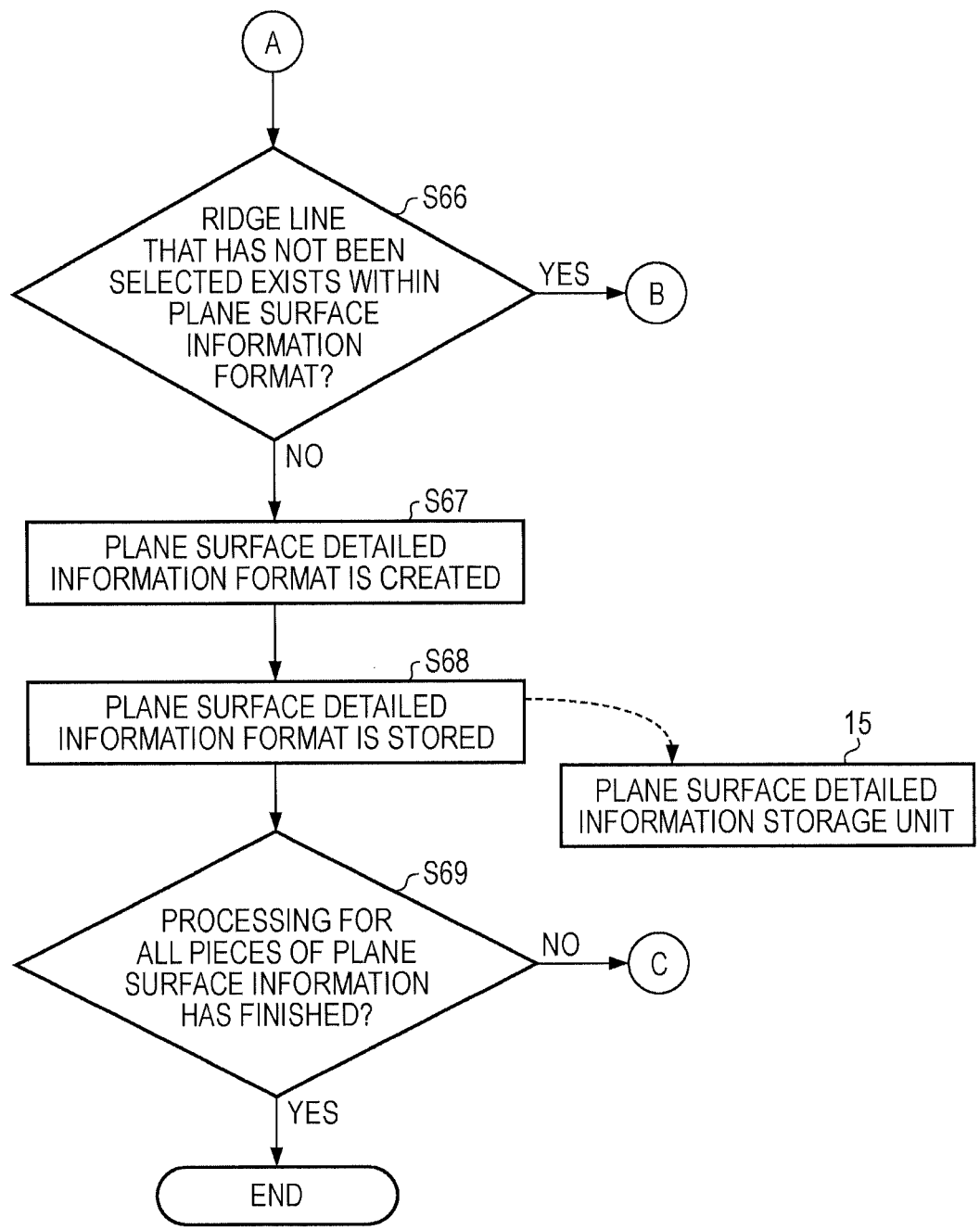
FIG. 33 is a flowchart illustrating processing of the in-plane surface ridge line information classification unit.

FIG. 32 and FIG. 33 are flowcharts illustrating processing of an in-plane surface ridge line information classification unit.

[Step S51] The group classification unit 14a extracts one plane surface information format stored in the plane surface information storage unit 13b. After that, the processing makes a transition to Step S52.

[Step S52] The group classification unit 14a declares parameter X into which an area maximal value is substituted. The initial value of the parameter X is set to "0". After that, the processing makes a transition to Step S53.

[Step S53] The group classification unit 14a initializes the ID list of processing target ridge lines, which temporarily stores the ID of a ridge line of a processing target (hereinafter, referred to as a "processing target ridge line"). After that, the processing makes a transition to Step S54.

[Step S54] The group classification unit 14a initializes an outer shape formation ridge line group list temporarily storing an outer shape formation ridge line group. After that, the processing makes a transition to Step S55.

[Step S55] The group classification unit 14a initializes a hole/projection formation-use ridge line group list temporarily storing a hole/projection formation-use ridge line group. After that, the processing makes a transition to Step S56.

[Step S56] The group classification unit 14a initializes a ridge line ID temporal storage list temporarily storing the ID of a processing target ridge line. After that, the processing makes a transition to Step S57.

[Step S57] The group classification unit 14a sets, as the processing target ridge line, a ridge line identified by the ID of an initial (uppermost) ridge line set in the plane surface detailed information format extracted in Step S51. After that, the processing makes a transition to Step S58.

[Step S58] The group classification unit 14a performs processing A, and creates a ridge line group forming one surrounded region on the basis of ridge lines including the ridge line selected in Step S57. After that, the processing makes a transition to Step S59. In addition, the processing A is processing executing the processing described in FIG. 9. The content of the processing A will be described later in detail.

[Step S59] After performing the processing A, the group classification unit 14a determines whether or not the ID of a ridge line exists in the ridge line ID temporal storage list. When the ID of a ridge line exists in the ridge line ID temporal storage list (Step S59: Yes), the processing makes a transition to Step S60. When the ID of a ridge line does not exist in the ridge line ID temporal storage list (Step S59: No), the processing makes a transition to Step S66.

[Step S60] The group classification unit 14a acquires an area surrounded by a ridge line identified by the ID of a ridge line within the ridge line ID temporal storage list. After that, the processing makes a transition to Step S61.

[Step S61] The group classification unit 14a determines whether or not the value of the area acquired in Step S60 is larger than the parameter X. When the value of the area acquired in Step S60 is larger than the parameter X (Step S61: Yes), the processing makes a transition to Step S62. When the value of the area acquired in Step S60 is less than or equal to the parameter X (Step S61: No), the processing makes a transition to Step S65.

[Step S62] The group classification unit 14a determines that the ID of a ridge line configuring a ridge line group associated with the parameter X corresponds to the hole/projection formation-use ridge line group. In addition, the ID of the ridge line configuring the determined ridge line group is added to the hole/projection formation-use ridge line group list. After that, the processing makes a transition to Step S63.

[Step S63] The group classification unit 14a replaces the ridge line group, associated with the parameter X, with the ridge line group selected in Step S57. Owing to this processing, the ridge line group selected in Step S57 at this time is associated with the ridge line group of the parameter X. After that, the processing makes a transition to Step S64.

[Step S64] The group classification unit 14a replaces the parameter X with the value of the area of the ridge line group selected in Step S57 at this time (acquired in Step S60). After that, the processing makes a transition to Step S66.

[Step S65] The group classification unit 14a determines that the ridge line group obtained in the processing A is the hole/projection formation-use ridge line group. In addition, the ID of a ridge line configuring the hole/projection formation-use ridge line group is added to the hole/projection formation-use ridge line group list. After that, the processing makes a transition to Step S66.

[Step S66] The group classification unit 14a determines whether or not the ID of a ridge line that has not been selected exists within the plane surface information format extracted in Step S51. When the ID of a ridge line that has not been selected exists within the plane surface information format extracted in Step S51 (Step S66: Yes), the processing makes a transition to Step S57, and one ID of a ridge line that has not been selected is selected. In addition, a ridge line identified by the selected ID is set as a processing target, and the processing operations after Step S58 are subsequently performed. When the ID of a ridge line that has not been selected does not exist within the plane surface information format extracted in Step S51 (Step S66: No), the processing makes a transition to Step S67.

[Step S67] The plane surface detailed information creation unit 14b creates a plane surface detailed information format on the basis of the ID of a ridge line configuring a ridge line group, added to the hole/projection formation-use ridge line group list. After that, the processing makes a transition to Step S68.

[Step S68] The plane surface detailed information creation unit 14b stores the plane surface detailed information format created in Step S67 in the plane surface detailed information storage unit 15. After that, the processing makes a transition to Step S69.

[Step S69] The group classification unit 14a determines whether or not the processing operations in Steps S52 to S68 have finished with respect to all plane surface information formats stored in the plane surface information storage unit 13*b*. When the processing operations in Steps S52 to S68 have finished with respect to all plane surface information formats stored in the plane surface information storage unit 13*b* (Step S69: Yes), the processing illustrated in FIG. 32 and FIG. 33 is terminated. When the processing operations in Steps S52 to S68 have not finished with respect to all plane surface information formats stored in the plane surface information storage unit 13*b* (Step S69: No), the processing makes a transition to Step S51, and the processing operations after Step S51 are subsequently performed with respect to an unprocessed plane surface information format.

This is the end of the description of the processing illustrated in FIG. 32 and FIG. 33. Next, the processing A in Step S58 will be described.

Figure 34:
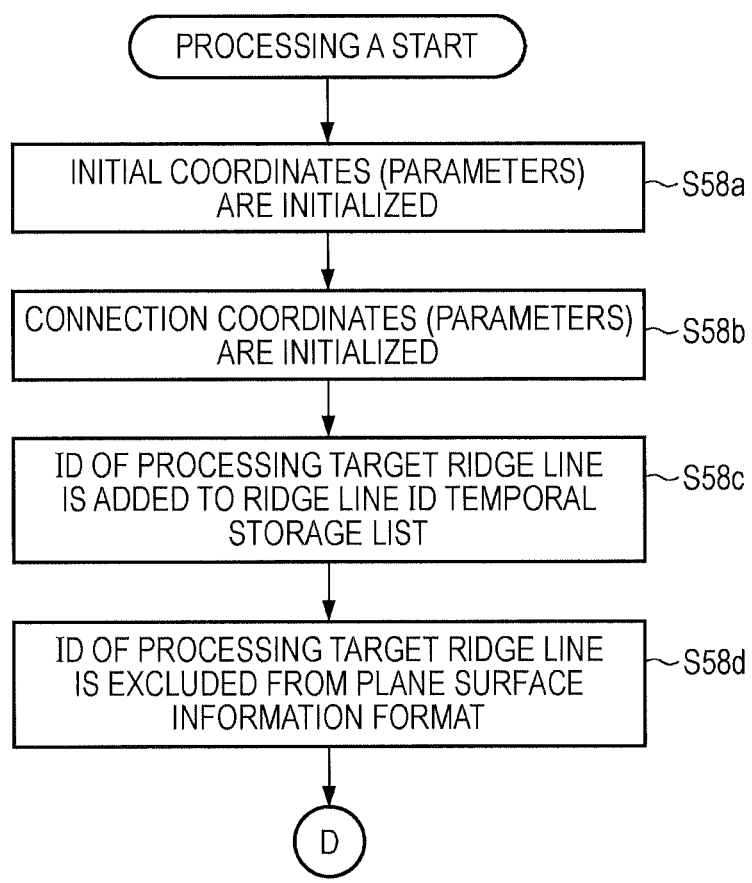
FIG. 34 is a flowchart illustrating processing.
Figure 35:
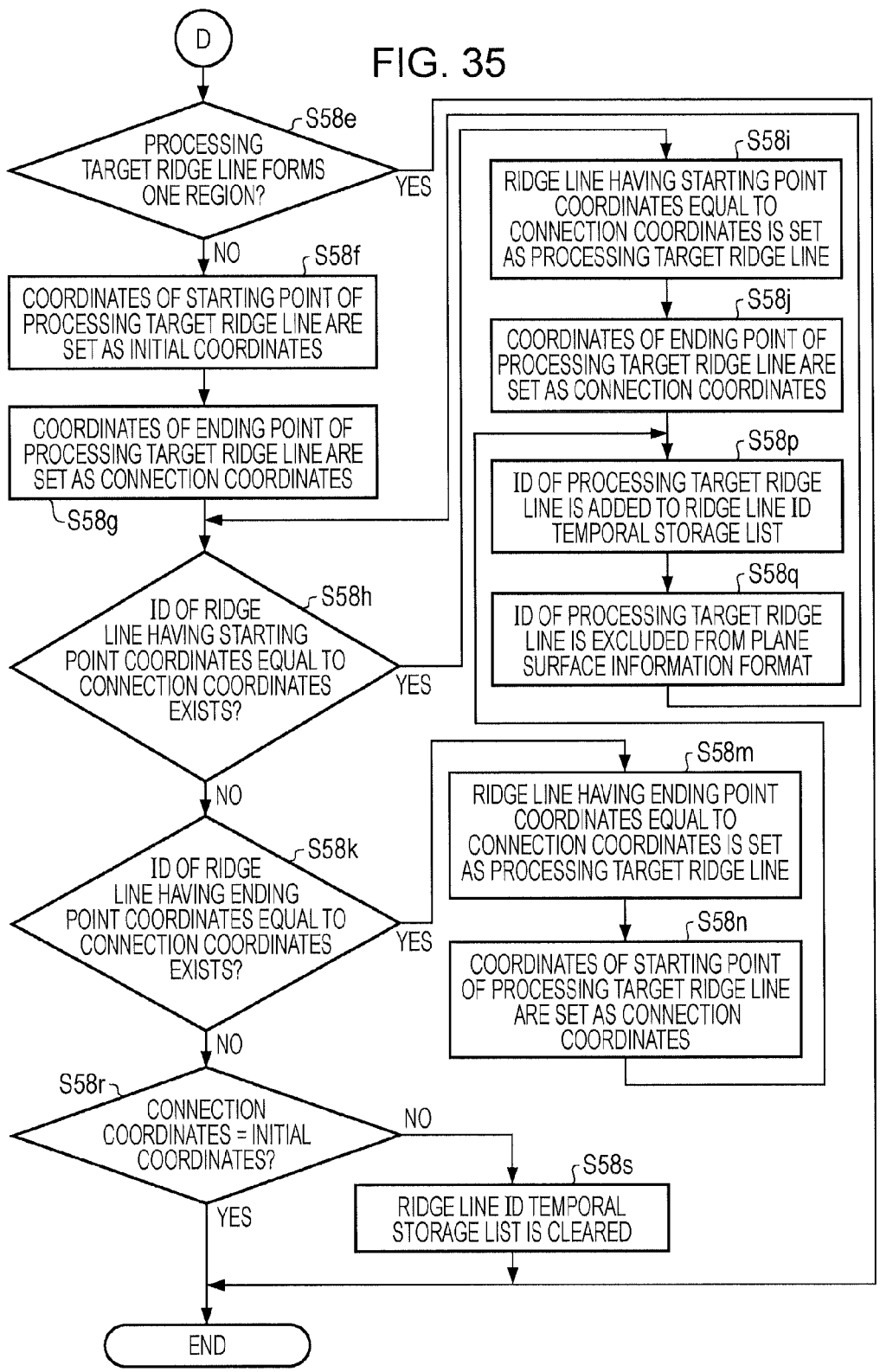
FIG. 35 is a flowchart illustrating the processing.

FIG. 34 and FIG. 35 are flowcharts illustrating the processing A.

[Step S58*a*] The group classification unit 14*a* declares initial coordinates into which the coordinates of a processing target ridge line are substituted. The initial values of the initial coordinates are set to "0". After that, the processing makes a transition to Step S58*b*.

[Step S58*b*] The group classification unit 14*a* declares connection coordinates into which the coordinates of a processing target ridge line are substituted. The initial values of the connection coordinates are set to "0". After that, the processing makes a transition to Step S58*c*.

[Step S58*c*] The group classification unit 14*a* adds the ID of the processing target ridge line to the ridge line ID temporal storage list. After that, the processing makes a transition to Step S58*d*.

[Step S58*d*] The group classification unit 14*a* excludes the ID of the processing target ridge line from the plane surface information format. After that, the processing makes a transition to Step S58*e*.

[Step S58*e*] The group classification unit 14*a* determines whether or not the processing target ridge line is a ridge line forming one region. When the processing target ridge line is a ridge line forming one region (Step S58*e*: Yes), the processing A is terminated. When the processing target ridge line is not a ridge line forming one region (Step S58*e*: No), the processing makes a transition to Step S58*f*.

[Step S58*f*] The group classification unit 14*a* sets, as the initial coordinates, the coordinates of the starting point of the ridge line of the processing target. After that, the processing makes a transition to Step S58*g*.

[Step S58*g*] The group classification unit 14*a* sets, as the connection coordinates, the coordinates of the ending point of the ridge line of the processing target. After that, the processing makes a transition to Step S58*h*.

[Step S58*h*] The group classification unit 14*a* determines whether or not the ID of a ridge line having the starting point coordinates equal to the connection coordinates exists within the plane surface information format extracted in Step S51. When the ID of the ridge line having the starting point coordinates equal to the connection coordinates exists within the plane surface information format extracted in Step S51 (Step S58*h*: Yes), the processing makes a transition to Step S58*i*. When the ID of the ridge line having the starting point coordinates equal to the connection coordinates does not exist within the plane surface information format extracted in Step S51 (Step S58*h*: No), the processing makes a transition to Step S58*k*.

[Step S58*i*] The group classification unit 14*a* sets the ridge line having the starting point coordinates equal to the connection coordinates, as a processing target ridge line. After that, the processing makes a transition to Step S58*j*.

[Step S58*j*] The group classification unit 14*a* sets the ending point coordinates of the processing target ridge line, as the connection coordinates. After that, the processing makes a transition to Step S58*p*.

[Step S58*k*] The group classification unit 14*a* determines whether or not the ID of a ridge line having the ending point coordinates equal to the connection coordinates exists within the plane surface information format extracted in Step S51. When the ID of the ridge line having the ending point coordinates equal to the connection coordinates exists within the plane surface information format extracted in Step S51 (Step S58*k*: Yes), the processing makes a transition to Step S58*m*. When the ID of the ridge line having the ending point coordinates equal to the connection coordinates does not exist within the plane surface information format extracted in Step S51 (Step S58*k*: No), the processing makes a transition to Step S58*r*.

[Step S58*m*] The group classification unit 14*a* sets the ridge line having the ending point coordinates equal to the connection coordinates, as a processing target ridge line. After that, the processing makes a transition to Step S58*n*.

[Step S58*n*] The group classification unit 14*a* sets the starting point coordinates of the processing target ridge line, as the connection coordinates. After that, the processing makes a transition to Step S58*p*.

[Step S58*p*] The group classification unit 14*a* adds the ID of the processing target ridge line to the ridge line ID temporal storage list. After that, the processing makes a transition to Step S58*q*.

[Step S58*q*] The group classification unit 14*a* excludes the ID of the processing target ridge line from the plane surface information format extracted in Step S51. After that, the processing makes a transition to Step S58*h*.

[Step S58*r*] The group classification unit 14*a* determines whether or not the connection coordinates coincide with the initial coordinates. When the connection coordinates coincide with the initial coordinates (Step S58*r*: Yes), the processing A is terminated. When the connection coordinates do not coincide with the initial coordinates (Step S58*r*: No), the processing makes a transition to Step S58*s*.

[Step S58*s*] The group classification unit 14*a* clears the ridge line ID temporal storage list. After that, the processing A is terminated.

This is the end of the description of the processing illustrated in FIG. 34 and FIG. 35.

Figure 36:
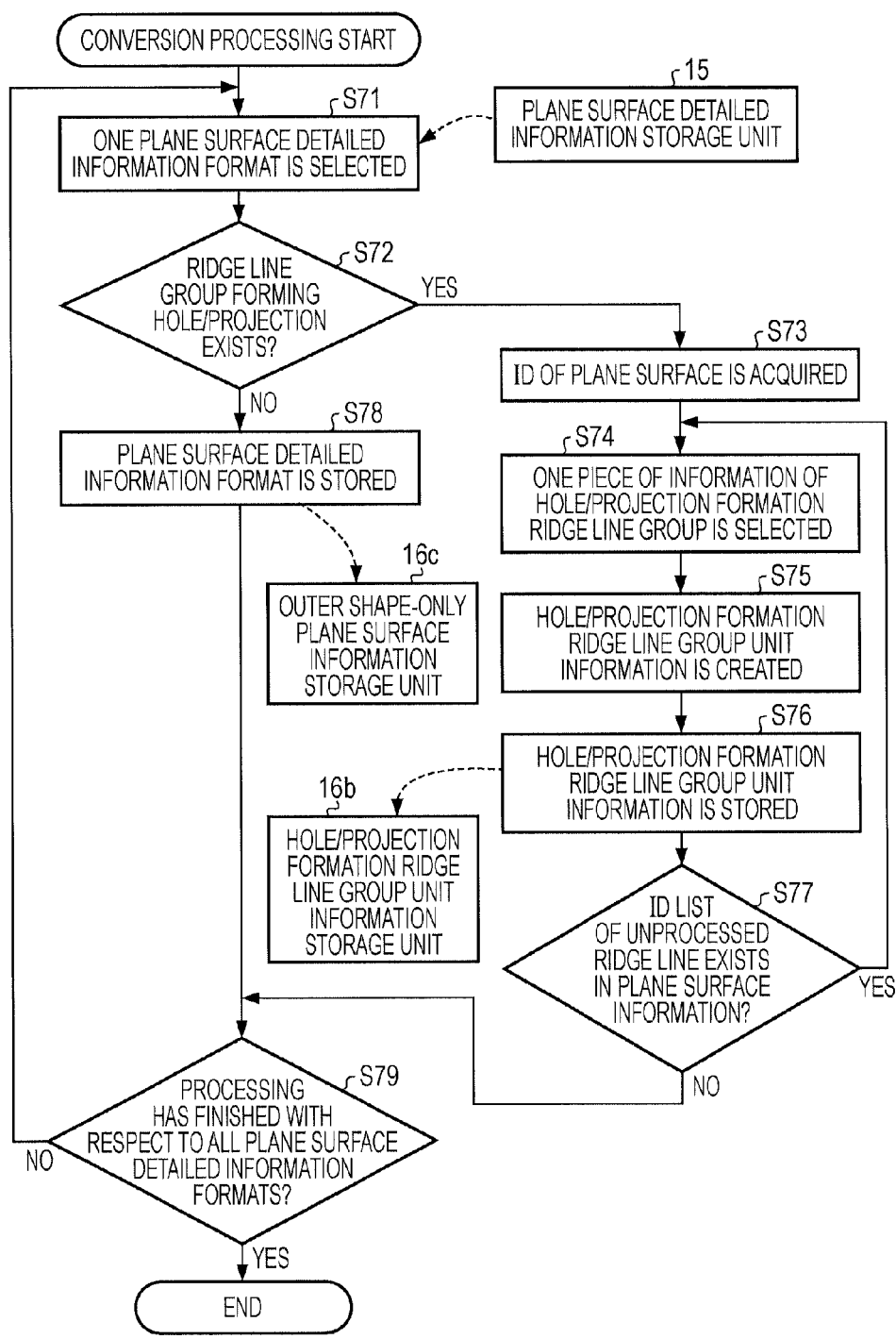
FIG. 36 is a flowchart illustrating processing converting a plane surface information format into a hole/projection formation ridge line group.

FIG. 36 is a flowchart illustrating processing converting a plane surface information format into a hole/projection formation ridge line group.

[Step S71] The hole/projection formation ridge line extraction unit 16*a* selects one plane surface detailed information format stored in the plane surface detailed information storage unit 15. After that, the processing makes a transition to Step S72.

[Step S72] The hole/projection formation ridge line extraction unit 16*a* determines whether or not a hole/projection formation ridge line group exists in the plane surface detailed information format selected in Step S71. When a hole/projection formation ridge line group exists in the plane surface detailed information format selected in Step S71 (Step S72: Yes), the processing makes a transition to Step S73. When a hole/projection formation ridge line group does not exist in the plane surface detailed information format selected in Step S71 (Step S72: No), the processing makes a transition to Step S78.

[Step S73] The hole/projection formation ridge line extraction unit 16a acquires the ID of a plane surface included in the plane surface detailed information format selected in Step S71. After that, the processing makes a transition to Step S74.

[Step S74] The hole/projection formation ridge line extraction unit 16a selects one ID list of a ridge line included in the hole/projection formation ridge line group. After that, the processing makes a transition to Step S75.

[Step S75] The hole/projection formation ridge line extraction unit 16a creates hole/projection formation ridge line group unit information in which the ID list of the ridge line selected in Step S74 is associated with the ID of the plane surface acquired in Step S73. After that, the processing makes a transition to Step S76.

[Step S76] The hole/projection formation ridge line extraction unit 16a stores the hole/projection formation ridge line group unit information created in Step S75, in the hole/projection formation ridge line group unit information storage unit 16b. After that, the processing makes a transition to Step S77.

[Step S77] The hole/projection formation ridge line extraction unit 16a determines whether or not the ID list of an unprocessed ridge line exists in the plane surface detailed information format selected in Step S71. When the ID list of an unprocessed ridge line exists in the plane surface detailed information format selected in Step S71 (Step S77: Yes), the processing makes a transition to Step S74, and the processing operations after Step S74 are subsequently performed. When the ID list of an unprocessed ridge line does not exist in the plane surface detailed information format selected in Step S71 (Step S77: No), the processing makes a transition to Step S79.

[Step S78] The hole/projection formation ridge line extraction unit 16a stores the plane surface detailed information format selected in Step S71, in the outer shape-only plane surface information storage unit 16c. After that, the processing makes a transition to Step S79.

[Step S79] The hole/projection formation ridge line extraction unit 16a determines whether or not the processing operations in Steps S72 to S78 have finished with respect to all plane surface detailed information formats stored in the plane surface detailed information storage unit 15. When the processing operations in Steps S72 to S78 have finished with respect to all plane surface detailed information formats stored in the plane surface detailed information storage unit 15 (Step S79: Yes), the processing illustrated in FIG. 36 is terminated. When the processing operations in Steps S72 to S78 have not finished with respect to all plane surface detailed information formats stored in the plane surface detailed information storage unit 15 (Step S79: No), the processing makes a transition to Step S71, and one plane surface detailed information format that has not been selected is selected. In addition, the processing operations after Step S72 are subsequently performed.

This is the end of the description of the processing illustrated in FIG. 36.

Figure 37:
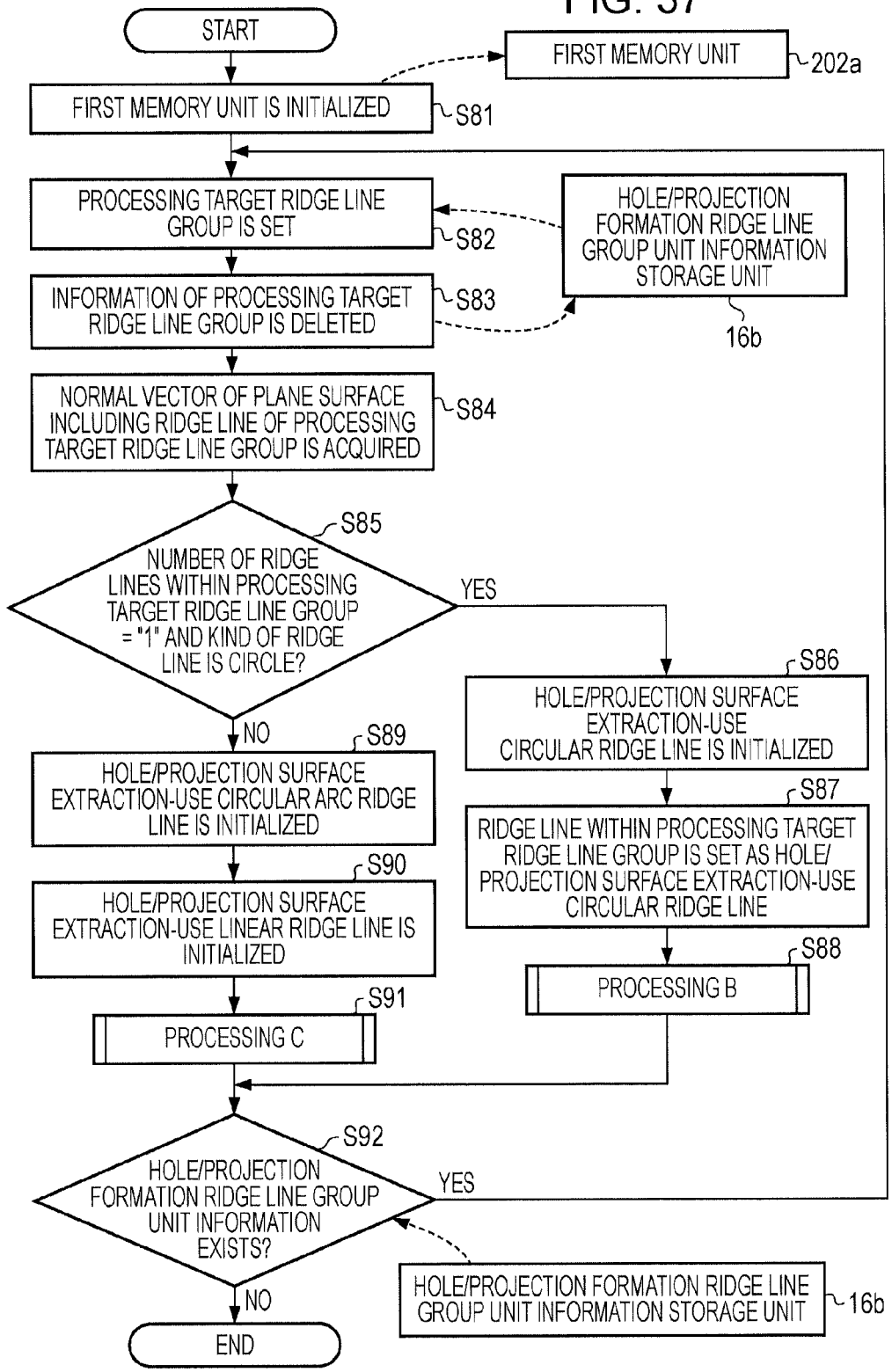
FIG. 37 is a flowchart illustrating processing for extracting surface information forming a hole/projection.

FIG. 37 is a flowchart illustrating processing for extracting surface information forming a hole/projection.

[Step S81] The hole/projection surface extraction unit 16d initializes a first memory unit 202a temporarily storing circular-shape-related surface group information. For example, this first memory unit 202a may be formed using a portion of the storage region of the RAM 202.

[Step S82] The hole/projection surface extraction unit 16d selects one piece of hole/projection formation ridge line group unit information stored in the hole/projection formation ridge line group unit information storage unit 16b. In addition, a hole/projection formation ridge line group included in the selected hole/projection formation ridge line group unit information is set as a processing target ridge line group. After that, the processing makes a transition to Step S83.

[Step S83] The hole/projection surface extraction unit 16d deletes the hole/projection formation ridge line group unit information including the processing target ridge line group set in Step S82, from the hole/projection formation ridge line group unit information storage unit 16b. After that, the processing makes a transition to Step S84.

[Step S84] The hole/projection surface extraction unit 16d acquires the normal vector of a plane surface identified by the ID of a plane surface including a ridge line, the ID being included in the hole/projection formation ridge line group unit information including the processing target ridge line group. After that, the processing makes a transition to Step S85.

[Step S85] On the basis of the hole/projection formation ridge line group unit information including the processing target ridge line group, the hole/projection surface extraction unit 16d determines whether or not the number of ridge lines within the processing target ridge line group is one and the kind of a ridge line is a circle. When the number of ridge lines within the processing target ridge line group is one and the kind of a ridge line is a circle (Step S85: Yes), the processing makes a transition to Step S86. When the number of ridge lines within the processing target ridge line group is not one or the kind of a ridge line is not a circle (Step S85: No), the processing makes a transition to Step S89.

[Step S86] The hole/projection surface extraction unit 16d prepares, as a parameter, a hole/projection surface extraction-use circular ridge line. The initial value of the hole/projection surface extraction-use circular ridge line is set to "0". After that, the processing makes a transition to Step S87.

[Step S87] The hole/projection surface extraction unit 16d sets a ridge line within the processing target ridge line group, as the hole/projection surface extraction-use circular ridge line. After that, the processing makes a transition to Step S88.

[Step S88] The hole/projection surface extraction unit 16d performs processing B. In addition, the processing B is processing described in FIG. 13 to FIG. 16. The content of the processing B will be described later in detail. When the processing B has finished, the processing makes a transition to Step S92.

[Step S89] The hole/projection surface extraction unit 16d prepares, as a parameter, a hole/projection surface extraction-use circular arc ridge line. The initial value of the hole/projection surface extraction-use circular arc ridge line is set to "0". After that, the processing makes a transition to Step S90.

[Step S90] The hole/projection surface extraction unit 16d prepares, as a parameter, a hole/projection surface extraction-use linear ridge line. The initial value of the hole/projection surface extraction-use linear ridge line is set to "0". After that, the processing makes a transition to Step S91.

[Step S91] The hole/projection surface extraction unit 16d performs processing C. In addition, the processing C is processing described in FIG. 17 to FIG. 19. The content of the processing C will be described later in detail. When the processing C has finished, the processing makes a transition to Step S92.

[Step S92] The hole/projection surface extraction unit 16d determines whether or not unprocessed (not subjected to the processing operations in Steps S82 to S91) hole/projection formation ridge line group unit information exists within the hole/projection formation ridge line group unit information storage unit 16b. When the unprocessed hole/projection formation ridge line group unit information exists (Step S92: Yes), the processing makes a transition to Step S82. In addition, the unprocessed hole/projection formation ridge line group unit information is selected, and the processing operations after Step S83 are subsequently performed. When the unprocessed hole/projection formation ridge line group unit information does not exist (Step S92: No), the processing illustrated in FIG. 37 is terminated.

This is the end of the description of the processing illustrated in FIG. 37. Next, the processing B in Step S88 will be described.

Figure 38:
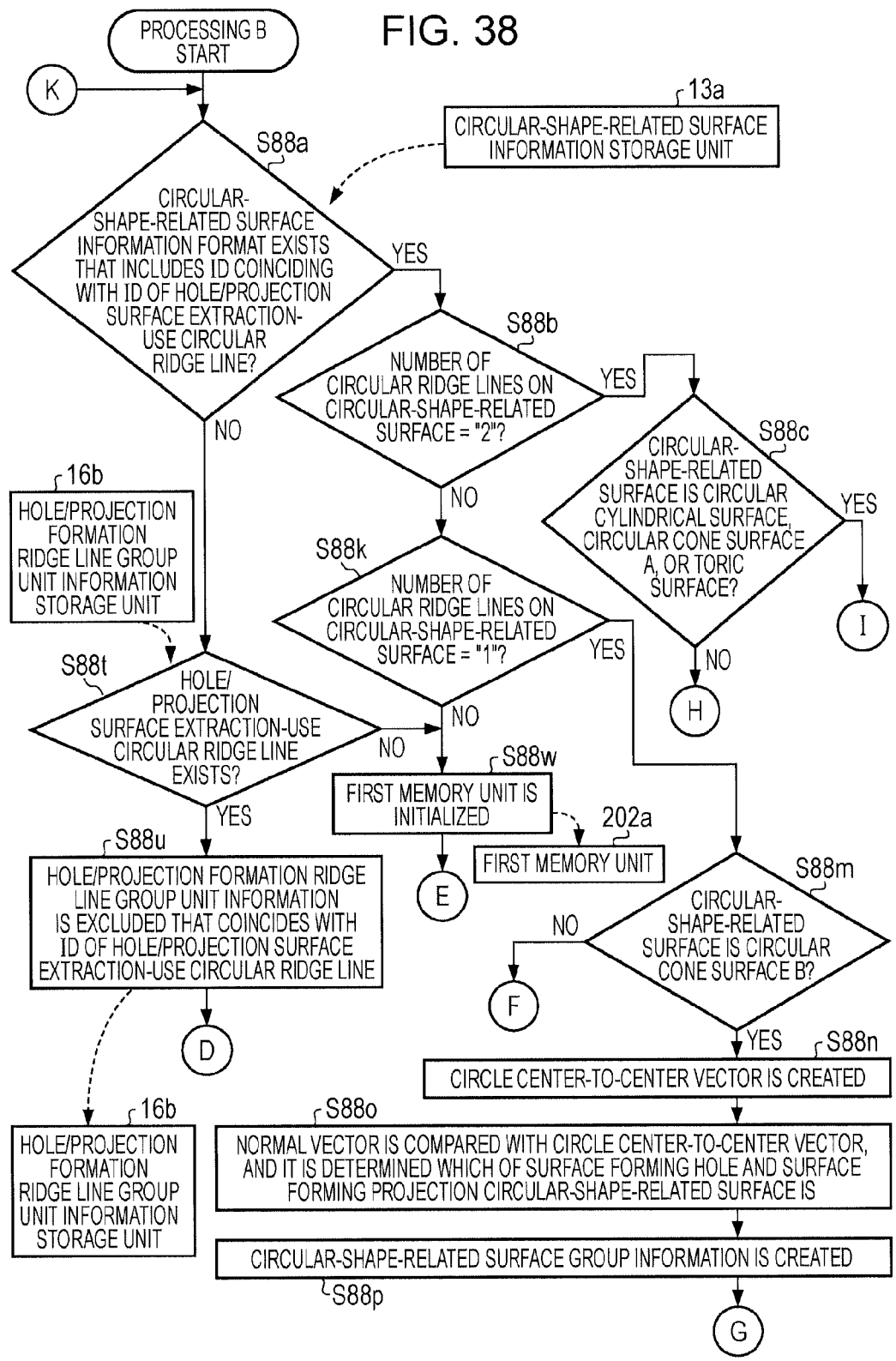
FIG. 38 is a flowchart illustrating processing.
Figure 39:
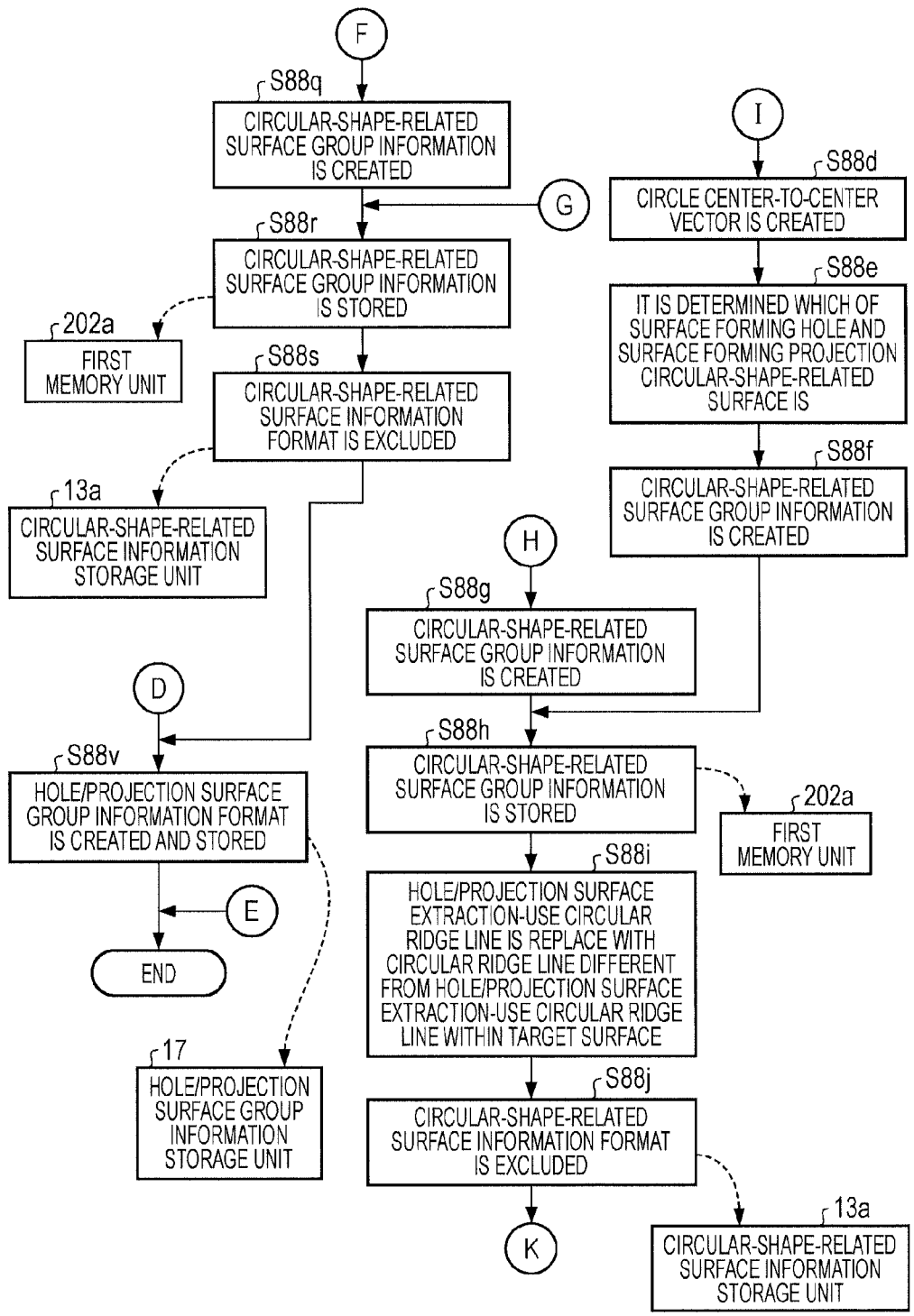
FIG. 39 is a flowchart illustrating the processing.

FIG. 38 and FIG. 39 are flowcharts illustrating the processing B.

[Step S88a] The hole/projection surface extraction unit 16d determines whether or not, within the circular-shape-related surface information storage unit 13a, a circular-shape-related surface information format exists that includes the ID of a ridge line coinciding with the ID of a hole/projection surface extraction-use circular ridge line. When the circular-shape-related surface information format exists that includes the ID of a ridge line coinciding with the ID of a hole/projection surface extraction-use circular ridge line (Step S88a: Yes), the processing makes a transition to Step S88b. When the circular-shape-related surface information format does not exist that includes the ID of a ridge line coinciding with the ID of a hole/projection surface extraction-use circular ridge line (Step S88a: No), the processing makes a transition to Step S88t.

[Step S88b] The hole/projection surface extraction unit 16d determines whether or not the number of circular ridge lines is "2", the circular ridge lines being included in the circular-shape-related surface information format that includes the ID of a ridge line coinciding with the ID of a hole/projection surface extraction-use circular ridge line. When the number of circular ridge lines included in the circular-shape-related surface information format is "2" (Step S88b: Yes), the processing makes a transition to Step S88c. When the number of circular ridge lines included in the circular-shape-related surface information format is not "2" (Step S88b: No), the processing makes a transition to Step S88k.

[Step S88c] The hole/projection surface extraction unit 16d determines whether or not a circular-shape-related surface is a circular cylindrical surface, a circular cone surface A, or a toric surface, the circular-shape-related surface configuring the circular-shape-related surface information format that includes the ID of a ridge line coinciding with the ID of a hole/projection surface extraction-use circular ridge line. When the circular-shape-related surface is any one of the circular cylindrical surface, the circular cone surface A, and the toric surface (Step S88c: Yes), the processing makes a transition to Step S88d. When the circular-shape-related surface corresponds to none of the circular cylindrical surface, the circular cone surface A, and the toric surface (Step S88c: No), the processing makes a transition to Step S88g.

[Step S88d] After having determined that the circular-shape-related surface corresponds to the format of one of the circular cylindrical surface, the circular cone surface A, and the toric surface, the hole/projection surface extraction unit 16d creates a circle center-to-center vector so that the circle center-to-center vector is headed from the center of a hole/projection surface extraction-use circular ridge line to the center of a ridge line other than the hole/projection surface extraction-use circular ridge line, from among two circular ridge lines included in the circular-shape-related surface information format. After that, the processing makes a transition to Step S88e.

[Step S88e] The hole/projection surface extraction unit 16d compares the normal vector of a hole/projection surface extraction-use reference plane surface with the circle center-to-center vector, and determines which of a surface forming a hole and a surface forming a projection the circular-shape-related surface determined in Step S88c is. After that, the processing makes a transition to Step S88f.

[Step S88f] The hole/projection surface extraction unit 16d creates the circular-shape-related surface group information of the circular cylindrical surface, the circular cone surface A, or the toric surface, which includes information determined in Step S88e. After that, the processing makes a transition to Step S88h.

[Step S88g] The hole/projection surface extraction unit 16d creates the circular-shape-related surface group information of a doughnut-shaped plane surface. After that, the processing makes a transition to Step S88h.

[Step S88h] The hole/projection surface extraction unit 16d stores the circular-shape-related surface group information created in Step S88f or Step S88g, in the first memory unit 202a prepared in Step S81. After that, the processing makes a transition to Step S88i.

[Step S88i] The hole/projection surface extraction unit 16d replaces the hole/projection surface extraction-use circular ridge line with a circular ridge line different from the hole/projection surface extraction-use circular ridge line within a target surface. After that, the processing makes a transition to Step S88j.

[Step S88j] The hole/projection surface extraction unit 16d excludes, from the circular-shape-related surface information storage unit 13a, the circular-shape-related surface information format including the ID of a ridge line coinciding with the ID of the (old) hole/projection surface extraction-use circular ridge line replaced in Step S88i. After that, the processing makes a transition to Step S88a.

[Step S88k] The hole/projection surface extraction unit 16d determines whether or not the number of circular ridge lines is "1", the circular ridge lines being included in the circular-shape-related surface information format including the ID of a ridge line coinciding with the ID of the hole/projection surface extraction-use circular ridge line. When the number of circular ridge lines included in the circular-shape-related surface information format is "1" (Step S88k: Yes), the processing makes a transition to Step S88m. When the number of circular ridge lines included in the circular-shape-related surface information format is not "1" (Step S88k: No), the processing makes a transition to Step S88w.

[Step S88m] The hole/projection surface extraction unit 16d determines whether or not a circular-shape-related surface is a circular cone surface B, the circular-shape-related surface configuring the circular-shape-related surface information format that includes the ID of a ridge line coinciding with the ID of a hole/projection surface extraction-use circular ridge line. When the circular-shape-related surface is the circular cone surface B (Step S88m: Yes), the processing makes a transition to Step S88n. When the circular-shape-related surface is not the circular cone surface B (Step S88m: No), the processing makes a transition to Step S88q.

[Step S88n] After having determined that the circular-shape-related surface corresponds to the format of the circular cone surface B, the hole/projection surface extraction unit 16d creates a circle center-to-center vector so that the circle center-to-center vector is headed from the center of the circular ridge line of the circular cone surface B included in the circular-shape-related surface information format to the apex of the circular cone surface B. After that, the processing makes a transition to Step S88o.

[Step S88o] The hole/projection surface extraction unit 16d compares a normal vector with the circle center-to-center vector, and determines which of a surface forming a hole and a surface forming a projection the circular-shape-related surface determined in Step S88c is. After that, the processing makes a transition to Step S88p.

[Step S88p] The hole/projection surface extraction unit 16d creates the circular-shape-related surface group information of the circular cone surface B. After that, the processing makes a transition to Step S88r.

[Step S88q] The hole/projection surface extraction unit 16d creates the circular-shape-related surface group information of the circular plane surface. After that, the processing makes a transition to Step S88r.

[Step S88r] The hole/projection surface extraction unit 16d stores the circular-shape-related surface group information created in Step S88p or Step S88q, in the first memory unit 202a. After that, the processing makes a transition to Step S88s.

[Step S88s] The hole/projection surface extraction unit 16d excludes, from the circular-shape-related surface information storage unit 13a, the circular-shape-related surface information format including the ID of a ridge line coinciding with the ID of the hole/projection surface extraction-use circular ridge line. After that, the processing makes a transition to Step S88v.

[Step S88t] The hole/projection surface extraction unit 16d determines whether or not a hole/projection surface extraction-use circular ridge line exists within the hole/projection formation ridge line group unit information stored in the hole/projection formation ridge line group unit information storage unit 16b. When the hole/projection surface extraction-use circular ridge line exists within the hole/projection formation ridge line group unit information (Step S88t: Yes), the processing makes a transition to Step S88u. When the hole/projection surface extraction-use circular ridge line does not exist within the hole/projection formation ridge line group unit information (Step S88t: No), the processing makes a transition to Step S88w.

[Step S88u] The hole/projection surface extraction unit 16d excludes, from the hole/projection formation ridge line group unit information storage unit 16b, the hole/projection formation ridge line group unit information including an ID coinciding with the ID of the hole/projection surface extraction-use circular ridge line. After that, the processing makes a transition to Step S88v.

[Step S88v] The hole/projection surface extraction unit 16d creates the hole/projection surface group information format 17a using the circular-shape-related surface group information stored in the first memory unit 202a. In addition, the hole/projection surface extraction unit 16d stores the created hole/projection surface group information format 17a in the hole/projection surface group information storage unit 17. After that, the processing illustrated in FIG. 38 and FIG. 39 is terminated.

[Step S88w] The hole/projection surface extraction unit 16d initializes the first memory unit 202a. After that, the processing illustrated in FIG. 38 and FIG. 39 is terminated.

This is the end of the description of the processing illustrated in FIG. 38 and FIG. 39. Next, the processing C in Step S91 will be described.

Figure 40:
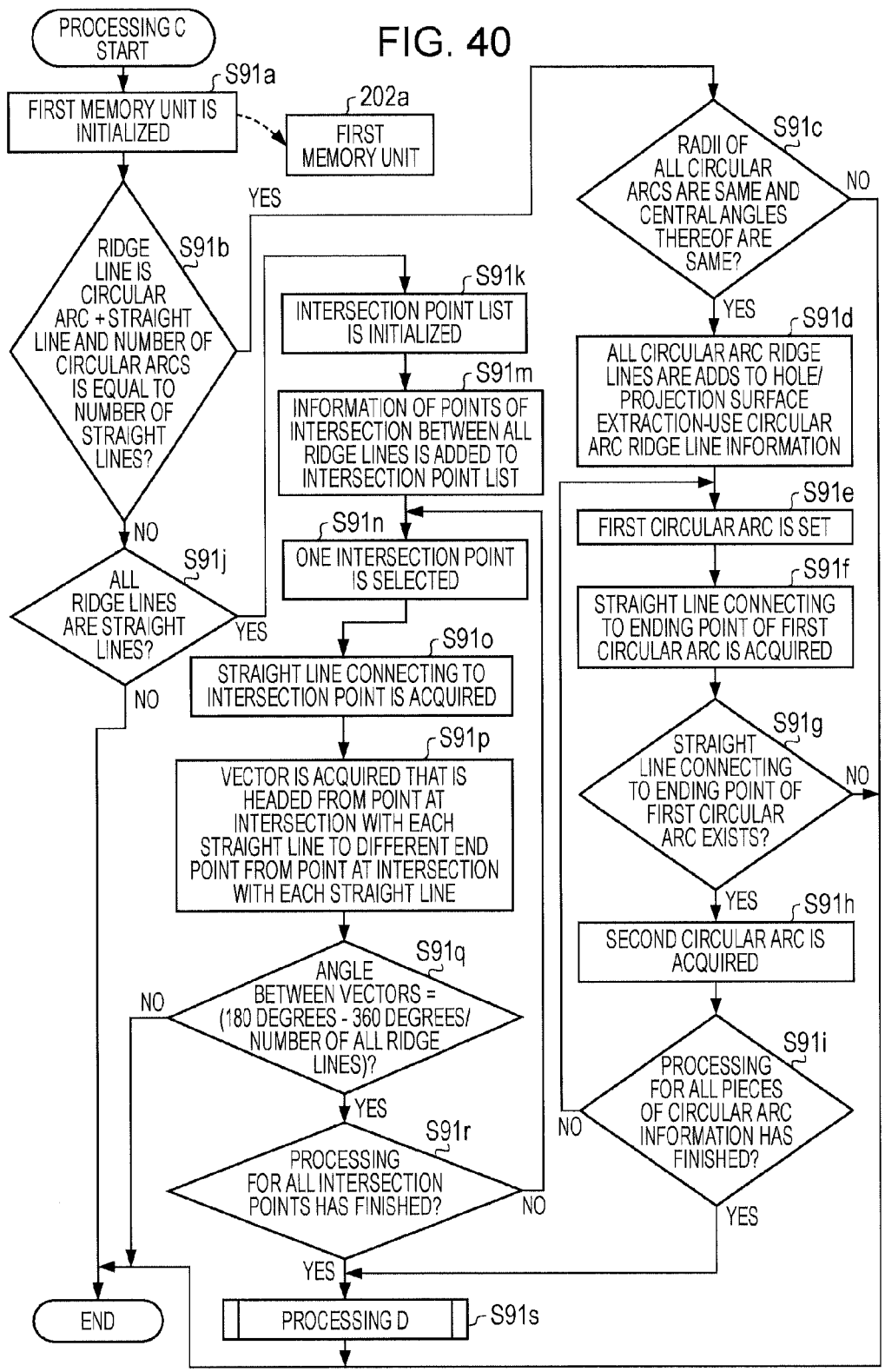
FIG. 40 is a flowchart illustrating processing.

FIG. 40 is a flowchart illustrating the processing C.

[Step S91a] The hole/projection surface extraction unit 16d initializes the first memory unit 202a temporarily storing hole/projection formation surface group information, hole/projection detailed information, and hole/projection plane surface information. After that, the processing makes a transition to Step S91b.

[Step S91b] The hole/projection surface extraction unit 16d determines whether or not a ridge line is the combination of a circular arc and a straight line and the number of circular arcs is equal to the number of straight lines, the ridge line being identified by the ID list of a ridge line included in the hole/projection formation ridge line group unit information selected in Step S82. When the ridge line is the combination of a circular arc and a straight line and the number of circular arcs is equal to the number of straight lines (Step S91b: Yes), the processing makes a transition to Step S91c. When the ridge line is not the combination of a circular arc and a straight line or the number of circular arcs is not equal to the number of straight lines (Step S91b: No), the processing makes a transition to Step S91j.

[Step S91c] The hole/projection surface extraction unit 16d determines whether or not the radii of all circular arcs of a ridge line are the same and the central angles thereof are the same, the ridge line being identified by the ID list of a ridge line included in the hole/projection formation ridge line group unit information selected in Step S82. When the radii of all circular arcs of a ridge line are the same and the central angles thereof are the same, the ridge line being identified by the ID list of a ridge line included in the hole/projection formation ridge line group unit information selected in Step S82 (Step S91c: Yes), the processing makes a transition to Step S91d. When the radii of all circular arcs of a ridge line are not the same or the central angles thereof are not the same, the ridge line being identified by the ID list of a ridge line included in the hole/projection formation ridge line group unit information selected in Step S82 (Step S91c: No), the processing illustrated in FIG. 40 is terminated.

[Step S91d] The hole/projection surface extraction unit 16d adds, to the hole/projection surface extraction-use circular arc ridge line information, all circular arc ridge lines identified by the ID list of a ridge line included in the hole/projection formation ridge line group unit information selected in Step S82. After that, the processing makes a transition to Step S91e.

[Step S91e] The hole/projection surface extraction unit 16d selects one circular arc within hole/projection surface extraction-use circular arc ridge line information. In addition, the hole/projection surface extraction unit 16d sets the selected circular arc as the first circular arc. After that, the processing makes a transition to Step S91f.

[Step S91f] The hole/projection surface extraction unit 16d acquires a straight line connecting to the ending point of the first circular arc. After that, the processing makes a transition to Step S91g.

[Step S91g] The hole/projection surface extraction unit 16d determines whether or not a straight line connecting to the ending point of the first circular arc exists. When the straight line connecting to the ending point of the first circular arc exists (Step S91g: Yes), the processing makes a transition to Step S91h. When the straight line connecting to the ending point of the first circular arc does not exist (Step S91g: No), the processing C is terminated.

[Step S91h] The hole/projection surface extraction unit 16d acquires the second circular arc whose starting point connects to the straight line connecting to the ending point of the first circular arc. After that, the processing makes a transition to Step S91i.

[Step S91i] The hole/projection surface extraction unit 16d determines whether or not the processing operations in Steps S91e to S91h have been performed with respect to all circular arc ridge lines identified by the ID list of a ridge line included in the hole/projection formation ridge line group unit information selected in Step S82. When the processing operations in Steps S91e to S91h have been performed with respect to all circular arc ridge lines identified by the ID list of a ridge line included in the hole/projection formation ridge line group unit information selected in Step S82 (Step S91i: Yes), the processing makes a transition to Step S91s. When the processing operations in Steps S91e to S91h have not been performed with respect to all circular arc ridge lines identified by the ID list of a ridge line included in the hole/projection formation ridge line group unit information selected in Step S82, a circular arc ridge line that has not been selected is selected, and the processing operations after Step S91f are subsequently performed.

[Step S91j] The hole/projection surface extraction unit 16d determines whether or not all ridge lines identified by the ID list of a ridge line included in the hole/projection formation ridge line group unit information selected in Step S82 are straight lines. When all ridge lines identified by the ID list of a ridge line included in the hole/projection formation ridge line group unit information selected in Step S82 are straight lines (Step S91j: Yes), the processing makes a transition to Step S91k. When all ridge lines identified by the ID list of a ridge line included in the hole/projection formation ridge line group unit information selected in Step S82 are not straight lines (Step S91j: No), the processing C is terminated.

[Step S91k] The hole/projection surface extraction unit 16d initializes an intersection point list to be used in processing operations performed in Steps S91m to S91r. After that, the processing makes a transition to Step S91m.

[Step S91m] The hole/projection surface extraction unit 16d adds, to the intersection point list, the information (hereinafter, referred to as intersection point information) of the points of intersection between all ridge lines identified by the ID list of a ridge line included in the hole/projection formation ridge line group unit information selected in Step S82. After that, the processing makes a transition to Step S91n.

[Step S91n] The hole/projection surface extraction unit 16d selects one piece of intersection point information added to the intersection point list. After that, the processing makes a transition to Step S91o.

[Step S91o] The hole/projection surface extraction unit 16d acquires a straight line connecting to an intersection point included in the intersection point information selected in Step S91n. After that, the processing makes a transition to Step S91p.

[Step S91p] The hole/projection surface extraction unit 16d acquires a vector headed from a point at an intersection with each straight line to a different end point from the point at the intersection with each straight line. After that, the processing makes a transition to Step S91q.

[Step S91q] The hole/projection surface extraction unit 16d determines whether or not an angle between vectors coincides with (180 degrees−360 degrees/the number of all ridge lines). When the angle between vectors coincides with (180 degrees−360 degrees/the number of all ridge lines) (Step S91q: Yes), the processing makes a transition to Step S91r. When the angle between vectors does not coincide with (180 degrees−360 degrees/the number of all ridge lines) (Step S91q: No), the processing C is terminated.

[Step S91r] The hole/projection surface extraction unit 16d determines whether or not all pieces of intersection point information added to the intersection point list have been selected. When all pieces of intersection point information added to the intersection point list have been selected (Step S91r: Yes), the processing makes a transition to Step S91s.

When all pieces of intersection point information added to the intersection point list have not been selected (Step S91r: No), the processing makes a transition to Step S91n, and a piece of intersection point information is selected that has not been selected. In addition, the processing operations after Step S91o are subsequently performed.

[Step S91s] The hole/projection surface extraction unit 16d performs processing D creating the hole/projection surface group information format 17b. When the processing D has finished, the processing C is terminated.

This is the end of the description of the processing illustrated in FIG. 40. Next, the processing D in Step S91s will be described.

Figure 41:
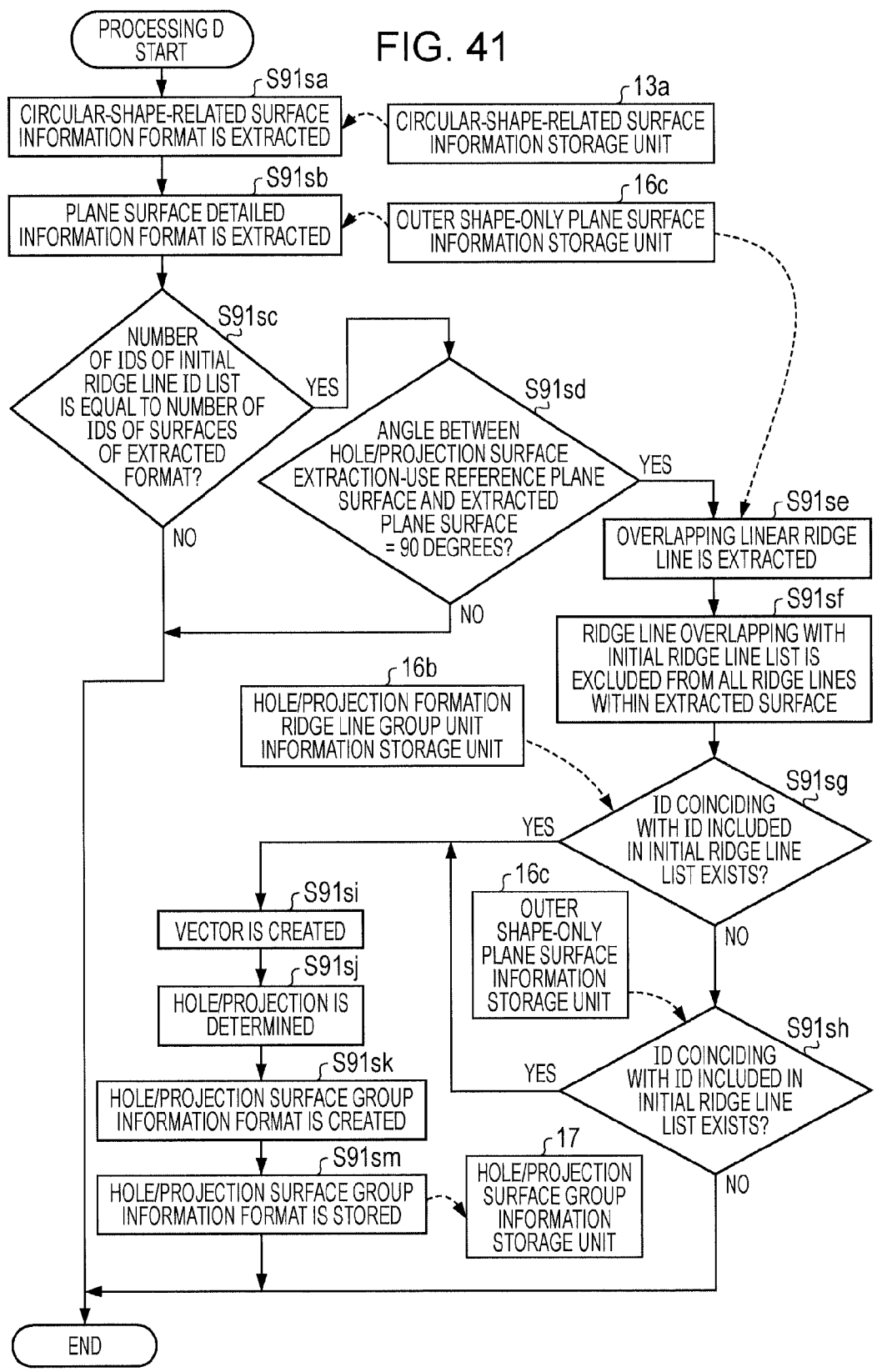
FIG. 41 is a flowchart illustrating processing.

FIG. 41 is a flowchart illustrating the processing D. In addition, the processing D is the processing described in FIG. 20A to FIG. 26.

[Step S91sa] The hole/projection surface extraction unit 16d extracts, from the circular-shape-related surface information storage unit 13a, a circular-shape-related surface information format having a ridge line identified by the ID list of a ridge line included in the hole/projection formation ridge line group unit information selected in Step S82. After that, the processing makes a transition to Step S91sb.

[Step S91sb] The hole/projection surface extraction unit 16d extracts, from the outer shape-only plane surface information storage unit 16c, a plane surface detailed information format having a ridge line identified by the ID list of a ridge line included in the hole/projection formation ridge line group unit information selected in Step S82. After that, the processing makes a transition to Step S91sc.

[Step S91sc] The hole/projection surface extraction unit 16d determines whether or not the number of IDs included in the initial ridge line ID list coincides with the number of the IDs of surfaces of each format extracted in Steps S91sa and S91sb. When the number of IDs included in the initial ridge line ID list coincides with the number of the IDs of surfaces of each format extracted in Steps S91sa and S91sb (Step S91sc: Yes), the processing makes a transition to Step S91sd. When the number of IDs included in the initial ridge line ID list does not coincide with the number of the IDs of extracted surfaces (Step S91sc: No), the processing D is terminated.

[Step S91sd] The hole/projection surface extraction unit 16d determines whether or not an angle between the hole/projection surface extraction-use reference plane surface and a plane surface identified by the plane surface detailed information format extracted in Step S91c is 90 degrees. When the angle between the hole/projection surface extraction-use reference plane surface and a plane surface identified by the extracted plane surface detailed information format is 90 degrees (Step S91sd: Yes), the processing makes a transition to Step S91se. When the angle between the hole/projection surface extraction-use reference plane surface and a plane surface identified by the extracted plane surface detailed information format is not 90 degrees (Step S91sd: No), the processing D is terminated.

[Step S91se] The hole/projection surface extraction unit 16d extracts one ID of a linear ridge line or a plurality of IDs of linear ridge lines, the linear ridge line or the linear ridge lines having an overlapping ID or overlapping IDs, from among all linear ridge lines in the ID list of ridge lines of each format extracted in Steps S91sa and Step S91sb. In addition, the length of the extracted linear ridge line is also extracted. After that, the processing makes a transition to Step S91sf.

[Step S91sf] The hole/projection surface extraction unit 16d excludes the ID of a linear ridge line overlapping with an ID included in the initial ridge line ID list, from the ID of the overlapping linear ridge line or the IDs of the overlapping linear ridge lines, extracted in Step S91*se*. After that, the processing makes a transition to Step S91*sg*.

[Step S91*sg*] The hole/projection surface extraction unit 16*d* determines whether or not, within the hole/projection formation ridge line group unit information stored in the hole/projection formation ridge line group unit information storage unit 16*b*, an ID exists that coincides with an ID included in the initial ridge line ID list from which the overlapping ridge line has been excluded in Step S91*sf*. When, within the hole/projection formation ridge line group unit information stored in the hole/projection formation ridge line group unit information storage unit 16*b*, the ID exists that coincides with an ID included in the initial ridge line ID list (Step S91*sg*: Yes), the processing makes a transition to Step S91*si*. When, within the hole/projection formation ridge line group unit information stored in the hole/projection formation ridge line group unit information storage unit 16*b*, the ID does not exist that coincides with an ID included in the initial ridge line ID list (Step S91*sg*: No), the processing makes a transition to Step S91*sh*.

[Step S91*sh*] The hole/projection surface extraction unit 16*d* determines whether or not, within the plane surface detailed information format stored in the outer shape-only plane surface information storage unit 16*c*, an ID exists that coincides with an ID included in the initial ridge line ID list from which the overlapping ridge line has been excluded in Step S91*sf*. When, within the plane surface detailed information format stored in the outer shape-only plane surface information storage unit 16*c*, the ID exists that coincides with an ID included in the initial ridge line ID list (Step S91*sh*: Yes), the processing makes a transition to Step S91*si*. When, within the plane surface detailed information format stored in the outer shape-only plane surface information storage unit 16*c*, the ID does not exist that coincides with an ID included in the initial ridge line ID list (Step S91*sh*: No), the processing D is terminated.

[Step S91*si*] The hole/projection surface extraction unit 16*d* creates a vector headed from an arbitrary end point within the initial ridge line ID list to an arbitrary end point within a hole/projection-use ridge line candidate on a surface located on a side opposite to the hole/projection surface extraction-use reference plane surface. After that, the processing makes a transition to Step S91*sj*.

[Step S91*sj*] By calculating an angle between the vector created in Step S91*si* and the normal vector of the hole/projection surface extraction-use reference plane surface, the hole/projection surface extraction unit 16*d* determines whether the circular-shape-related surface or plane surface of the format extracted in Step S91*sa* or Step S91*sb* is a surface forming a hole or a surface forming a projection. After that, the processing makes a transition to Step S91*sk*.

[Step S91*sk*] When, within the hole/projection formation ridge line group unit information, the ID exists that has coincided in Step S91*sg*, the hole/projection surface extraction unit 16*d* creates hole/projection plane surface information including the coincident ID. In addition, when, within the plane surface detailed information format, the ID exists that has coincided in Step S91*sg*, hole/projection plane surface information including the coincident ID is created. In addition, on the basis of the ID of the linear ridge line extracted in Step S91*se*, hole/projection formation surface group information is created. Furthermore, on the basis of the length of the linear ridge line extracted in Step S91*se*, hole/projection detailed information is created. In addition, the hole/projection surface extraction unit 16*d* creates the hole/projection surface group information format 17*b*. After that, the processing makes a transition to Step S91*sm*.

[Step S91*sm*] The hole/projection surface extraction unit 16*d* stores the hole/projection surface group information format 17*b* created in Step S91*sk*, in the hole/projection surface group information storage unit 17. After that, the processing D is terminated.

This is the end of the description of the processing illustrated in FIG. 41.

As described above, according to the design support device 10, the hole/projection information creation unit 16 creates the hole/projection surface group information format on the basis of the plane surface detailed information format. In addition, the hole/projection name identification unit 18*b* creates the number-of-holes information. Owing to the processing of the hole/projection information creation unit 16 and the processing of the hole/projection name identification unit 18*b*, it may be possible for the design support device 10 to automatically identify the kinds of holes/projections and the number of holes/projections with precision. Accordingly, it may be possible for the designer to save the effort of counting the kinds of holes/projections and the number of holes/projections by himself. In addition, it may be possible to suppress miscount owing to the designer's counting the kinds of holes/projections and the number of holes/projections by himself. In addition, in a case in which the data of a three-dimensional model, created by a CAD application, is converted when being used by another CAD application, the number-of-holes information of a hole/projection surface added to the three-dimensional model may disappear in some cases. In this case, since the design support device 10 also creates the number-of-holes information, it may be possible for the designer to save the effort of counting the kinds of holes/projections and the number of holes/projections.

In addition, the processing performed by the design support device 10 may also be subjected to distributed processing performed by a plurality of devices. For example, one device may create a plane surface detailed information format, and another device may create a hole/projection surface group information format using the plane surface detailed information format, thereby outputting the number-of-holes information to the monitor 204*a*.

While, as described above, the design support device, the design support method, and the design support program of the present technology have been described on the basis of the illustrated embodiments, the present technology is not limited to these embodiments, and the configuration of each unit may be replaced with an arbitrary configuration having the same function. In addition, another arbitrary component or another arbitrary process may also be added to the present technology.

In addition, the present technology may also be the combination of more than one arbitrary configuration (feature) from among the individual embodiments described above.

In addition, it may be possible to realize the above-mentioned processing function using a computer. In that case, a program is provided in which the content of processing of a function included in the design support device 1, 10 is described. By executing the program on the computer, it may be possible to realize the above-mentioned processing function on the computer. The program in which the content of processing is described may be recorded in a computer-readable recording medium. As the computer-readable recording medium, a magnetic storage device, an optical disk, a magnetooptical recording medium, a semiconductor memory, or the like may be cited. As the magnetic storage device, a hard disk drive, a flexible disk (FD), a magnetic tape, or the like may be cited. As the optical disk, a DVD, a DVD-RAM, a CD-ROM/RW, or the like may be cited. As the magnetooptical recording medium, a Magneto-Optical disk (MO) or the like may be cited.

When the program is distributed, portable recording media in which the program is recorded, such as DVDs, CD-ROMs, and the like, are marketed, for example. In addition, the program may also be stored in the storage device of a server computer, and the program may also be transferred from the server computer to other computers through a network.

For example, the computer executing the program stores the program recorded in a portable recording medium or the program transferred from the server computer, in the self-storage device. In addition, the computer reads out the program from the self-storage device, and executes processing according to the program. In addition, the computer may also directly read out the program from the portable recording medium and execute processing according to the program. In addition, every time the program is transferred from the server computer connected through the network, the computer may also sequentially execute processing according to the received program.

In addition, at least a portion of the above-mentioned processing function may also be realized using an electronic circuit such as a digital signal processor (DSP), an application specific integrated circuit (ASIC), a programmable logic device (PLD), or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A design support apparatus comprising:
   a processor; and
   a memory that stores a plurality of instructions, which when executed by the processor, cause the processor to execute:
   determining a shape of a first ridge line that is provided in a first plane surface included in a three-dimensional model of a verification target and forms an entrance of a hole or a base of a projection in the first plane surface;
   extracting, from within the three-dimensional model, a first extracted graphic that includes a second ridge line coinciding with at least a portion of the shape of the first ridge line;
   creating a comparison-use vector to be compared with the direction of a normal vector of the first plane surface, in response to a type of the first extracted graphic;
   determining whether the first extracted graphic is a graphic forming a hole or a graphic forming a projection, in response to an angle between the normal vector and the comparison-use vector;
   determining whether the first extracted graphic is a hollow cylinder or a circular cone when a graphic formed by the first ridge line is determined to be a circle;
   creating the comparison-use vector headed from the center of the circle to the center of a circle formed by a facing ridge line facing the ridge line provided in the first plane surface when the first extracted graphic is a hollow cylinder;
   determining that the first extracted graphic is a graphic including a surface forming a projection when an angle between the normal vector and the comparison-use vector is 0 degrees; and
   determining that the first extracted graphic is a graphic including a surface forming a hole when the angle between the normal vector and the comparison-use vector is 180 degrees.

2. The design support apparatus according to claim 1, further comprising
   extracting, from within the three-dimensional model, a second extracted graphic or second plane surface including a third ridge line that coincides with a shape of the facing ridge line and is other than the first ridge line provided in the first plane surface.

3. The design support apparatus according to claim 2, further comprising
   determining whether the second extracted graphic is a graphic forming a hole or a graphic forming a projection when a graphic including a ridge line other than the third ridge line provided in the second plane surface is extracted.

4. The design support apparatus according to claim 2, further comprising
   creating information in which the first and second extracted graphics are grouped when determining that one of the first and second extracted graphics is a circular cone.

5. The design support apparatus according to claim 2, further comprising
   creating information in which the first and second extracted graphics are grouped when a second plane surface is extracted.

6. The design support apparatus according to claim 1, further comprising
   creating the comparison-use vector headed from the center of the circle to the apex of the circular cone when the first extracted graphic is a circular cone.

7. The design support apparatus according to claim 1, further comprising
   extracting a third graphic including a ridge line coinciding with each of a circular arc and a straight line when a graphic formed by the first ridge line provided in the first plane surface includes the circular arc and the straight line.

8. The design support apparatus according to claim 7, further comprising
   extracting a ridge line common in the third extracted graphic, and identifying the extracted ridge line as a ridge line in a depth direction of a hole or projection formed by the third extracted graphic.

9. The design support apparatus according to claim 7, further comprising
   extracting a facing plane surface of the third extracted graphic, the facing plane surface coinciding with a shape of a ridge line facing the first plane surface, and
   creating the comparison-use vector headed from an arbitrary point of the first ridge line provided in the first plane surface to an arbitrary point of a ridge line provided in the facing plane surface.

10. The design support apparatus according to claim 9, further comprising
    determining that the third extracted graphic is a graphic including a surface forming a projection when an absolute value of an angle between the normal vector and the comparison-use vector is less than 90 degrees.

11. The design support apparatus according to claim 9, further comprising
   determining that the third extracted graphic is a graphic including a surface forming a hole when an absolute value of an angle between the normal vector and the comparison-use vector is greater than or equal to 90 degrees.

12. The design support apparatus according to claim 1, further comprising:
   sorting a ridge line forming the first plane surface of the three-dimensional model into a plurality of groups in response to a shape of a graphic formed by the ridge line; and
   determining that a group other than the largest area of a graphic surrounded by the ridge line, from among the plural groups, is a group of a ridge line forming a hole or a projection in the first plane surface.

13. The design support apparatus according to claim 1, further comprising:
   determining the shape of the first ridge line to be a circle.

14. A design support method performing processing using a computer, the design support method comprising:
   determining a shape of a first ridge line that is provided in a first plane surface included in a three-dimensional model of a verification target and forms an entrance of a hole or a base of a projection in the first plane surface;
   extracting, from within the three-dimensional model, a graphic that includes a second ridge line coinciding with at least a portion of the determined shape of the first ridge line;
   creating a comparison-use vector to be compared with the direction of a normal vector of the first plane surface, in response to the type of the extracted graphic;
   determining, by the computer, whether the extracted graphic is a graphic forming a hole or a graphic forming a projection, in response to an angle between the normal vector and the comparison-use vector;
   determining whether the extracted graphic is a hollow cylinder or a circular cone when a graphic formed by the first ridge line is determined to be a circle;
   creating the comparison-use vector headed from the center of the circle to the center of a circle formed by a facing ridge line facing the first ridge line provided in the first plane surface when the extracted graphic is a hollow cylinder;
   determining that the extracted graphic is a graphic including a surface forming a projection when an angle between the normal vector and the comparison-use vector is 0 degrees; and
   determining that the extracted graphic is a graphic including a surface forming a hole when the angle between the normal vector and the comparison-use vector is 180 degrees.

15. A non-transitory recording medium recording therein a program causing a computer to execute processing, the program causing the computer to execute processing comprising:
   determining a shape of a first ridge line that is provided in a first plane surface included in a three-dimensional model of a verification target and forms an entrance of a hole or a base of a projection in the first plane surface;
   extracting, from within the three-dimensional model, a graphic that includes a second ridge line coinciding with at least a portion of the determined shape of the first ridge line;
   creating a comparison-use vector to be compared with the direction of a normal vector of the first plane surface, in response to the type of the extracted graphic;
   determining whether the extracted graphic is a graphic forming a hole or a graphic forming a projection, in response to an angle between the normal vector and the comparison-use vector;
   determining whether the extracted graphic is a hollow cylinder or a circular cone when a graphic formed by the first ridge line is determined to be a circle;
   creating the comparison-use vector headed from the center of the circle to the center of a circle formed by a facing ridge line facing the first ridge line provided in the first plane surface when the extracted graphic is a hollow cylinder;
   determining that the extracted graphic is a graphic including a surface forming a projection when an angle between the normal vector and the comparison-use vector is 0 degrees; and
   determining that the extracted graphic is a graphic including a surface forming a hole when the angle between the normal vector and the comparison-use vector is 180 degrees.

16. A design support apparatus comprising:
   a memory that stores a three-dimensional model; and
   a processor configured
   to determine a shape of a first ridge line that is provided in a first plane surface included in the three-dimensional model of a verification target and forms an entrance of a hole or a base of a projection in the first plane surface;
   to extract, from within the three-dimensional model, a graphic that includes a second ridge line coinciding with at least a portion of the determined shape of the first ridge line;
   to create a comparison-use vector to be compared with the direction of a normal vector of the first plane surface, in response to the type of the extracted graphic;
   to determine, by the computer, whether the extracted graphic is a graphic forming a hole or a graphic forming a projection, in response to an angle between the normal vector and the comparison-use vector;
   to determine whether the extracted graphic is a hollow cylinder or a circular cone when a graphic formed by the first ridge line is determined to be a circle;
   to create the comparison-use vector headed from the center of the circle to the center of a circle formed by a facing ridge line facing the first ridge line provided in the first plane surface when the extracted graphic is a hollow cylinder;
   to determine that the extracted graphic is a graphic including a surface forming a projection when an angle between the normal vector and the comparison-use vector is 0 degrees; and
   to determine that the extracted graphic is a graphic including a surface forming a hole when the angle between the normal vector and the comparison-use vector is 180 degrees.

* * * * *

UNITED STATES PATENT AND TRADEMARK OFFICE
CERTIFICATE OF CORRECTION

| | | |
|---|---|---|
| PATENT NO. | : 9,041,710 B2 | Page 1 of 1 |
| APPLICATION NO. | : 13/418765 | |
| DATED | : May 26, 2015 | |
| INVENTOR(S) | : Yoshihito Okuwaki | |

It is certified that error appears in the above-identified patent and that said Letters Patent is hereby corrected as shown below:

Title Page, Column 1, Line 1:

In the Title before "SUPPORT" insert --DESIGN--.

Title Page, Column 1, Line 3:

In the Title delete "HOLES" and insert --HOLE--, therefor.

Title Page of Specification, Column 1, Line 1:

In the Title before "SUPPORT" insert --DESIGN--.

Title Page of Specification, Column 1, Line 1:

In the Title delete "HOLES" and insert --HOLE--, therefor.

Signed and Sealed this
Thirteenth Day of October, 2015

Michelle K. Lee
*Director of the United States Patent and Trademark Office*